United States Patent
Shinbashi et al.

(10) Patent No.: US 10,545,804 B2
(45) Date of Patent: Jan. 28, 2020

(54) MEMORY CONTROLLER, MEMORY SYSTEM, AND MEMORY CONTROLLER CONTROL METHOD

(71) Applicant: Sony Corporation, Tokyo (JP)

(72) Inventors: Tatsuo Shinbashi, Tokyo (JP); Keiichi Tsutsui, Kanagawa (JP); Hideaki Okubo, Saitama (JP); Lui Sakai, Kanagawa (JP); Kenichi Nakanishi, Tokyo (JP); Yasushi Fujinami, Tokyo (JP)

(73) Assignee: Sony Corporation, Tokyo (JP)

( * ) Notice: Subject to any disclaimer, the term of this patent is extended or adjusted under 35 U.S.C. 154(b) by 257 days.

(21) Appl. No.: 15/507,413

(22) PCT Filed: Jul. 22, 2015

(86) PCT No.: PCT/JP2015/070829
§ 371 (c)(1),
(2) Date: Feb. 28, 2017

(87) PCT Pub. No.: WO2016/063592
PCT Pub. Date: Apr. 28, 2016

(65) Prior Publication Data
US 2017/0293513 A1    Oct. 12, 2017

(30) Foreign Application Priority Data
Oct. 24, 2014   (JP) ................................. 2014-217131

(51) Int. Cl.
*G06F 11/00*   (2006.01)
*G06F 3/06*    (2006.01)
*G11C 29/52*   (2006.01)

(52) U.S. Cl.
CPC .......... *G06F 11/004* (2013.01); *G06F 3/0619* (2013.01); *G11C 29/52* (2013.01)

(58) Field of Classification Search
CPC .... G06F 11/004; G06F 11/08; G06F 11/1004; G06F 11/1008; G06F 11/1012;
(Continued)

(56) References Cited

U.S. PATENT DOCUMENTS

2005/0204264 A1*   9/2005   Yusa ................... G06F 11/1048
                                                                714/758
2009/0172496 A1*   7/2009   Roine ................. G06F 11/1008
                                                                714/758

(Continued)

FOREIGN PATENT DOCUMENTS

GB    2 158 622 A    11/1985
JP    06-110793 A    4/1994
(Continued)

*Primary Examiner* — Kyle Vallecillo
(74) *Attorney, Agent, or Firm* — Michael Best & Friedrich LLP

(57) ABSTRACT

[Object] To sufficiently reduce frequency of error occurrence in memory cells.
[Solution] A reading unit reads read data from a memory cell, the read data including an information bit and reversal information for determining whether or not the information bit has been reversed. In addition, an error detection/correction unit detects the presence or absence of an error in the information bit and corrects the error. A data reversing unit reverses the information bit that has the error corrected and the reversal information. Furthermore, a writing unit writes the reversed information bit and the reversed reversal information in the memory cell.

20 Claims, 44 Drawing Sheets

(58) Field of Classification Search
CPC .... G06F 11/1048; G06F 3/0619; G06F 12/16; G11C 7/1006; G11C 13/00; G11C 16/3418; G11C 16/3427; G11C 16/3431; G11C 29/52; G11C 11/401; G11C 11/402; G11C 11/406; G11C 11/40615
See application file for complete search history.

(56) References Cited

U.S. PATENT DOCUMENTS

| | | | | |
|---|---|---|---|---|
| 2012/0131418 A1* | 5/2012 | Tarui | ................... | G06F 11/1048 714/763 |
| 2014/0204663 A1 | 7/2014 | Faber | | |
| 2015/0254136 A1* | 9/2015 | Hoya | ................... | G06F 11/1012 714/764 |
| 2015/0331741 A1* | 11/2015 | Park | ................... | G06F 11/1004 714/768 |

FOREIGN PATENT DOCUMENTS

| | | |
|---|---|---|
| JP | 04-255032 A | 9/1999 |
| JP | 2000-235524 A | 8/2000 |
| WO | 2011/030410 A1 | 3/2011 |

\* cited by examiner

FIG. 10
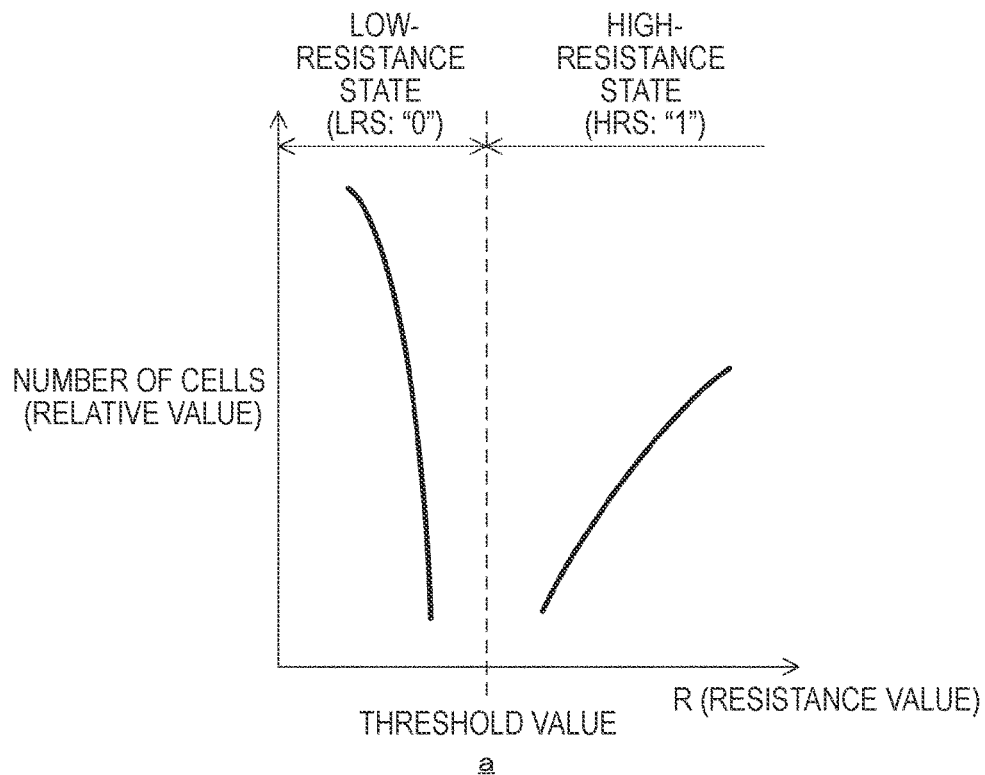
a
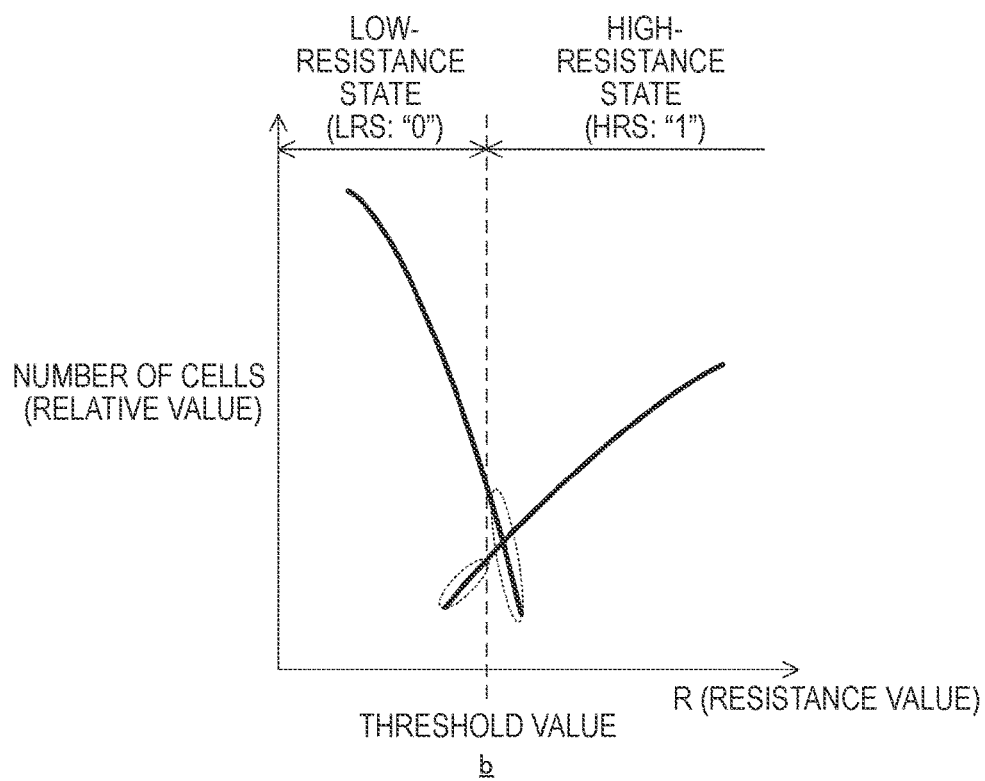
b

FIG. 11
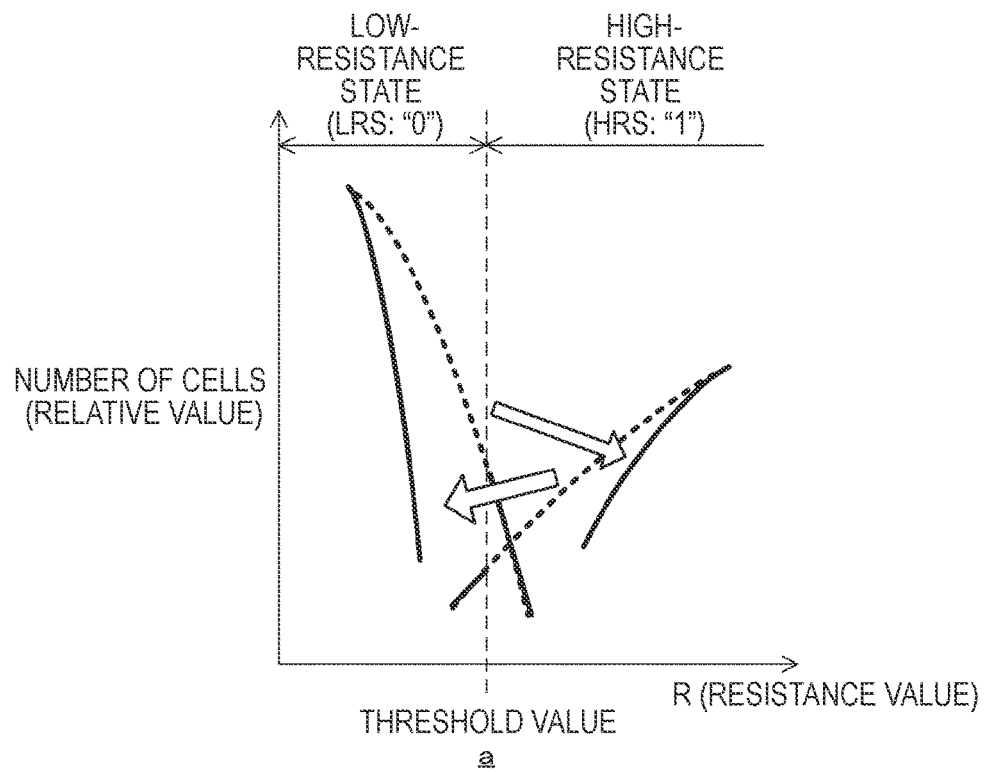
a
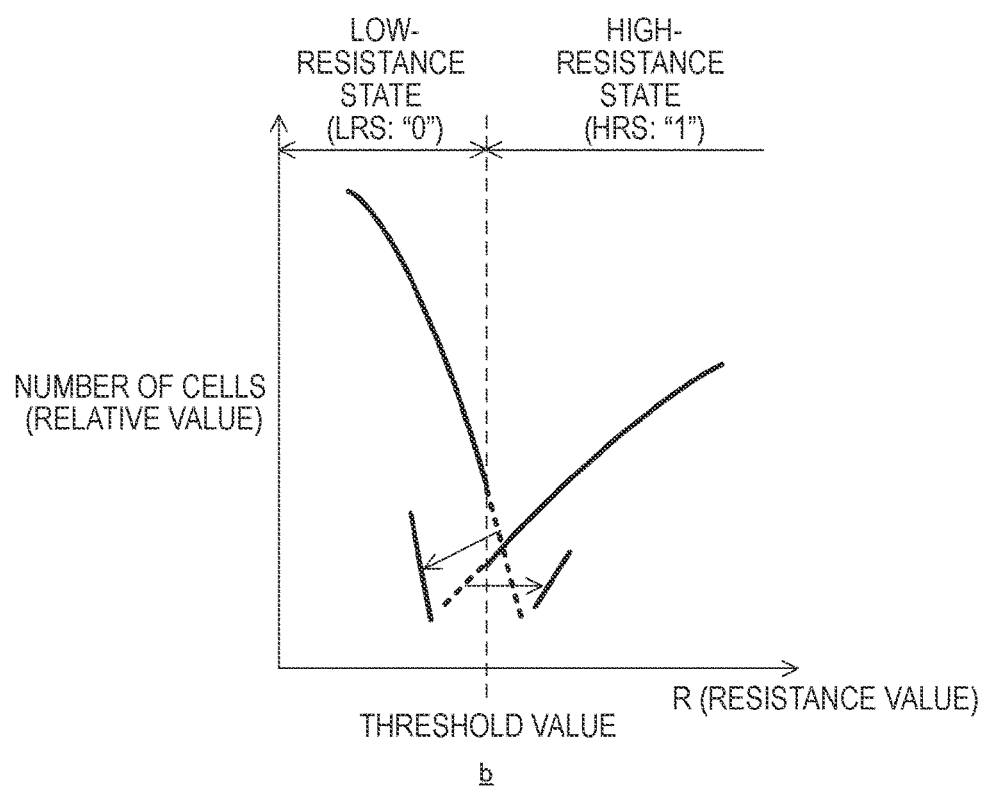
b

FIG. 30

ENCODING TARGET DATA (24 bits): 111111111111111111111110 a

WRITE DATA (41 bits): 111111111111111111111110 | 0001010000011100 | 0 b

BIT TO BE SET (0→1): ********************* | ----*-------***--- | -- c

BIT TO BE RESET (1→0): ---------------------- | -**-*-------** | * d

BIT TO BE REFRESHED: ******************* | ---******* | * e

NUMBER OF TIMES EACH BIT IS RE-WRITTEN: 111211111111111111111111 | 0111101101111121 | 1 f

FIG. 33

| CORRECTION SUCCESS/ FAILURE BIT Br | CORRECTION SUCCESS/ FAILURE BIT Br' | SELECTION BIT | ERROR FLAG |
|---|---|---|---|
| 0 (CORRECTION OF READ DATA FAILS) | 0 (CORRECTION OF REVERSED READ DATA FAILS) | 0/1 | 1 (READ ERROR) |
| 0 (CORRECTION OF READ DATA FAILS) | 1 (CORRECTION OF REVERSED READ DATA SUCCEEDS) | 1 (OUTPUT OF CORRECTED REVERSED DATA) | 0 |
| 1 (CORRECTION OF READ DATA SUCCEEDS) | 0 (CORRECTION OF REVERSED READ DATA FAILS) | 0 (OUTPUT OF CORRECTED DATA) | 0 |
| 1 (CORRECTION OF READ DATA SUCCEEDS) | 1 (CORRECTION OF REVERSED READ DATA SUCCEEDS) | 0/1 | 1 (READ ERROR) |

FIG. 43

WRITE DATA (40 bits) | 1111111111111111111110 | 1001000010011100 a

BIT TO BE SET (0→1) | *********************- | *--*------*--***--- b

BIT TO BE RESET (1→0) | ---------------------* | -------** c

BIT TO BE REFRESHED | ******************* | ************* d

NUMBER OF TIMES EACH BIT IS RE-WRITTEN | 1112111111111111111111 | 111111111111121 e

MEMORY CONTROLLER, MEMORY SYSTEM, AND MEMORY CONTROLLER CONTROL METHOD

TECHNICAL FIELD

The present technology relates to a memory controller, a memory system, and a memory controller control method. More specifically, the technology relates to a memory controller, a memory system, and a memory controller control method for error correction.

BACKGROUND ART

Non-volatile memories (NVMs) have been used as auxiliary storage devices or storages in recent information processing systems. Non-volatile memories are broadly divided into flash memories for data access in units of large data sizes and non-volatile random access memories (Non-volatile RAMs) to which high-speed random access is possible in units of smaller data sizes. Here, NAND flash memories are exemplified as a representative example of flash memories. On the other hand, resistance RAMs (Re-RAMs), phase-change RAMs (PCRAMs), magnetoresistive RAMs (MRAMs), and the like are exemplified as examples of non-volatile random access flash memories.

It is known that, in non-volatile memories, memory cells suffer deterioration according to progress of repetitive access and aging deterioration, which causes errors to occur in written data. Thus, a memory controller that performs a process of re-writing data in memory cells that have undergone deterioration as a refresh process has been proposed (for example, refer to Patent Literature 1). The memory controller reads data from memory cells, corrects an error in the data using an error detection and correction code (ECC), and writes the corrected data again in a refresh process. By performing re-writing on memory cells in which an error has occurred through such a refresh process, deterioration of the memory cells can be recovered to some extent.

CITATION LIST

Patent Literature

Patent Literature 1: JP H6-110793A

DISCLOSURE OF INVENTION

Technical Problem

In the above-described related art, since correct values have already been written in memory cells in which bits with no error occurred are written, re-writing is not performed. However, there is a possibility of deterioration also progressing in the memory cells with no error occurred, and there is a concern that a new error may occur due to repetitive access and aging deterioration. Since no re-writing is performed for memory cells in which occurrence of an error is a concern in the above-described device, there is a problem in that it is not possible to sufficiently reduce a frequency of error occurrence in memory cells.

The present technology has been created by taking the above circumstance into consideration, and aims to reduce a frequency of error derivation in memory cells.

Solution to Problem

The present technology has been devised to solve the above-described problem. A first aspect of the present technology is a memory controller and a control method thereof, the memory controller including: a reading unit configured to read read data from a memory cell, the read data including an information bit and reversal information for determining whether or not the information bit has been reversed; an error detection/correction unit configured to detect presence or absence of an error in the information bit and correct the error; a data reversing unit configured to reverse the information bit that has the error corrected and the reversal information; and a writing unit configured to write the reversed information bit and the reversed reversal information in the memory cell. Accordingly, the effect is exhibited that data obtained by reversing the information bit that has the errors corrected and the reversal information is written in the memory cell.

Further, in the first aspect, the memory controller may further include: a reversed read data error detection/correction unit configured to detect presence or absence of an error in reversed read data obtained by reversing the read data and correct the error. The reversal information may be a redundant bit for detecting the presence or absence of the error and correcting the error. When only correction of an error in the read data succeeds, the data reversing unit may reverse the read data that has the error corrected and supply the read data as write data, and when only correction of the error in the reversed read data succeeds, the data reversing unit may reverse the reversed read data that has the error corrected and supply the reversed read data as the write data. The writing unit may write the write data in the memory cell. Accordingly, the effect is exhibited that when only correction of the error in the read data succeeds, the read data that has the error corrected is reversed and written.

Further, in the first aspect, the writing unit may write, in the memory cell, the read data that has the error corrected before the write data is written when only the correction of the error in the read data succeeds, and additionally write the reversed read data that has the error corrected before the write data is written when only the correction of the error in the reversed read data succeeds. Accordingly, the effect is exhibited that when only correction of the error in the read data succeeds, the read data that has the error corrected before the write data is written is written.

Further, in the first aspect, the reversal information may be a reversal bit indicating whether or not the information bit has been reversed. The read data further may include a redundant bit for detecting and correcting the error. The error detection/correction unit may detect the presence or absence of the error and correct the error using the redundant bit. Accordingly, the effect is exhibited that the reversal bit is reversed and written in the memory cell.

Further, in the first aspect, the memory controller may further include: a re-encoding unit configured to generating a new redundant bit for detecting and correcting an error in the reversed information bit and the reversed reversal bit. The error detection/correction unit may detect presence or absence of an error in the information bit and the reversal information and correct the error. The information bit that has the error corrected and the reversal information that has the error corrected may be reversed. The writing unit may write a code word including the reversed information bit, the reversed reversal information, and the new redundant bit in the memory cell as write data. Accordingly, the effect is exhibited that the code word including the reversed information bit, the reversed reversal information, and the new redundant bit is written as read data.

Further, in the first aspect, the writing unit may write, in the memory cell, the read data that has the error corrected before the write data is written. Accordingly, the effect is exhibited that the read data that has the error corrected before the write data is written is written in the memory cell.

Further, in the first aspect, the memory controller may further include: a re-encoding unit configured to generate a new redundant bit for detecting and correcting an error in the reversed information bit. The writing unit may write data including a code word including the reversed information bit and the new redundant bit and the reversed reversal information in the memory cell as write data. Accordingly, the effect is exhibited that the write data including the code word and the reversed reversal information is written in the memory cell.

Further, in the first aspect, the writing unit may write, in the memory cell, the read data that has the error corrected before the write data is written. Accordingly, the effect is exhibited that the read data that has the error corrected before the write data is written is written in the memory cell.

Further, a second aspect of the present technology is a memory system including: a memory cell; a reading unit configured to read, from the memory cell, read data including an information bit and reversal information for determining whether or not the information bit has been reversed; an error detection/correction unit configured to detect presence or absence of an error in the information bit and correct the error; a data reversing unit configured to reverse the information bit that has the error corrected and the reversal information; and a writing unit configured to write the reversed information bit and the reversed reversal information in the memory cell. Accordingly, the effect is exhibited that the data obtained by reversing the information bit that has the error corrected and the reversal information is written in the memory cell.

Advantageous Effects of Invention

According to the present technology, an excellent effect can be exhibited that a frequency of error occurrence in memory cells are sufficiently reduced. Note that effects described herein are not necessarily limitative, and any effect described in the present disclosure may be admitted.

BRIEF DESCRIPTION OF DRAWINGS

FIG. 10 is a diagram illustrating examples of distributions of resistance of variable resistive elements before and after deterioration according to the first embodiment.

FIG. 11 is a diagram illustrating examples of the distributions of the resistance of the variable resistive elements after being refreshed according to the first embodiment.

FIG. 30 is a diagram illustrating an example of write data generated through the refresh process according to the fourth embodiment.

FIG. 33 is a table showing an example of an operation of a corrected data selection unit according to the fifth embodiment.

FIG. 43 is a diagram illustrating an example of write data generated through the refresh process according to the sixth embodiment.

MODE(S) FOR CARRYING OUT THE INVENTION

Hereinafter, exemplary embodiments for implementing the present technology (hereinafter referred to as embodiments) will be described. Description will be provided in the following order.
1. First embodiment (Example in which reversed information bits are re-encoded and re-written)
2. Second embodiment (Example in which reversed information bits are re-encoded and re-written after re-writing corrected data)
3. Third embodiment (Example in which reversed information bits and reversal bits are re-encoded and re-written)
4. Fourth embodiment (Example in which reversed information bits and reversal bits are re-encoded and re-written after re-writing corrected data)
5. Fifth embodiment (Example in which information bits and redundant bits are reversed and re-written)
6. Sixth embodiment (Example in which information bits and redundant bits are reversed and re-written after re-writing corrected data)

1. First Embodiment

[Example of Configuration of Memory System]

Figure 1:
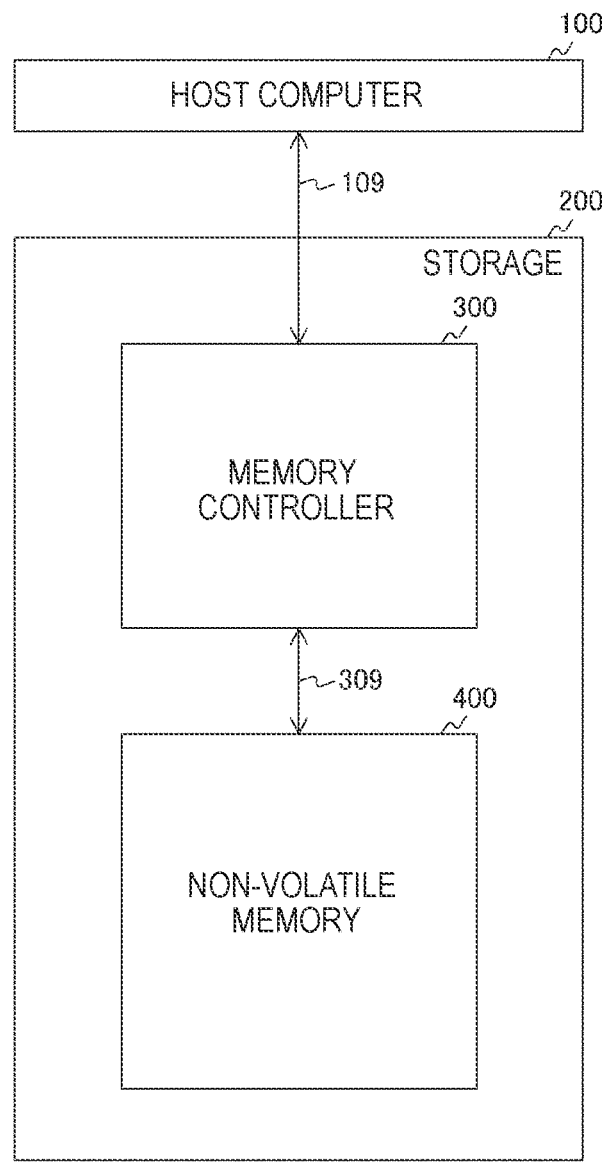
FIG. 1 is an overall diagram illustrating an example of a configuration of a memory system according to a first embodiment.

FIG. 1 is an overall diagram illustrating an example of a configuration of a memory system according to a first embodiment. The memory system includes a host computer 100 and a storage 200.

The host computer 100 controls an overall information processing system. The host computer 100 generates commands and data and supplies them to the storage 200 via a signal line 109. In addition, the host computer 100 receives read data from the storage 200. Here, the commands are for controlling the storage 200 and include, for example, a write command instructing writing of data and a read command instructing reading of data.

The storage 200 includes a memory controller 300 and a non-volatile memory 400. The memory controller 300 controls the non-volatile memory 400. When a write command and data are received from the host computer 100, the memory controller 300 generates an error detection and correction code (ECC) from the data. Specifically, the memory controller 300 converts (i.e., encodes) data to be encoded into code words including the data and a predetermined number of redundant bits. The memory controller 300 accesses the non-volatile memory 400 via a signal line 309 and writes the encoded data as write data.

Further, when a read command is received from the host computer 100, the memory controller 300 accesses the non-volatile memory 400 via the signal line 309 and reads encoded read data. Then, the memory controller 300 converts (i.e., decodes) the read data into original data before the encoding thereof. In addition, the memory controller 300 performs detection and correction of an error on the read data on the basis of an ECC. The memory controller 300 supplies information bits included in the corrected read data to the host computer 100.

Further, when a degree of deterioration of memory cells in the non-volatile memory 400 is higher than a given degree, the memory controller 300 performs re-writing of data into the memory cells as a refresh process. For example, when a frequency of access or a frequency of error occurrence exceeds a predetermined value, the refresh process is performed.

The non-volatile memory 400 stores data according to control of the memory controller 300. For example, a ReRAM is used as the non-volatile memory 400. The non-volatile memory 400 includes a plurality of memory cells, and the memory cells are divided into a plurality of blocks. Here, a block refers to a unit of access to the non-volatile memory 400 and is also called a sector. A physical address is assigned to each of the blocks. Note that, a flash memory, a PCRAM, an MRAM, or the like may be used as the non-volatile memory 400 instead of a ReRAM.

[Example of Configuration of Memory Controller]

Figure 2:
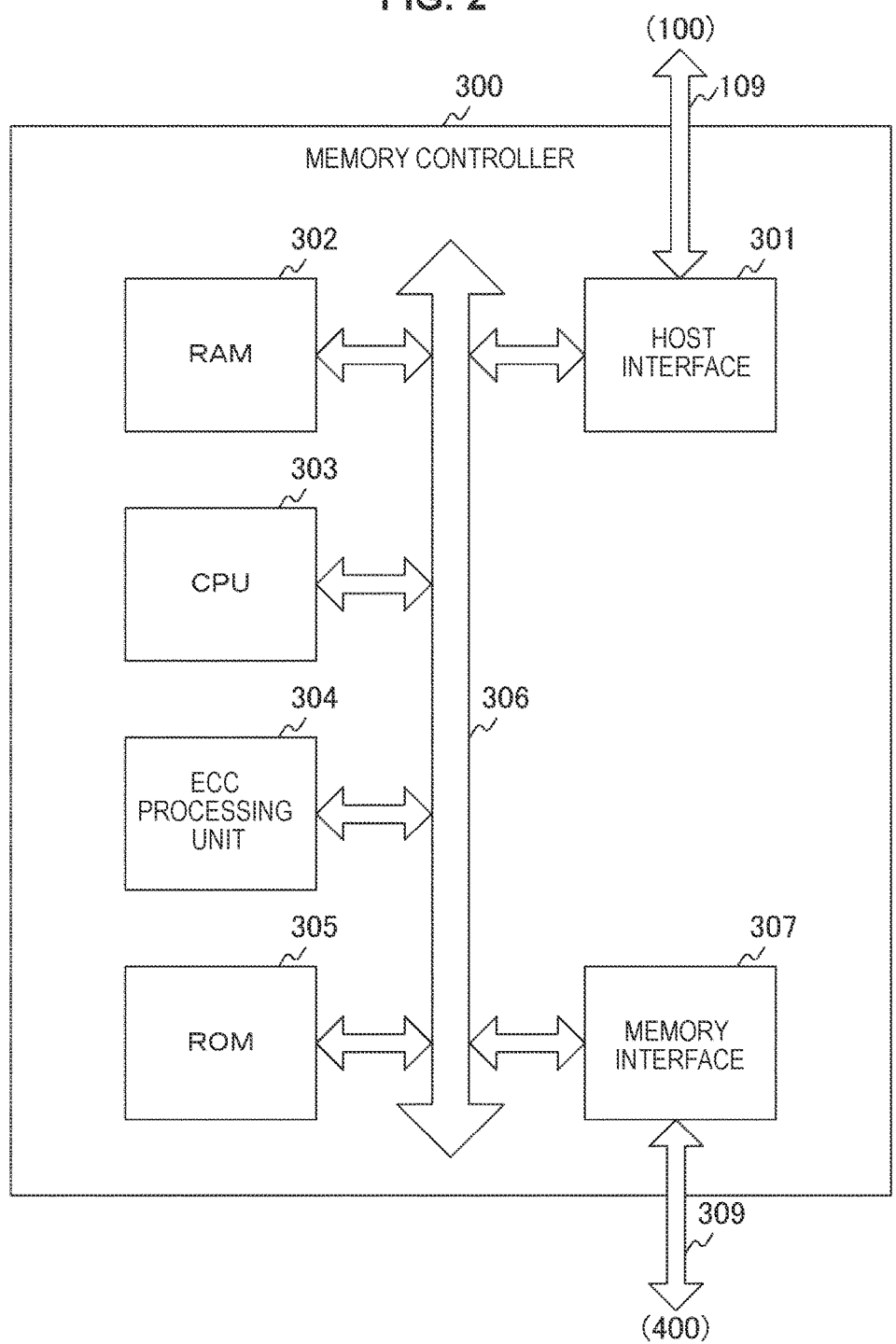
FIG. 2 is a block diagram illustrating an example of a configuration of a memory controller according to the first embodiment.

FIG. 2 is a block diagram illustrating an example of a configuration of the memory controller 300 according to the first embodiment. The memory controller 300 includes a host interface 301, a random access memory (RAM) 302, a central processing unit (CPU) 303, and an ECC processing unit 304. In addition, the memory controller 300 includes a read only memory (ROM) 305, a bus 306, and a memory interface 307.

The host interface 301 is for exchanging data and commands with the host computer 100. The RAM 302 temporarily holds data necessary for processes executed by the CPU 303. The CPU 303 entirely controls the memory controller 300. The ROM 305 stores programs executed by the CPU 303 and the like. The bus 306 is a shared path for exchanging data between the RAM 302, the CPU 303, the ECC processing unit 304, the ROM 305, the host interface 301, and the memory interface 307. The memory interface 307 is for exchanging data and commands with the non-volatile memory 400.

The ECC processing unit 304 encodes information bits and decodes read data. In the encoding of the information bits, the ECC processing unit 304 sets data including a predetermined number of information bits as encoding target data and encodes the encoding target data in a predetermined unit by adding redundant bits thereto. An individual piece of data encoded in the predetermined unit is called a "code word." In addition, the ECC processing unit 304 supplies the encoded data to the non-volatile memory 400 as write data via the bus 306.

In addition, the ECC processing unit 304 decodes encoded read data to original information bits thereof. In the decoding, the ECC processing unit 304 detects the presence or absence of an error in the read data and corrects the error using redundant bits. The ECC processing unit 304 supplies the decoded information bits to the host computer 100 via the bus 306.

Figure 3:
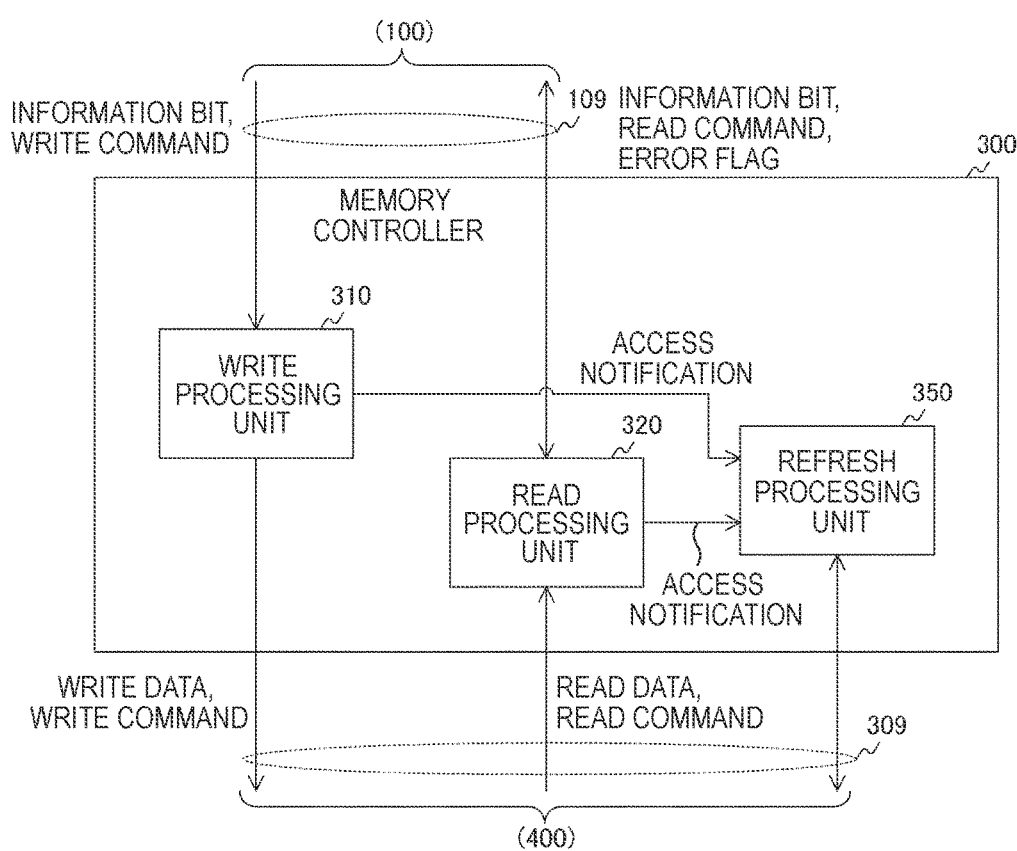
FIG. 3 is a block diagram illustrating an example of a functional configuration of the memory controller according to the first embodiment.

FIG. 3 is a block diagram illustrating an example of a functional configuration of the memory controller 300 according to the first embodiment. The memory controller 300 includes a write processing unit 310, a read processing unit 320, and a refresh processing unit 350. The write processing unit 310 of FIG. 3 is realized by the host interface 301, the RAM 302, the CPU 303, the ECC processing unit 304, the ROM 305, the bus 306, and the memory interface 307 of FIG. 2 and the like. The same applies to the read processing unit 320 and the refresh processing unit 350.

The write processing unit 310 executes a process of writing write data on the non-volatile memory 400 according to a write command. When a write command and information bits are received from the host computer 100, the write processing unit 310 sets data including the information bits as encoding target data and encodes the encoding target data into code words. The encoding target data is encoded into, for example, binary BCH codes in the encoding. In the encoding into the BCH codes, for example, a generator polynomial based on the following expression is used.

$$G(x)=LCM[M_1(x), M_2(x), \ldots, M_{2t}(x)] \quad \text{[Math. 1]}$$

In the above expression, LCM[ ] indicates a polynomial of a least common multiple of each polynomial in [ ]. In addition, $M_i(x)$ indicates a minimum polynomial of $\alpha_i$ when a primitive element of a Galois Field GF (2q) is set as $\alpha$.

Then, the write processing unit 310 outputs the encoded data to the non-volatile memory 400 as write data. In addition, the write processing unit 310 supplies an access notification for notifying the refresh processing unit 350 of a physical address to which access is made each time write data is written.

Note that although the write processing unit 310 encodes the encoding target data into the binary BCH codes, the encoding target data may be encoded into codes other than the BCH codes in a case of an error detection and correction code. The write processing unit 310 may encode the data into, for example, Reed-Solomon (RS) codes or convolutional codes. In addition, the write processing unit 310 may encode the data into codes of a higher dimension than binary.

The read processing unit 320 executes a process of reading read data from the non-volatile memory 400 according to a read command. When a read command is received from the host computer 100, the read processing unit 320 reads a received word from a physical address designated by the command as read data. The read processing unit 320 decodes the read data into original information. In the decoding, the read processing unit 320 corrects an error in the read data using redundant bits included in the read data. In addition, the read processing unit 320 generates an error flag for notifying the host computer 100 whether or not the decoding succeeds, and outputs the error flag thereto along with the decoded information bits. In addition, the read processing unit 320 supplies an access notification for notifying the refresh processing unit 350 of a physical address to which access is made each time read data is read.

When a degree of deterioration of a memory cell is higher than the given degree, the refresh processing unit 350 performs the refresh process on the memory cell. The refresh processing unit 350 counts, for example, the number of accesses to each physical address and starts the refresh process on a certain physical address when a frequency of access to the physical address exceeds a predetermined value. Note that although the refresh processing unit 350 sets whether or not a frequency of access exceeds the predetermined value as a condition for starting the refresh process, the setting is not limited to this configuration. For example, the refresh processing unit 350 may obtain a frequency of occurrence of write errors or read errors for each physical address, and start the refresh process when the frequency of occurrence of errors exceeds a tolerable value.

[Example of Configuration of Write Processing Unit]

Figure 4:
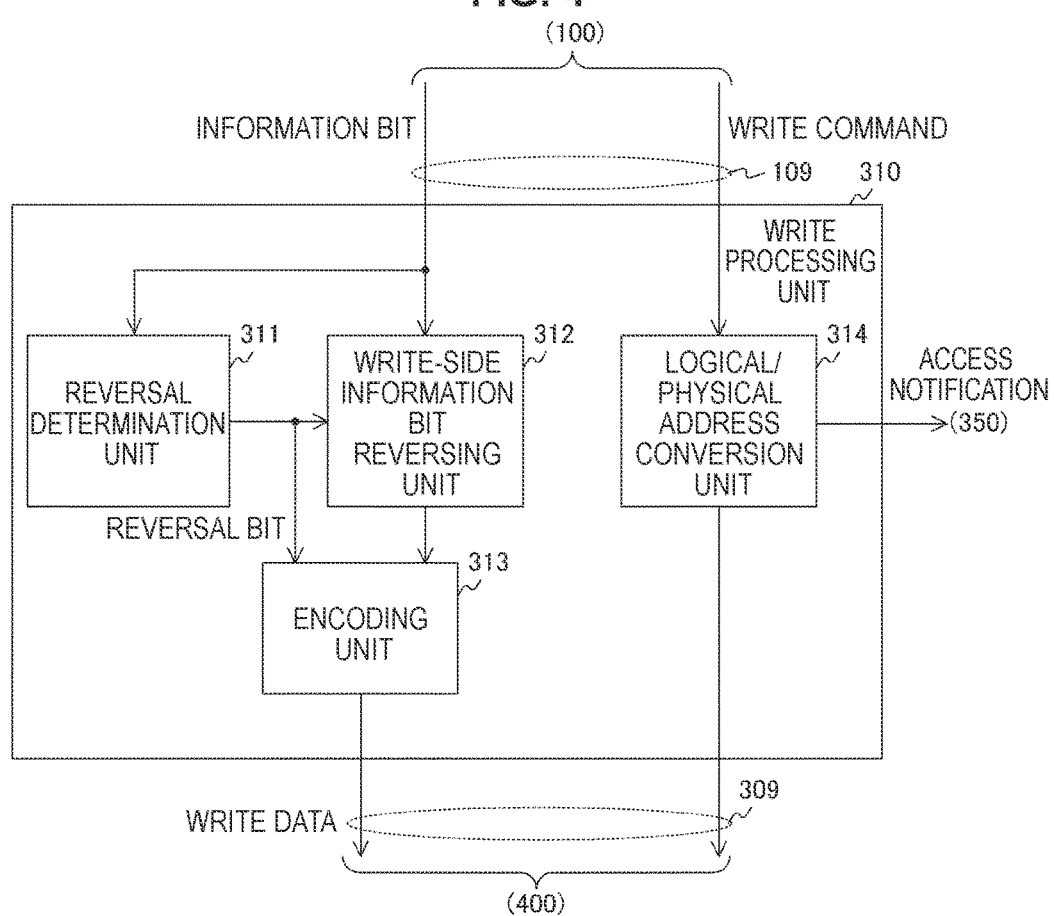
FIG. 4 is a block diagram illustrating an example of a configuration of a write processing unit according to the first embodiment.

FIG. 4 is a block diagram illustrating an example of a configuration of the write processing unit 310 according to the first embodiment. The write processing unit 310 includes a reversal determination unit 311, a write-side information bit reversing unit 312, an encoding unit 313, and a logical/physical address conversion unit 314.

The reversal determination unit 311 determines whether or not information bits are to be reversed. The reversal determination unit 311 determines, for example, whether or not bits of a specific value (for example, "0") of information bits are multiple bits having a number of bits greater than half of the total number of bits k. Then, when the bits of "0" are multiple bits, the reversal determination unit 311 generates a reversal bit indicating that no reversal is to be performed and otherwise generates a reversal bit indicating that reversal is to be performed, and supplies the reversal bit to the write-side information bit reversing unit 312 and the encoding unit 313. For example, a reversal bit of "1" is generated when reversal is to be performed and the reversal bit of "0" is generated when no reversal is to be performed. Note that the reversal bit is an example of reversal information described in the claims.

If, unlike above, the bits of "0" are not multiple bits, reversed data is written, and thus the number of bits of "1" is equal to or smaller than the total number of bits k in the information bits at any time. Thus, in each reset process in which "1" is re-written to "0" and a set process in which "0" is re-written to "1" in the non-volatile memory 400, the number of changed bits of the information bits is equal to or smaller than k/2 at any time. Therefore, a maximum value of power consumption in a write process of the non-volatile memory 400 is reduced.

The write-side information bit reversing unit 312 reverses information bits according to the reversal bit. The write-side information bit reversing unit 312 reverses the information bits and supplies them to the encoding unit 313 when the reversal bit indicates reversing, or supplies them to the encoding unit 313 without reversing the information bits when the reversal bit does not indicate reversing.

The encoding unit 313 encodes encoding target data constituted by information bits and the reversal bit. The encoding unit 313 supplies the encoded data to the non-volatile memory 400 as write data.

The logical/physical address conversion unit 314 converts a logical address designated by a write command into a physical address. Here, the logical address is an address allocated to each area of access units that are set when the host computer 100 accesses the storage 200 at an address space defined by the host computer 100. In addition, the physical address is an address allocated to each of blocks (the access units) in the non-volatile memory 400 as described above. The logical/physical address conversion unit 314 supplies a write command obtained by converting an address to the non-volatile memory 400. In addition, the logical/physical address conversion unit 314 generates an access notification and supplies the access notification to the refresh processing unit 350.

Note that although the write processing unit 310 reverses information bits when necessary, the information bits may be written without being reversed at any time. In this case, the reversal determination unit 311 and the write-side information bit reversing unit 312 are unnecessary, and the encoding unit 313 performs encoding by adding the reversal bit indicating that no reversal is to be performed to information bits.

Figure 5:
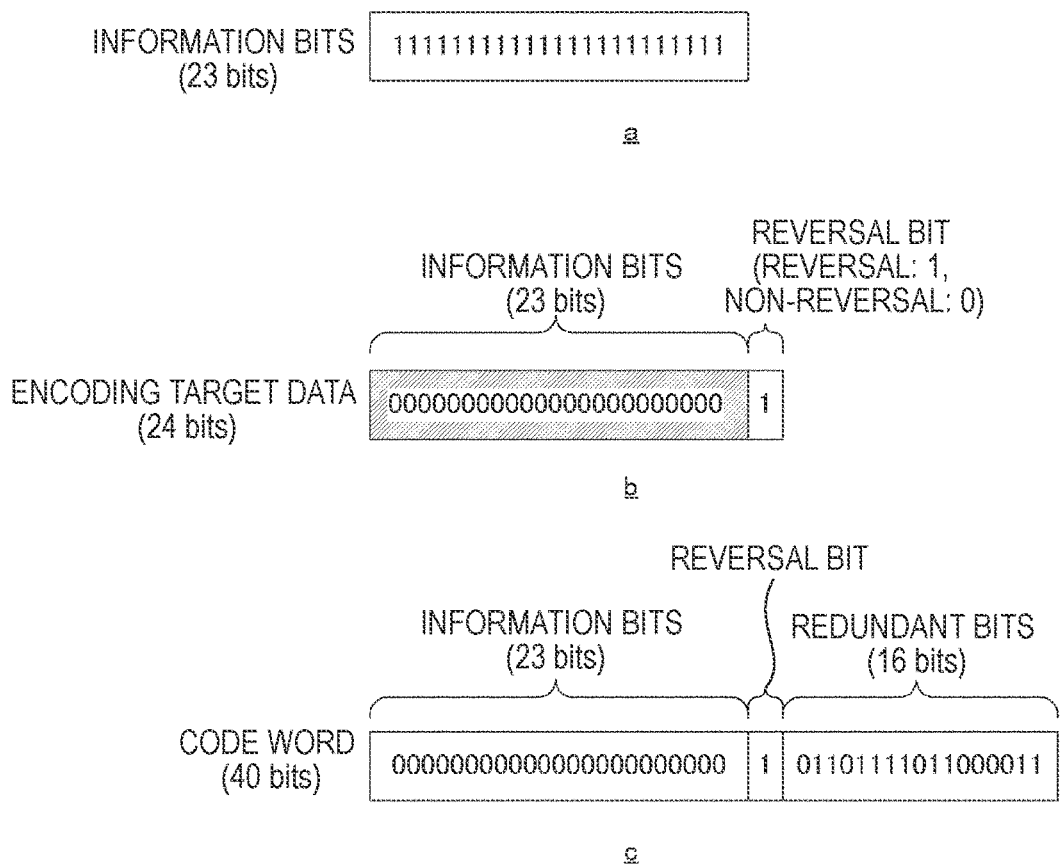
FIG. 5 is a diagram illustrating an example of data generated through a write process according to the first embodiment.

FIG. 5 is a diagram illustrating an example of data generated through a write process according to the first embodiment. a of the drawing shows an example of information bits to be encoded. The write processing unit 310 encodes the information bits in units of, for example, 23 bits. b of the drawing shows an example of encoding target data. The write processing unit 310 reverses the information bits of, for example, 23 bits when necessary and generates 24-bit data including the information bits and a reversal bit as the encoding target data. c of the drawing illustrates an example of write data. The write processing unit 310 generates redundant bits of, for example, 16 bits from the 24-bit encoding target data to write 40-bit code words including the bits in the non-volatile memory 400 as write data.

[Example of Configuration of Read Processing Unit]

Figure 6:
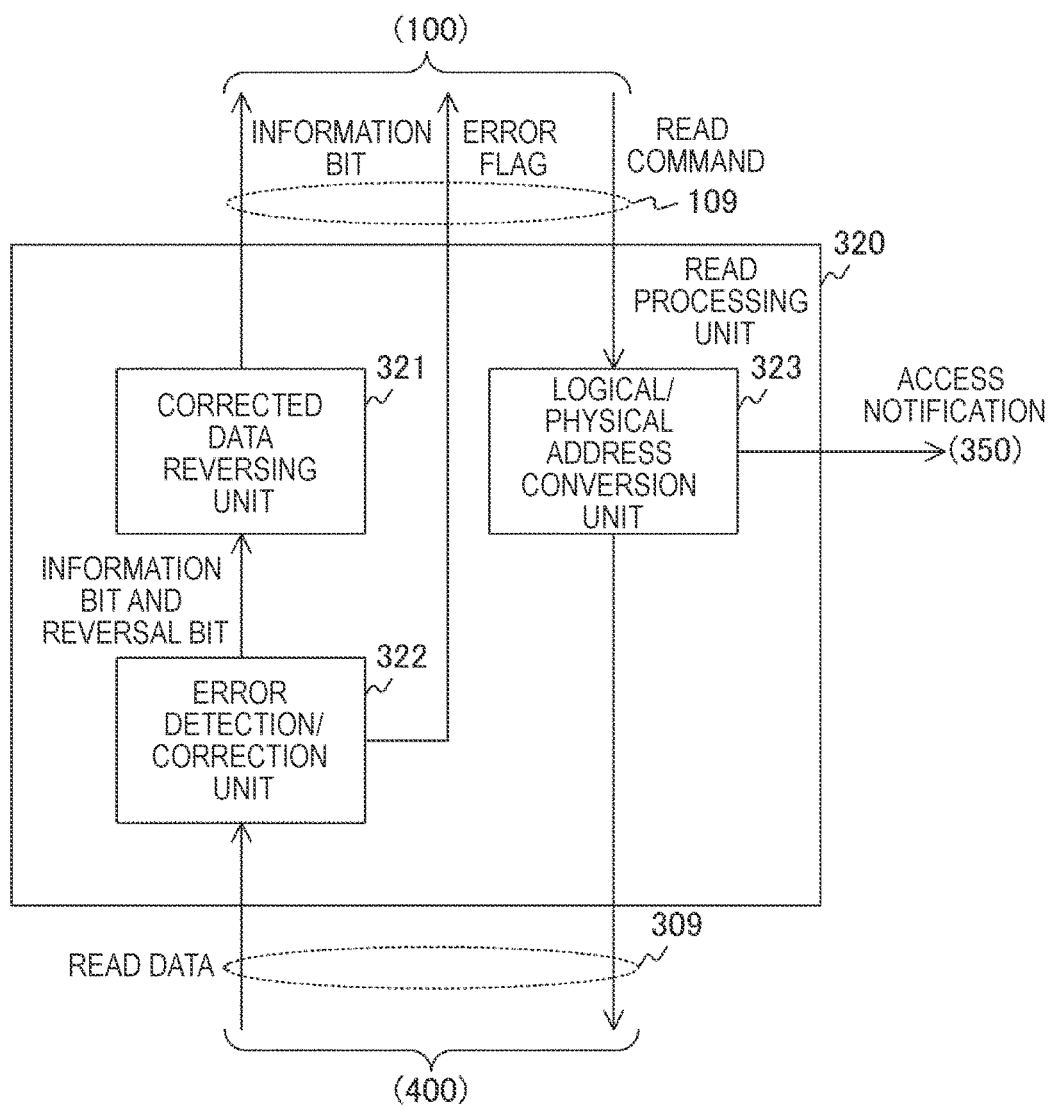
FIG. 6 is a block diagram illustrating an example of a configuration of a read processing unit according to the first embodiment.

FIG. 6 is a block diagram illustrating an example of a configuration of the read processing unit 320 according to the first embodiment. The read processing unit 320 includes a corrected data reversing unit 321, an error detection/correction unit 322, and a logical/physical address conversion unit 323.

The error detection/correction unit 322 detects the presence or absence of an error in read data and corrects the error. The error detection/correction unit 322 supplies information bits and a reversal bit included in the read data that has the error corrected to the corrected data reversing unit 321. In addition, the error detection/correction unit 322 generates an error flag and supplies the error flag to the host computer 100.

The corrected data reversing unit 321 reverses information bits that have the error corrected according to the reversal bit. The corrected data reversing unit 321 reverses the information bits when the reversal bit indicates that reversal is to be performed, and then supplies the information bits to the host computer 100, or supplies the information bits to the host computer 100 without reversing the information bits when the reversal bit does not indicate reversal.

The logical/physical address conversion unit 323 converts a logical address designated by a read command into a physical address. The logical/physical address conversion unit 323 supplies the read command with which the address has been converted to the non-volatile memory 400. In addition, the logical/physical address conversion unit 323 generates an access notification and supplies the access notification to the refresh processing unit 350.

[Refresh Processing Unit]

Figure 7:
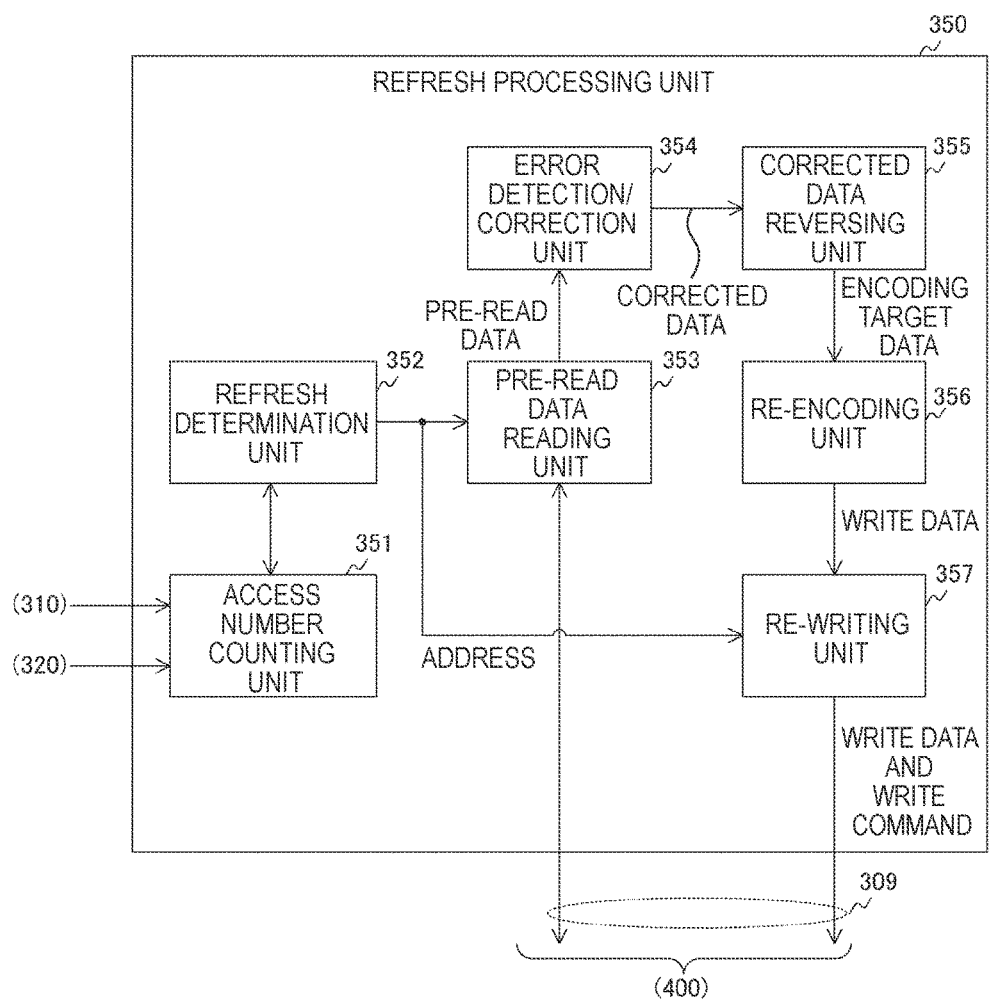
FIG. 7 is a block diagram illustrating an example of a configuration of a refresh processing unit according to the first embodiment.

FIG. 7 is a block diagram illustrating an example of a configuration of the refresh processing unit 350 according to the first embodiment The refresh processing unit 350 includes an access number counting unit 351, a refresh determination unit 352, a pre-read data reading unit 353, an error detection/correction unit 354, a corrected data reversing unit 355, a re-encoding unit 356, and a re-writing unit 357.

The access number counting unit 351 counts the number of accesses to each physical address. The refresh determination unit 352 determines whether or not refresh is to be started on the basis of the number of accesses. The refresh determination unit 352 supplies a physical address at which refresh is to be performed to the pre-read data reading unit 353 and the re-writing unit 357.

The pre-read data reading unit 353 reads received words from the physical address supplied from the refresh determination unit 352 as pre-read data. The pre-read data reading unit 353 supplies the read pre-read data to the error detection/correction unit 354. Note that the pre-read data reading unit 353 is an example of the reading unit described in the claims.

The error detection/correction unit 354 detects the presence or absence of an error in the pre-read data and corrects the error. The error detection/correction unit 354 detects and corrects the error using redundant bits included in the pre-read data. The error detection/correction unit 354 supplies the pre-read data that has the error corrected to the corrected data reversing unit 355 as corrected data.

The corrected data reversing unit 355 reverses information bits and a reversal bit included in the corrected data. The corrected data reversing unit 355 supplies the reversed information bits and reversal bits to the re-encoding unit 356 as encoding target data. Note that the corrected data reversing unit 355 is an example of the data reversing unit described in the claims.

The re-encoding unit 356 encodes the encoding target data. The re-encoding unit 356 generates new redundant bits from the encoding target data and supplies the encoding target data and code words including the redundant bits to the re-writing unit 357 as write data.

The re-writing unit 357 writes the write data in the non-volatile memory 400. The re-writing unit 357 issues a write command for designating a physical address to be refreshed, and supplies the write command to the non-volatile memory 400 along with the write data. Note that the re-writing unit 357 is an example of the writing unit described in the claims.

[Example of Configuration of Non-Volatile Memory]

Figure 8:
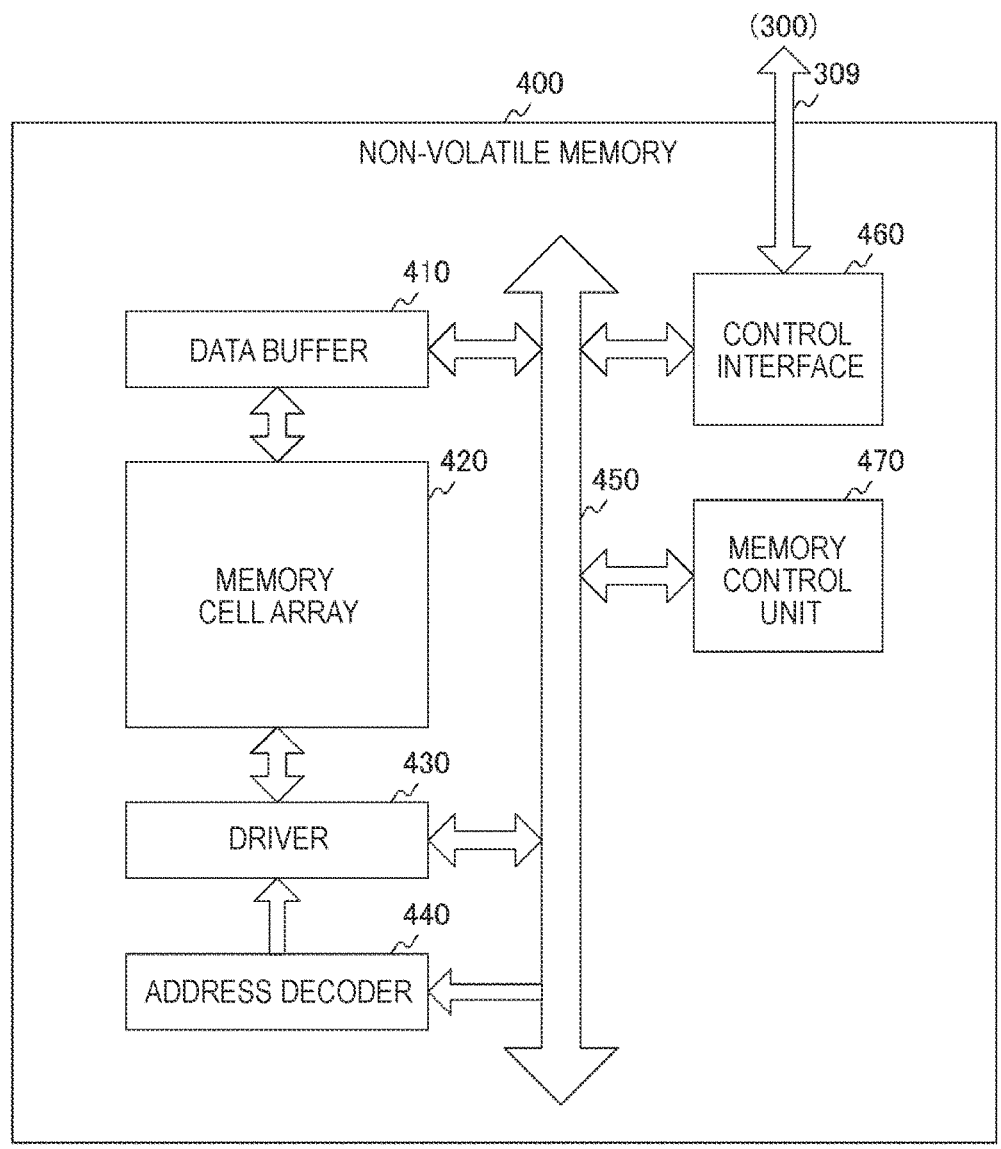
FIG. 8 is a block diagram illustrating an example of a configuration of a non-volatile memory according to the first embodiment.

FIG. 8 is a block diagram illustrating an example of a configuration of the non-volatile memory 400 according to the first embodiment. The non-volatile memory 400 includes a data buffer 410, a memory cell array 420, a driver 430, an address decoder 440, a bus 450, a control interface 460, and a memory control unit 470.

The data buffer 410 holds write data and read data in access units according to control of the memory control unit 470. The memory cell array 420 includes a plurality of memory cells arrayed in a matrix shape. Non-volatile memory elements are used as each of the memory cells. Specifically, a NAND-type or NOR-type flash memory, a ReRAM, a PCRAM, a MRAM, and the like are used as the memory elements.

The driver 430 causes data writing or data reading to be performed on a memory cell selected by the address decoder 440. The address decoder 440 analyzes an address designated by a command and selects a memory cell corresponding to the address. The bus 450 is a path shared by the data buffer 410, the memory cell array 420, the address decoder 440, the memory control unit 470, and the control interface

460 for mutually exchanging data. The control interface 460 is an interface through which the memory controller 300 and the non-volatile memory 400 exchange data and commands with each other.

The memory control unit 470 controls the driver 430 and the address decoder 440 such that data writing or reading is performed. When a write command and write data are received, the memory control unit 470 reads data written at an address designated by the command as pre-read data. This reading is called pre-reading. The memory control unit 470 compares the write data to the pre-read data in units of bits and sets bits of "1" in the write data and of "0" in the pre-read data as re-writing targets. The memory control unit 470 re-writes the bits of the re-writing targets to "1." This process is called a reset process. Next, the memory control unit 470 compares the write data to the set pre-read data in units of bits and sets bits of "0" in the write data and of "1" in the pre-read data as re-writing targets. The memory control unit 470 re-writes the bits of the re-writing targets as "0." This process is called a set process.

In addition, when a read command is received, the memory control unit 470 controls the address decoder 440 and the driver 430 such that data at the designated physical address is output to the memory controller 300 as read data.

Figure 9:
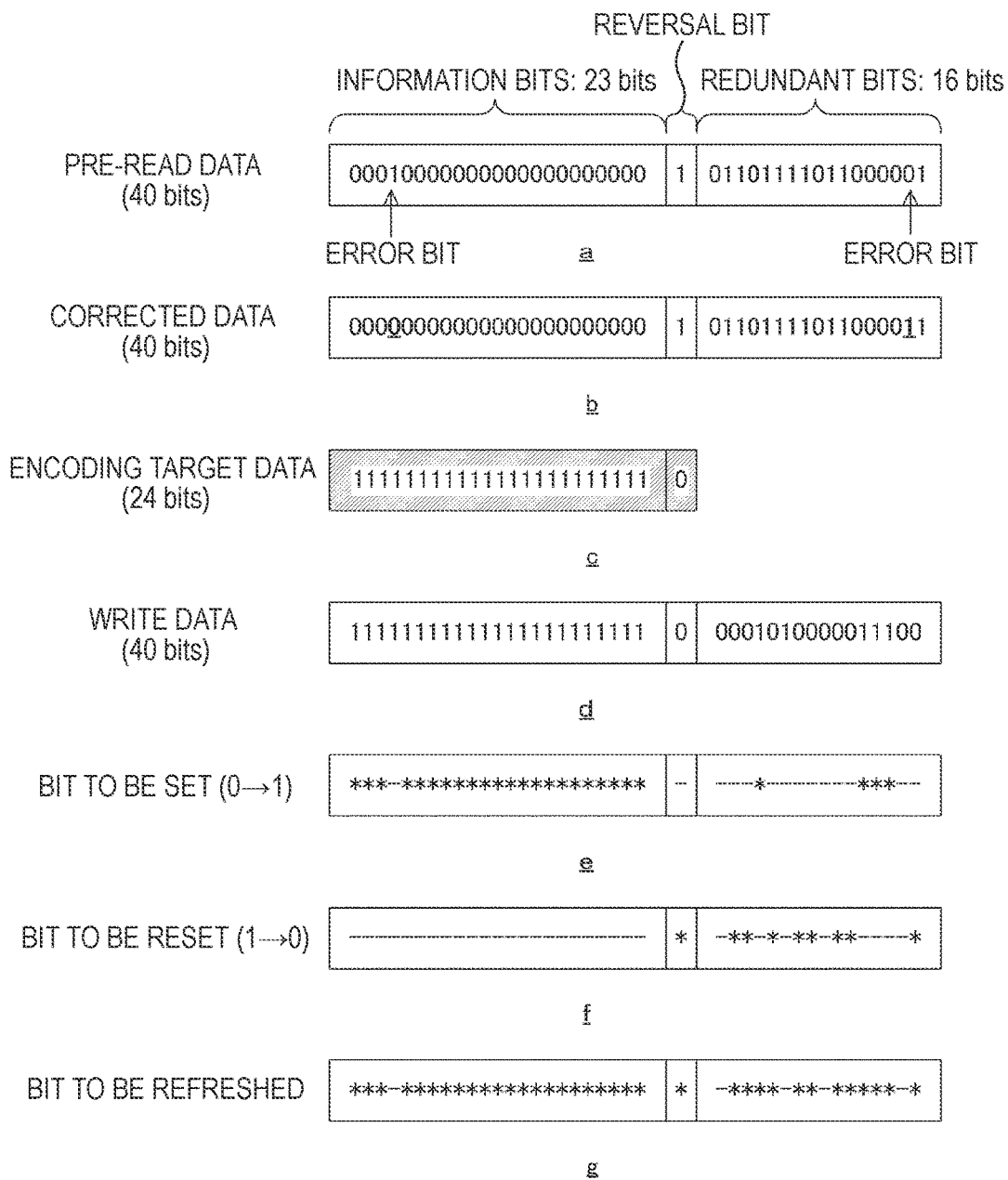
FIG. 9 is a diagram illustrating an example of data generated through a refresh process according to the first embodiment.

FIG. 9 is a diagram illustrating an example of data generated through a refresh process according to the first embodiment. a of the drawing shows an example of pre-read data read from a physical address to be refreshed. For example, the refresh processing unit 350 reads 40-bit received words including 23-bit information bits, a reversal bit, and 16-bit redundant bits as the pre-read data. b of the drawing is a diagram illustrating an example of corrected data that has the errors corrected. For example, the refresh processing unit 350 detects a fourth bit from the head of the information bits and a second bit from the tail of the redundant bits of the pre-read data as error bits and corrects values thereof.

In addition, c of FIG. 9 is a diagram illustrating an example of encoding target data. The refresh processing unit 350 generates 24-bit encoding target data by reversing 23-bit information bits and the reversal bit included in the corrected data. d of the drawing is a diagram illustrating an example of write data. For example, the refresh processing unit 350 generates 16-bit redundant bits from the 24-bit encoding target data and supplies 40-bit code words including the redundant bits to the non-volatile memory 400 as write data.

e of FIG. 9 is a diagram illustrating positions of bits to be set. In e of the drawing, "*" represents positions of bits on which the set process is performed and "-" represents positions of bits on which the set process is not performed. For example, when a bit at the head of the pre-read data in a of the drawing is "0" and a bit at the head of the write data in d of the drawing is "1," the non-volatile memory 400 sets a bit at the head of a physical address. f of the drawing is a diagram illustrating positions of reset bits. In f of the drawing, "*" represents positions of bits on which the reset process is performed and "-" represents positions of bits on which the reset process is not performed. For example, when a reversal bit of a $24^{th}$ bit from the head of the pre-read data of a of the drawing is "1" and a reversal bit of the write data in d of the drawing is "0," the non-volatile memory 400 resets a $24^{th}$ bit from the head of the physical address.

g of FIG. 9 is a diagram illustrating positions of bits to be refreshed. In g of the drawing, "*" represents positions of bits to be refreshed and "-" represents positions of bits not to be refreshed. Since the memory controller 300 reverses corrected information bits and writes code words including the reversed information bits as write data, all information bits in which no error has been detected can be refreshed. Note that a probability of memory cells corresponding to redundant bits on which re-writing is to be performed is equivalent to a probability of random patterns being changed to re-generated random patterns, which is about ½.

FIG. 10 is a diagram illustrating examples of distributions of resistance of variable resistive elements before and after deterioration according to the first embodiment. The horizontal axes of the drawing represent a resistance value R, and the vertical axes represent relative distributions of the number of cells with relative values. States of the resistance of the variable resistive elements are broadly divided into two distributions at a boundary of a predetermined threshold value. A state in which a resistance value is lower than the threshold value is called a low-resistance state (LRS), and a state in which a resistance value is higher than the threshold value is called a high-resistance state (HRS).

The variable resistive elements function as memory cells by associating each of the high-resistance state and the low-resistance state of the variable resistive elements with a logic zero value or a logic one value. Whether a state is associated with the logic zero value or the logic one value is arbitrary. For example, the high-resistance state may be associated with the logic one value and the low-resistance state may be associated with the logic zero value.

a of FIG. 10 is a diagram illustrating an example of a distribution of resistance of variable resistive elements that do not deteriorate. When the variable resistive elements do not deteriorate, resistance values of all memory cells in which "0" is written are lower than the threshold value and resistance values of all memory cells in which "1" is written are higher than the threshold value. Thus, bits of the same value as a written value are read and no reading error occurs.

On the other hand, b of FIG. 10 is a diagram illustrating an example of a distribution of resistance of variable resistive elements whose deterioration has progressed. When deterioration progresses, there is a concern of resistance values of memory cells in which "0" is written increasing and eventually exceeding the threshold value. Since the value "1" is read from the memory cells whose resistance values exceed the threshold value, an error occurs. In addition, there is a concern of resistance values of memory cells in which "1" is written decreasing and eventually being lower than the threshold value. Since the value "0" is read from the memory cells whose resistance values are lower than the threshold value, an error occurs. Portions surrounded by dotted lines in the drawings indicate positions of memory cells in which an error has occurred.

a of FIG. 11 is a diagram illustrating an example of the distribution of the resistance of the variable resistive elements after being refreshed according to the first embodiment. Since the memory controller 300 reverses corrected information bits, all information bits with no error occurred are reversed and written.

b of FIG. 11 is a diagram illustrating an example of a distribution of resistance of variable resistive elements after being refreshed according to a comparative example. In the comparative example, a refresh process in which corrected data is written again has been assumed to be performed. As exemplified in b of the drawing, only information bits of corrected data with an error occurred are reversed and memory cells thereof are refreshed. However, memory cells with no error occurred are not refreshed, and states thereof undergo no improvement. Memory cells that are determined to be normal but whose state of resistance is very close to the threshold value are highly likely to have an error occurred within a short time, and it is necessary to repeatedly perform refresh on all such occasions. Thus, in a configuration in which memory cells with no error occurred are not refreshed, there is a concern of a frequency of refresh for the memory cells increasing when compared to a case in which the memory cells are refreshed.

On the other hand, the memory controller 300 refreshes all memory cells with no error occurred as exemplified in a of FIG. 11. Thus, by causing the state of all of the memory cells with no error to approximately be a state of no deterioration, a frequency of error occurrence can be reduced.

[Example of Operation of Memory System]

Figure 12:
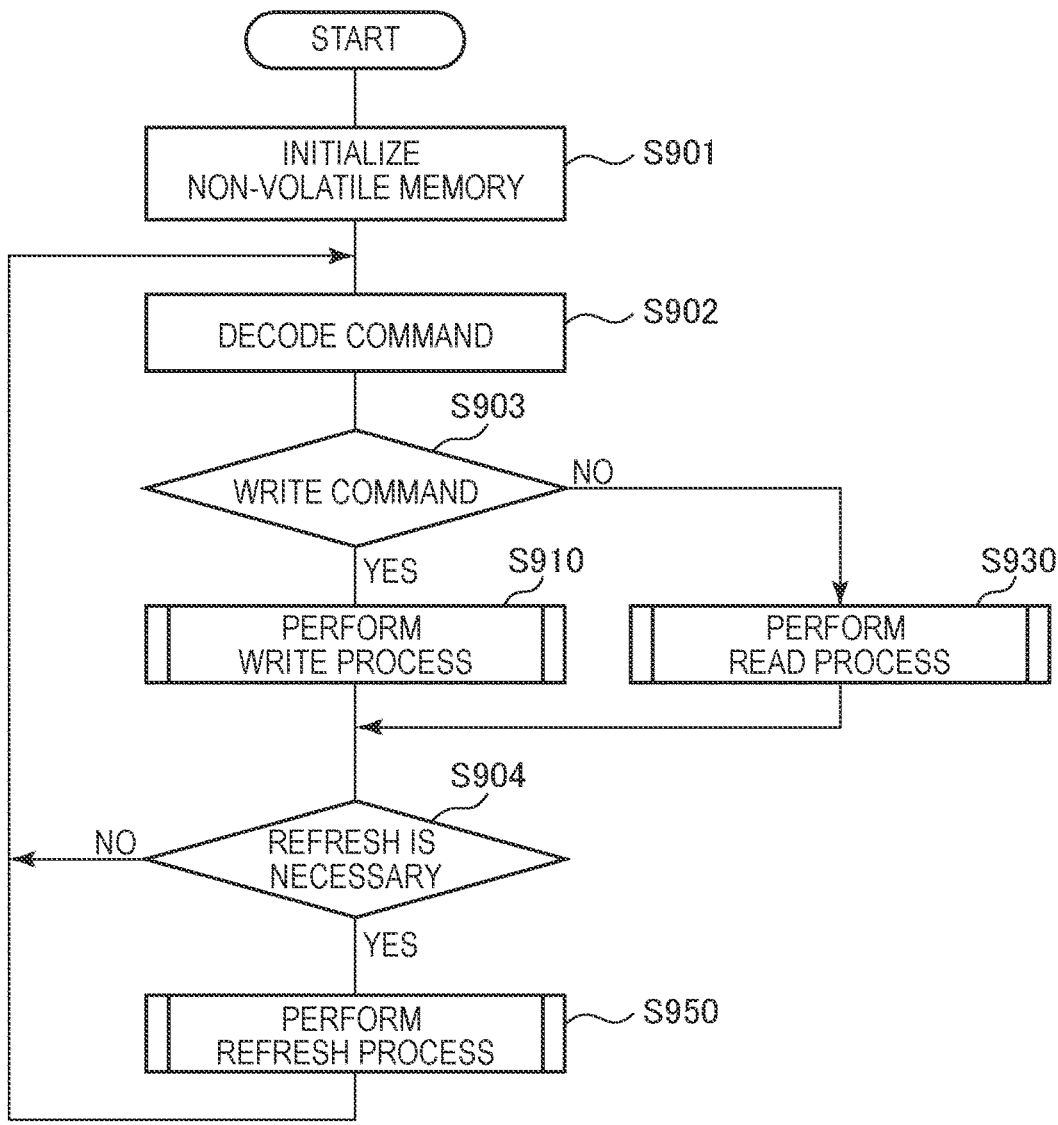
FIG. 12 is a flowchart showing an example of an operation of a storage according to the first embodiment.

FIG. 12 is a flowchart showing an example of an operation of the storage 200 according to the first embodiment. The operation starts when, for example, the host computer 100 instructs the storage 200 to be initialized.

The non-volatile memory 400 initializes all bits within the memory cell array 420 to a specific value (for example, "0") (Step S901). The memory controller 300 decodes a command from the host computer 100 (Step S902). When a command has been received from the host computer 100, the memory controller 300 determines whether or not the command is a write command (Step S903). Here, the command from the host computer 100 is assumed to be any of the write command and a read command. Note that although the non-volatile memory 400 initializes all of the bits to the value "0," the bits may be initialized to the value "1." In that case, the memory controller 300 may determine whether or not the number of bits of "1" exceeds k/2.

When the command is the write command (Yes in Step S903), the memory controller 300 and the non-volatile memory 400 perform a write process (Step S910). On the other hand, when the command is not the write command (No in Step S903), the memory controller 300 and the non-volatile memory 400 perform a read process (Step S930).

After Step S910 or S930, the memory controller 300 determines whether or not refresh is necessary on the basis of a frequency of access or the like (Step S904). When refresh is necessary (Yes in Step S904), the memory controller 300 performs a refresh process (Step S950). On the other hand, when refresh is not necessary (No in Step S904) or after Step S950, the memory controller 300 returns to Step S902.

Figure 13:
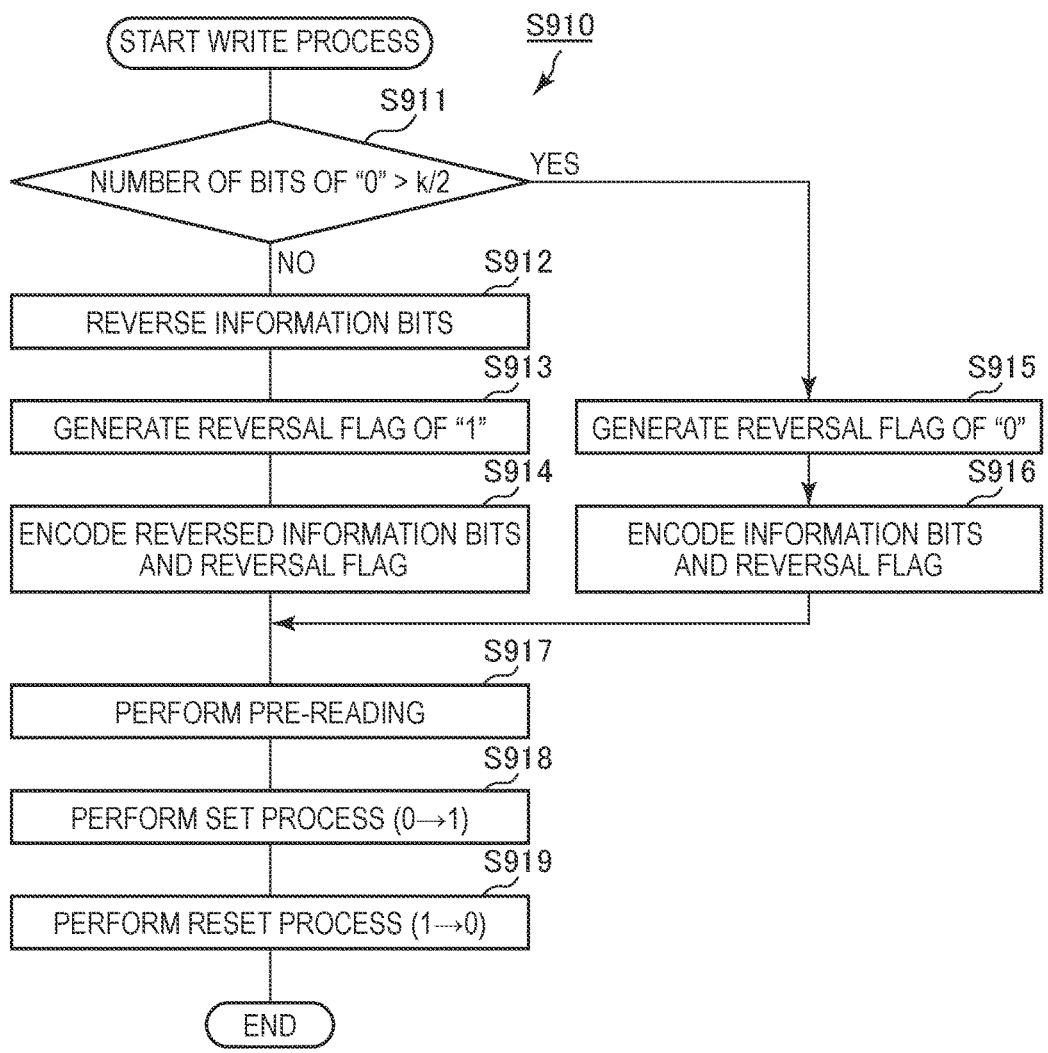
FIG. 13 is a flowchart showing an example of the write process according to the first embodiment.

FIG. 13 is a flowchart showing an example of the write process according to the first embodiment. The memory controller 300 determines whether or not the number of bits of "0" in information bits is greater than k/2 (Step S911).

When the number of bits of "0" is equal to or smaller than k/2 (No in Step S911), the memory controller 300 reverses information bits (Step S912), and generates a reversal flag "1" (Step S913). Then, the memory controller 300 encodes the reversed information bits and the reversal flag, generates write data, and supplies the write data to the non-volatile memory 400 along with a write command (Step S914).

On the other hand, when the number of bits of "0" is greater than k/2 (Yes in Step S911), the memory controller 300 generates a reversal flag "0" (Step S915). Then, the memory controller 300 encodes information bits and the reversal flag, generates write data, and supplies the write data to the non-volatile memory 400 along with a write command (Step S916).

The non-volatile memory 400 performs pre-reading according to the write command (Step S917) and sequentially performs a set process (Step S918) and a reset process (Step S919). After Step S919, the storage 200 ends the write process. Note that although the non-volatile memory 400 performs a status generation process or a verification process in which written data is read and is compared to the write data in units of bits, these processes are omitted in FIG. 13.

Figure 14:
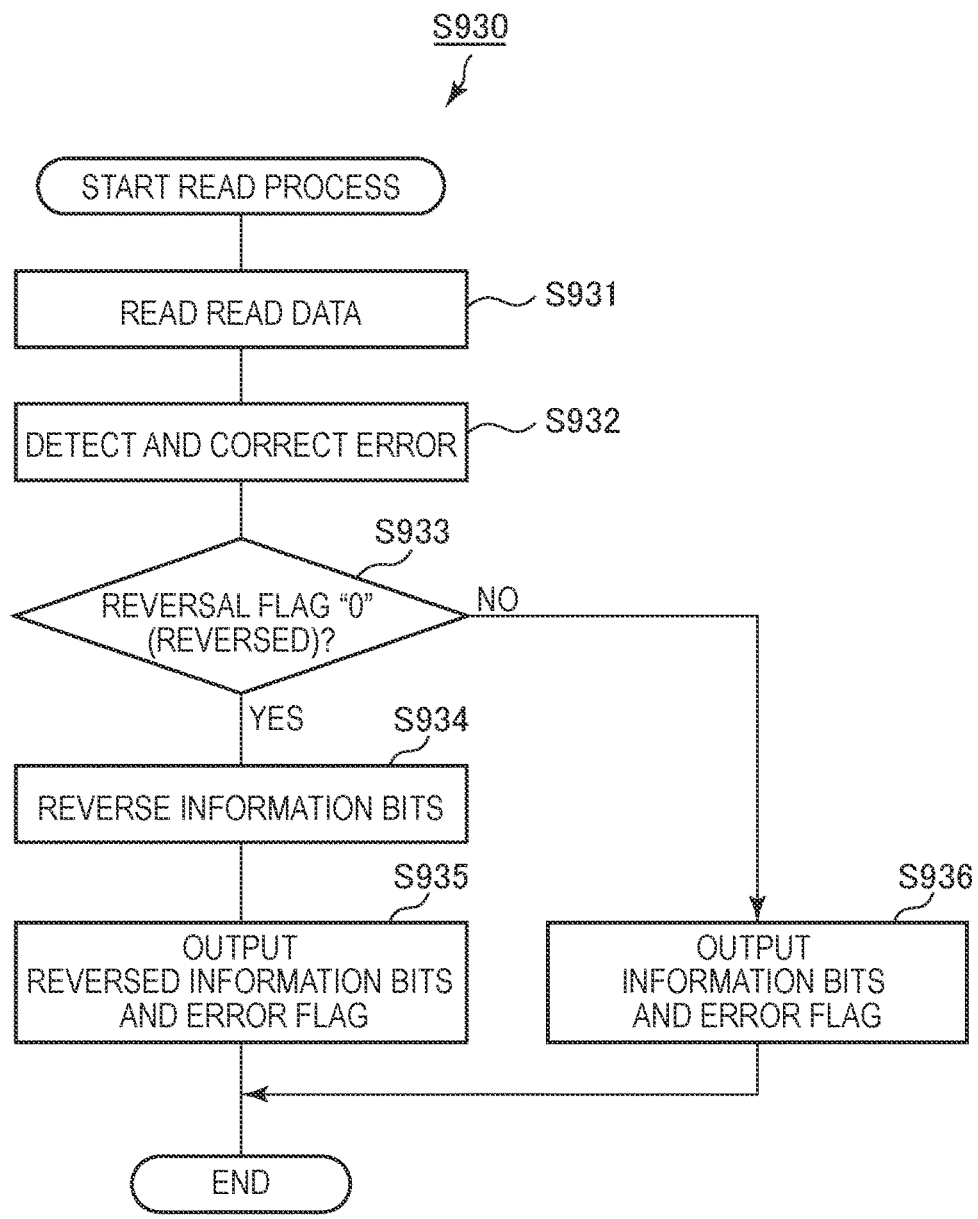
FIG. 14 is a flowchart showing an example of a read process according to the first embodiment.

FIG. 14 is a flowchart showing an example of the read process according to the first embodiment. The non-volatile memory 400 reads read data according to a read command (Step S931). The memory controller 300 performs detection and correction of an error in the read data (Step S932) and determines whether or not a reversal flag in the read data is "0" (Step S933). When the reversal flag in the read data is "0" (Yes in Step S933), the memory controller 300 reverses information bits that have the error corrected (Step S934). Then, the memory controller 300 outputs the reversed information bits to the host computer 100 along with an error flag (Step S935).

On the other hand, when the reversal flag in the read data is "1" (No in Step S933), the memory controller 300 does not reverse the information bits and outputs the information bits to the host computer 100 along with an error flag (Step S936). After Step S935 or S936, the storage 200 ends the read process.

Figure 15:
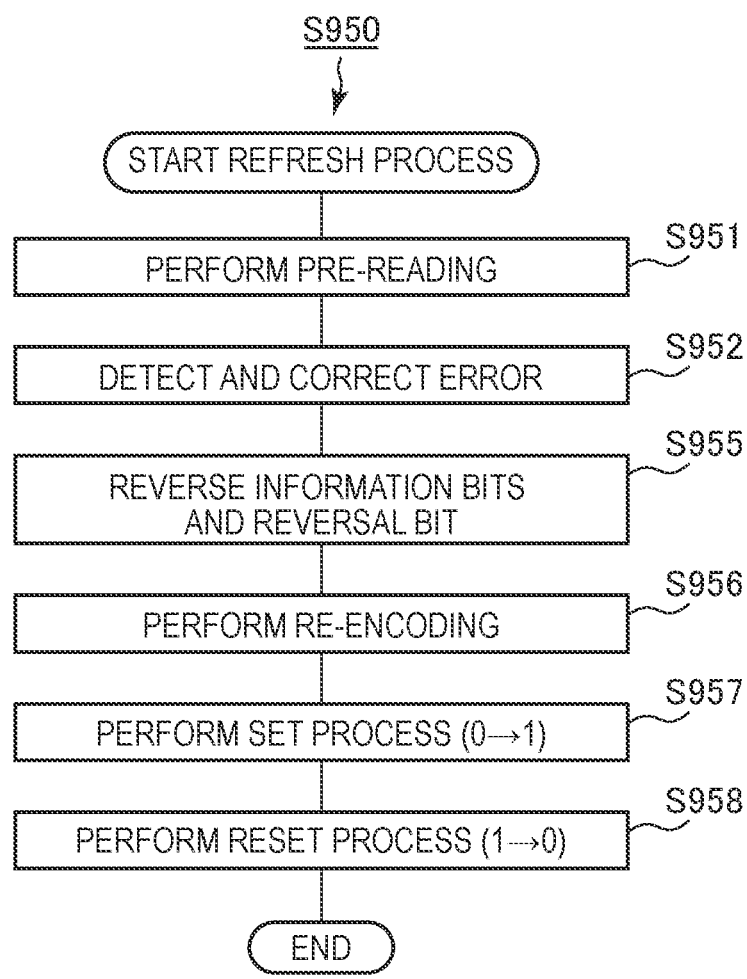
FIG. 15 is a flowchart showing an example of the refresh process according to the first embodiment.

FIG. 15 is a flowchart showing an example of the refresh process according to the first embodiment. The non-volatile memory 400 performs pre-reading according to control of the memory controller 300 (Step S951). The memory controller 300 performs detection and correction of an error in pre-read data (Step S952) and reverses information bits that have the error corrected and a reversal bit (Step S955). The memory controller 300 re-encodes encoding target data including the reversed information bits and the reversal bit and supplies the re-encoded encoding target data to the non-volatile memory 400 along with a write command (Step S956).

The non-volatile memory 400 sequentially performs a set process (Step S957) and a reset process (Step S958) according to the write command in order. After Step S958, the storage 200 ends the refresh process.

According to the first embodiment of the present technology as described above, since the memory controller 300 corrects an error in information bits and reverses the information bits and a reversal bit and then writes the reversed information bits and reversal bit in memory cells, it is possible to perform re-writing on all memory cells that have no errors. Accordingly, by causing a state of the memory cells with no error to approximately be a state of no deterioration, a frequency of error occurrence can be reduced.

2. Second Embodiment

The memory controller 300 according to the first embodiment does not refresh memory cells with an error occurred, and refreshes only memory cells that have no errors. However, it is desirable to also perform refresh also on memory cells with an error occurred. A memory controller 300 according to a second embodiment is different from that of the first embodiment in that the memory controller also refreshes memory cells with an error occurred.

Figure 16:
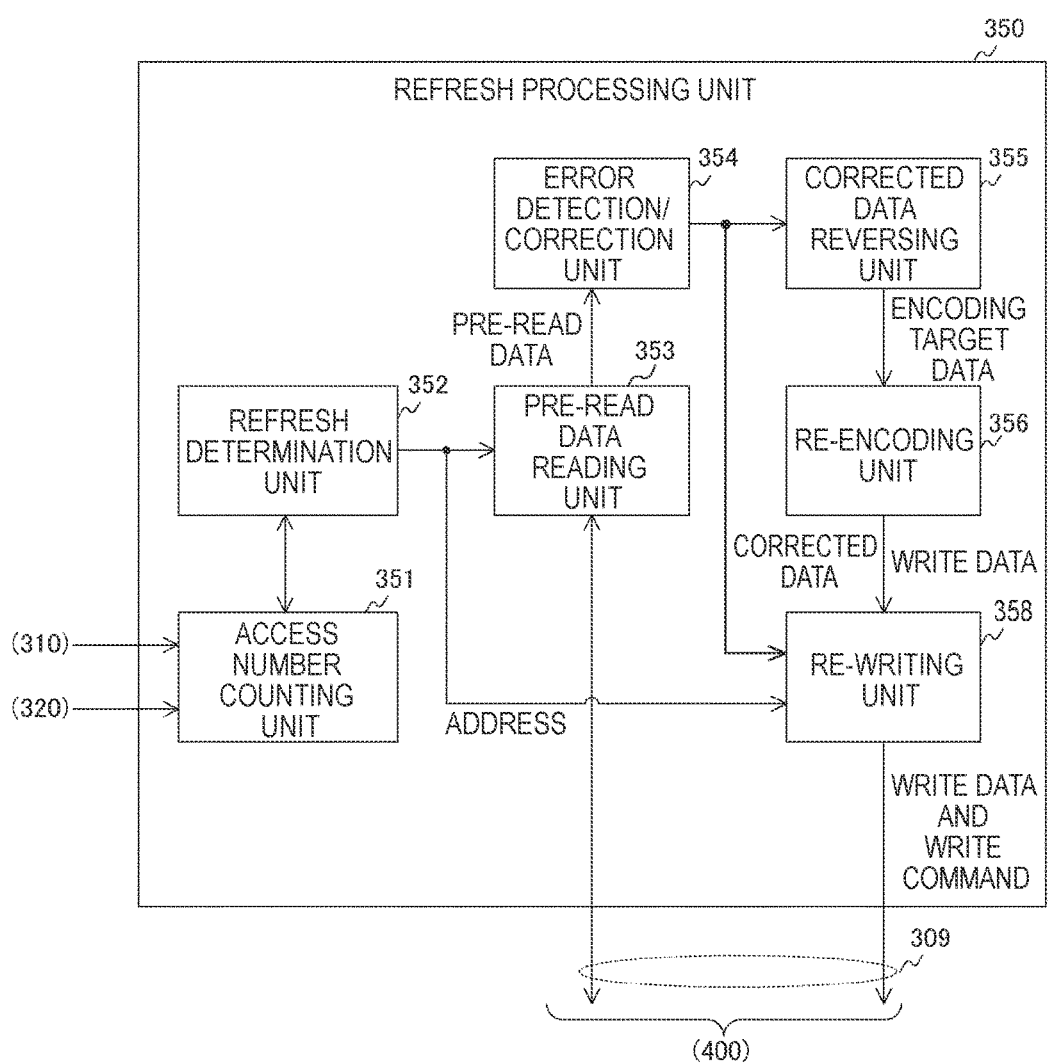
FIG. 16 is a block diagram illustrating an example of a configuration of a refresh processing unit according to the second embodiment.

FIG. 16 is a block diagram illustrating an example of a configuration of a refresh processing unit 350 according to the second embodiment. The refresh processing unit 350 according to the second embodiment is different from that of the first embodiment in that the refresh processing unit has a re-writing unit 358 instead of the re-writing unit 357. In addition, an error detection/correction unit 354 according to the second embodiment supplies corrected data to the re-writing unit 358 in addition to a corrected data reversing unit 355.

The re-writing unit 358 supplies the corrected data to the non-volatile memory 400 along with a write command, then re-issues the write command and supplies the write command to the non-volatile memory 400 along with write data from a re-encoding unit 356.

Figure 17:
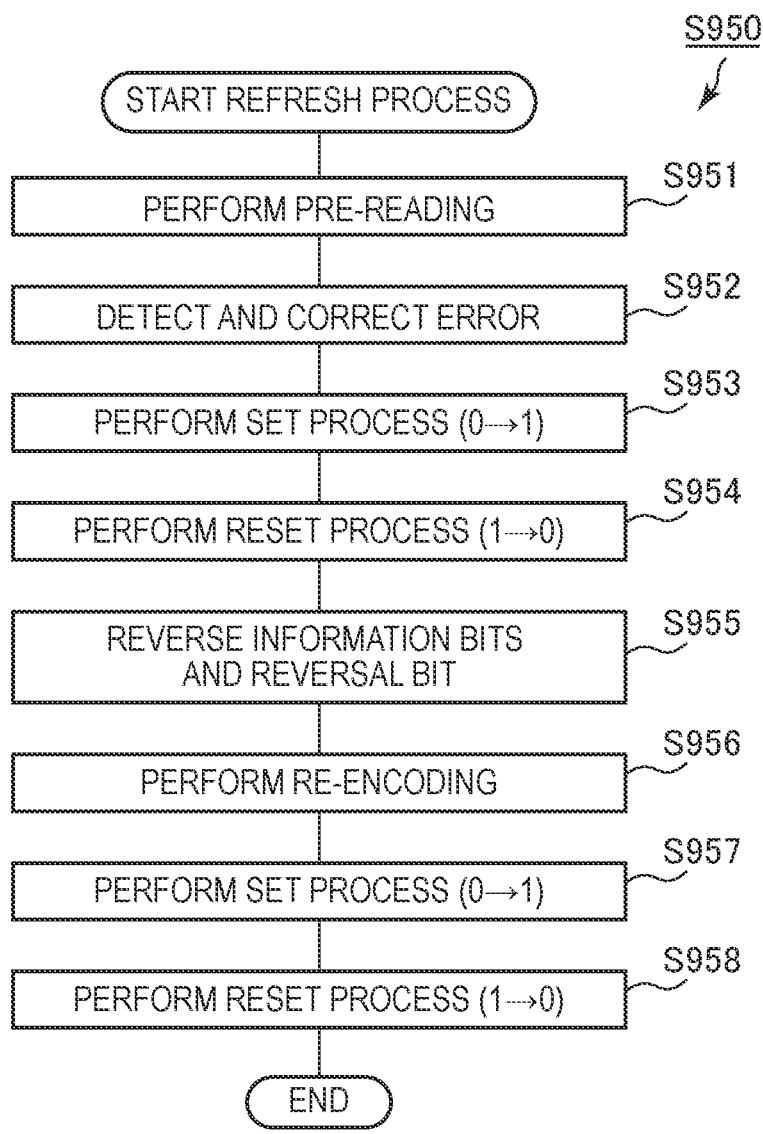
FIG. 17 is a flowchart showing an example of the refresh process according to the first embodiment.

FIG. 17 is a flowchart showing an example of a refresh process according to the second embodiment. The refresh process of the second embodiment is different from that of the first embodiment in that Steps S953 and S954 are additionally executed.

After error detection and correction (Step S952), the memory controller 300 supplies corrected data to the non-volatile memory 400. Then, the non-volatile memory 400 compares the corrected data and pre-read data and performs a set process (Step S953) and a reset process (Step S954). In addition, the memory controller 300 and the non-volatile memory 400 perform the process of Step S955 and the following steps.

Figure 18:
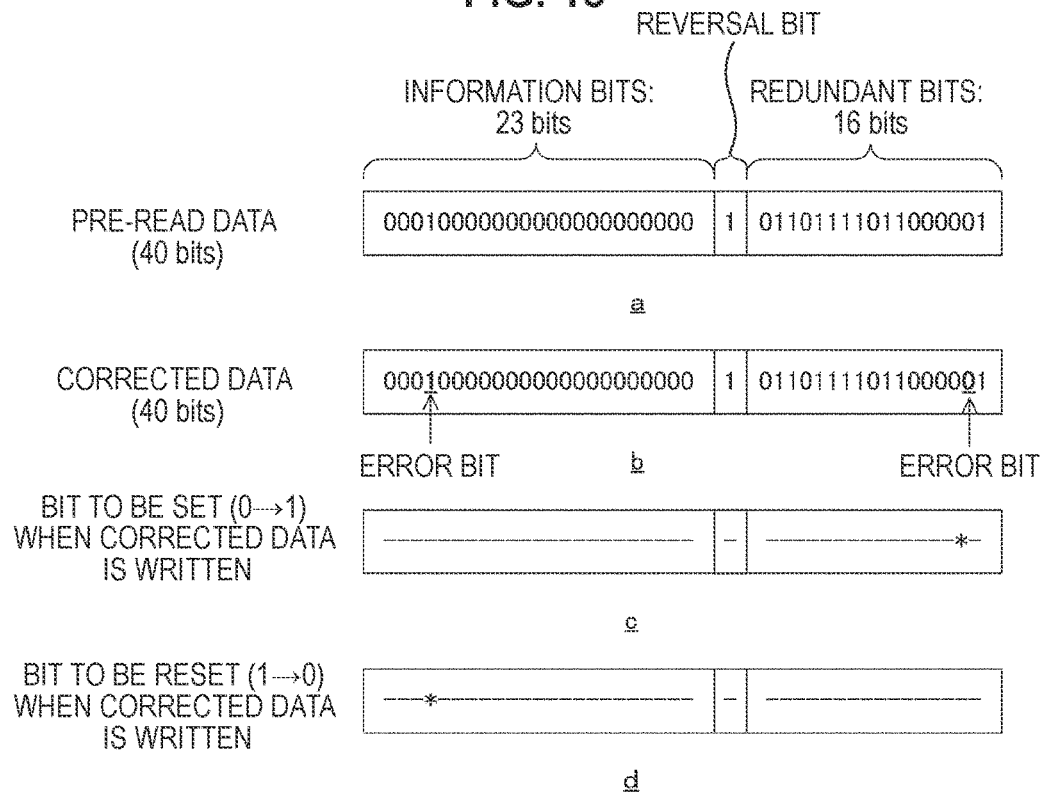
FIG. 18 is a diagram illustrating an example of corrected data generated through a refresh process according to the second embodiment.

FIG. 18 is a diagram showing an example of corrected data generated through the refresh process according to the second embodiment. a of the drawing shows an example of pre-read data from a physical address to be refreshed. b of the drawing is a diagram illustrating an example of corrected data that has the error corrected. For example, a fourth bit from the head of information bits and a second bit from the tail of redundant bits in the pre-read data are detected as error bits and corrected as in the first embodiment.

c of FIG. 18 is a diagram illustrating a position of a bit set when the corrected data is written. In c of the drawing, "*" represents a position of a bit on which the set process is performed, and "-" represents positions of bits on which the set process is not performed. The second bit from the tail of the redundant bits in the pre-read data of a of the drawing is "0," and when the bit is corrected to "1," the non-volatile memory 400 sets the second bit from the tail of the redundant bits to "1." d of the drawing is a diagram illustrating a position of a bit reset when the corrected data is written. In d of the drawing, "*" represents a position of a bit on which the reset process is performed, and "-" represents positions of bits on which the reset process is not performed. The fourth bit from the head of the information bits in the pre-read data of a of the drawing is "1," and when the bit is corrected to "0," the non-volatile memory 400 resets the fourth bit from the head of the information bits to "0."

Figure 19:
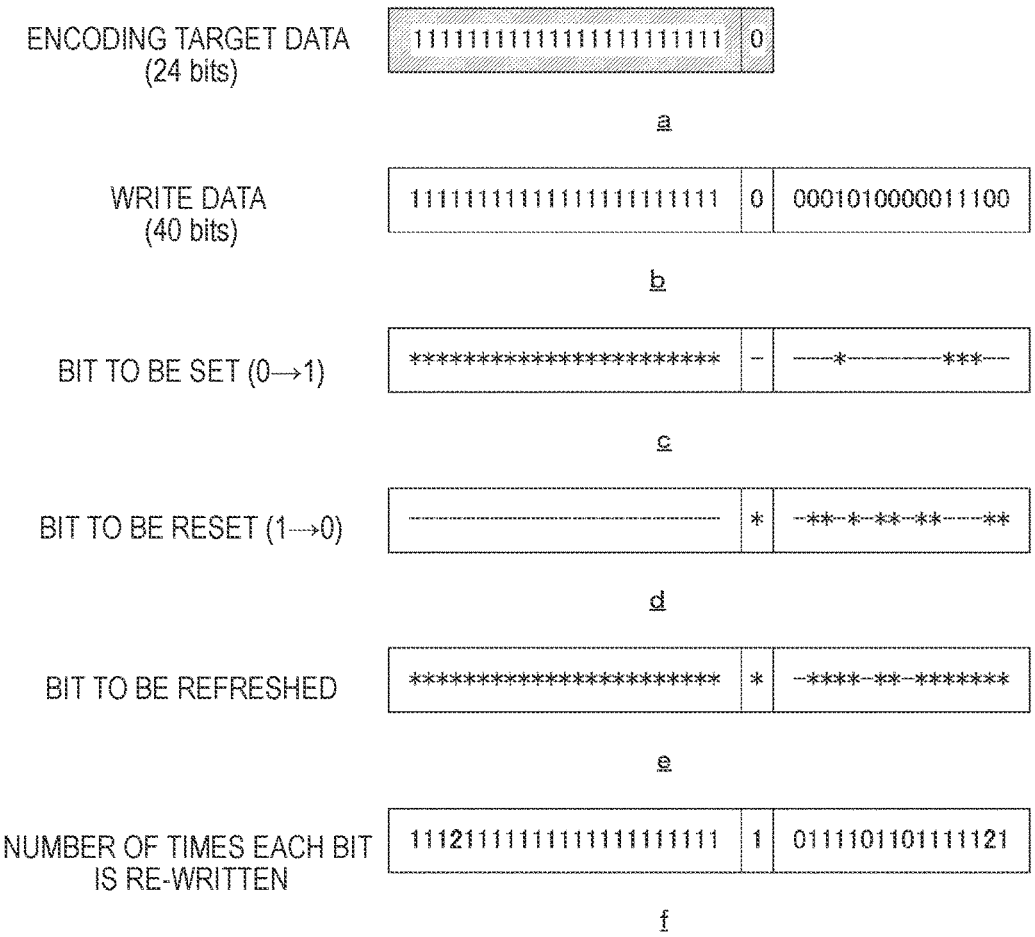
FIG. 19 is a diagram illustrating an example of write data generated through the refresh process according to the second embodiment.

FIG. 19 is a diagram illustrating an example of write data generated through the refresh process according to the second embodiment. a of the drawing is a diagram illustrating an example of encoding target data. 24-bit encoding target data is generated as in the first embodiment. b of the drawing is a diagram illustrating an example of the write data. As in the first embodiment, 40-bit code words are generated as the write data.

c of FIG. 19 is a diagram illustrating positions of bits set when the write data is written. In c of the drawing, "*" represents positions of bits on which the set process is performed and "-" represents positions of bits on which the set process is not performed. When the corrected data is written, the non-volatile memory 400 resets the fourth bit from the head of the information bits to "0," and the bit is set to "1" when the write data is written. d of the drawing is a diagram illustrating positions of bits reset when the write data is written. In d of the drawing, "*" represents positions of bits on which a reset process is performed and "-" represents positions of bits on which the reset process is not performed. When the corrected data is written, the non-volatile memory 400 sets the second bit from the tail of the redundant bits to "1," and the bit is reset to "0" when the write data is written.

e of FIG. 19 is a diagram illustrating positions of bits to be refreshed. In e of the drawing, "*" represents positions of bits to be refreshed and "-" represents positions of bits not to be refreshed. Since the memory controller 300 refreshes bits that have the error corrected, all information bits are refreshed. f of the drawing is a diagram illustrating the number of times each bit is re-written. Since a corrected value is written in a memory cell of the fourth bit from the head of the information bits and a value obtained by additionally reversing the corrected value is written therein, re-writing is performed twice. Memory cells corresponding to the other information bits undergo re-writing once.

According to the second embodiment of the present technology as described above, the memory controller 300 performs writing of corrected data before writing write data, and thus re-writing is also performed on a memory cell that has an error detected in addition to memory cells that have no errors. Accordingly, a frequency of error occurrence can be further reduced.

3. Third Embodiment

The memory controller 300 according to the first embodiment encodes information bits and a reversal bit, but may only encode information bits. A memory controller 300 according to a third embodiment is different from that of the first embodiment in that the memory controller encodes only information bits.

Figure 20:
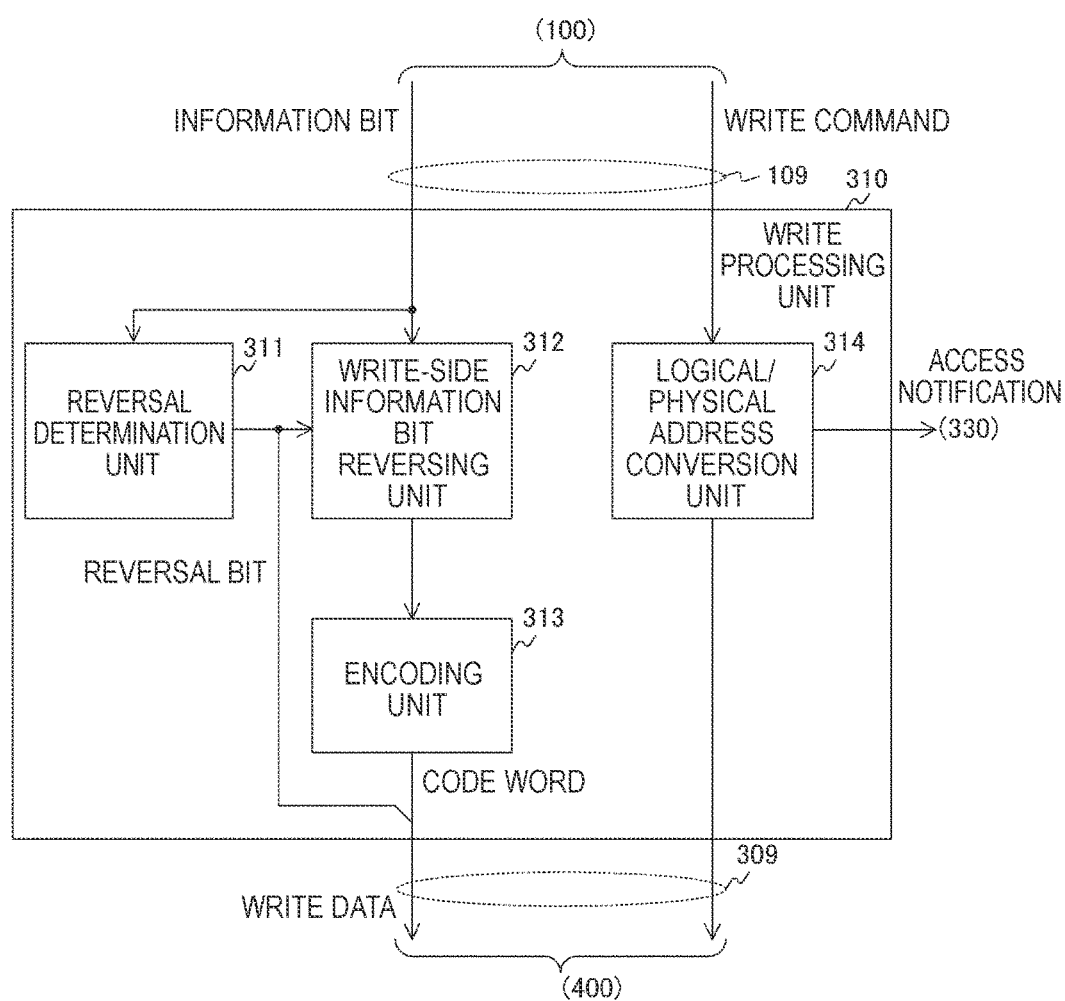
FIG. 20 is a block diagram illustrating an example of a configuration of a write processing unit according to the third embodiment.

FIG. 20 is a block diagram illustrating an example of a configuration of a write processing unit 310 according to the third embodiment. A reversal determination unit 311 according to the third embodiment does not supply a reversal bit to an encoding unit 313, but supplies the reversal bit to a write-side information bit reversing unit 312 and a non-volatile memory 400. In addition, the encoding unit 313 according to an embodiment of the third embodiment encodes only information bits into code words. As a result, the code words and a reversal bit are supplied to the non-volatile memory 400 as write data.

Figure 21:
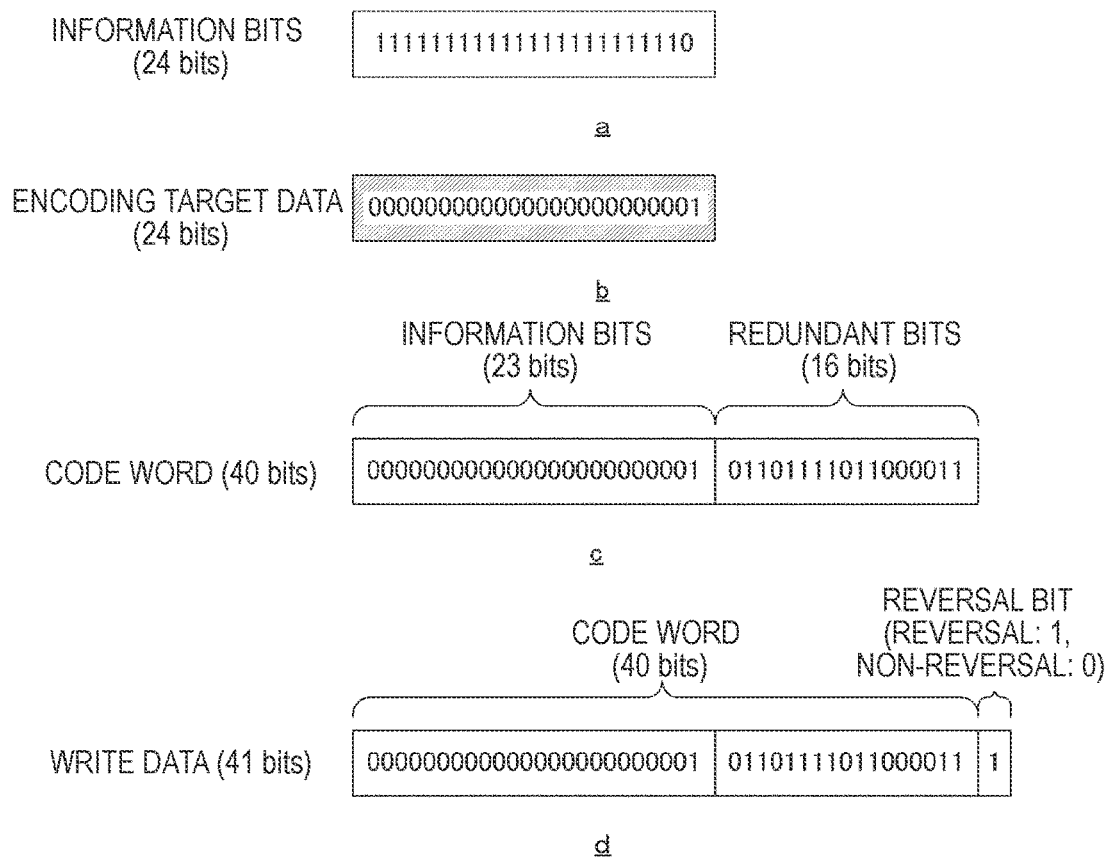
FIG. 21 is a diagram illustrating an example of data generated through a write process according to the third embodiment.

FIG. 21 is a diagram illustrating an example of data generated through a write process according to the third embodiment. a of the drawing is an example of information bits to be encoded. The write processing unit 310 encodes information bits in, for example, units of 24 bits. b of the drawing is an example of encoding target data. The write processing unit 310 reverses, for example, the 24-bit information bits and sets the reversed information bits as encoding target data when necessary. c of the drawing is an example of code words. The write processing unit 310 generates, for example, 16-bit redundant bits from the 24-bit encoding target data and then generates 40-bit code words including the 16-bit redundant bits. d of the drawing is an example of write data. The write processing unit 310 writes, for example, 41-bit data including the 40-bit code words and a reversal bit onto the non-volatile memory 400 as write data.

Figure 22:
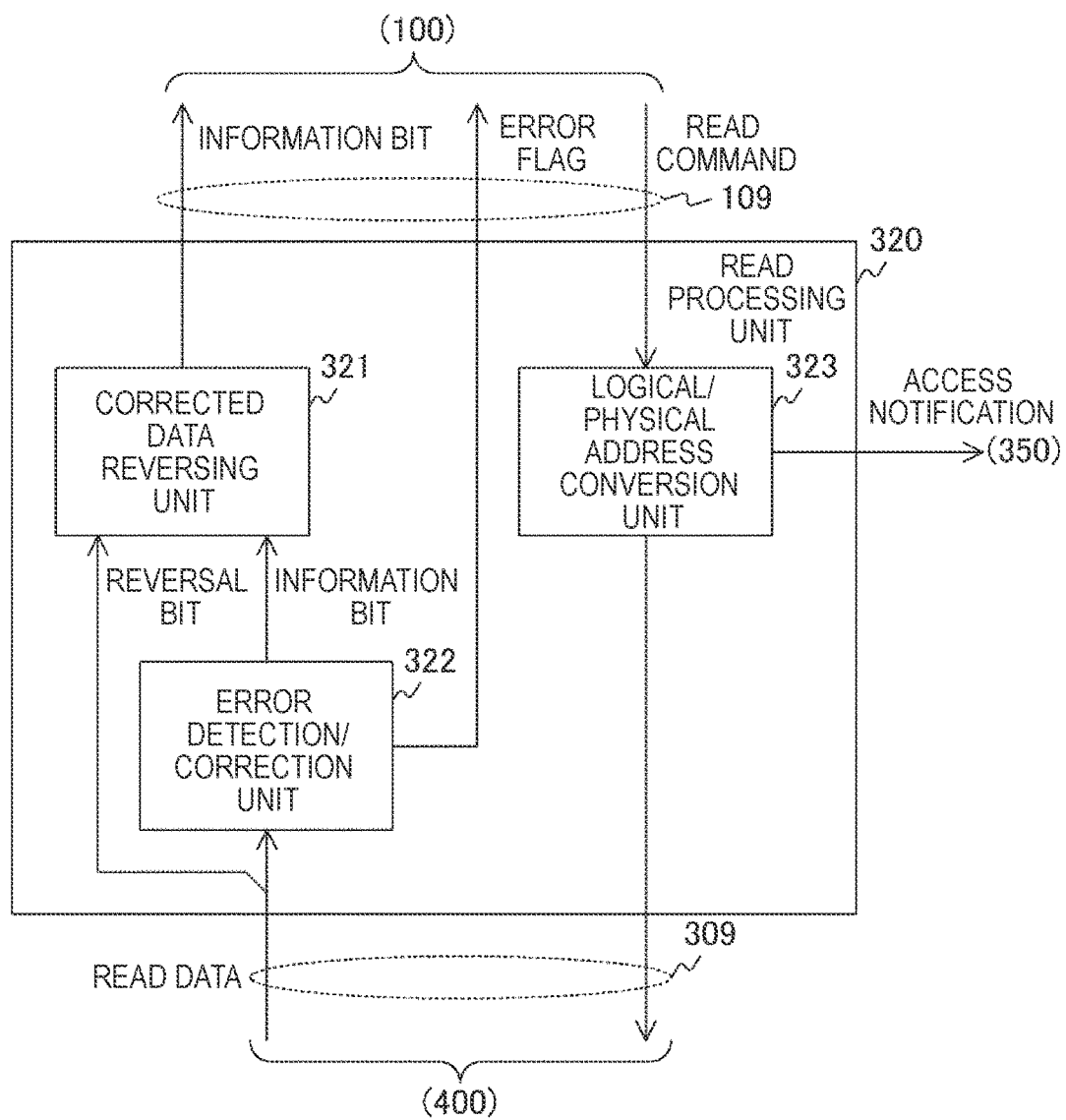
FIG. 22 is a block diagram illustrating an example of a configuration of a read processing unit according to the third embodiment.

FIG. 22 is a block diagram illustrating an example of a configuration of a read processing unit 320 according to the third embodiment. An error detection/correction unit 322 according to the third embodiment decodes received words from read data including the received words and a reversal bit into original information bits. In addition, a corrected data reversing unit 321 according to the third embodiment reverses the information bits according to the reversal bit of the read data.

Figure 23:
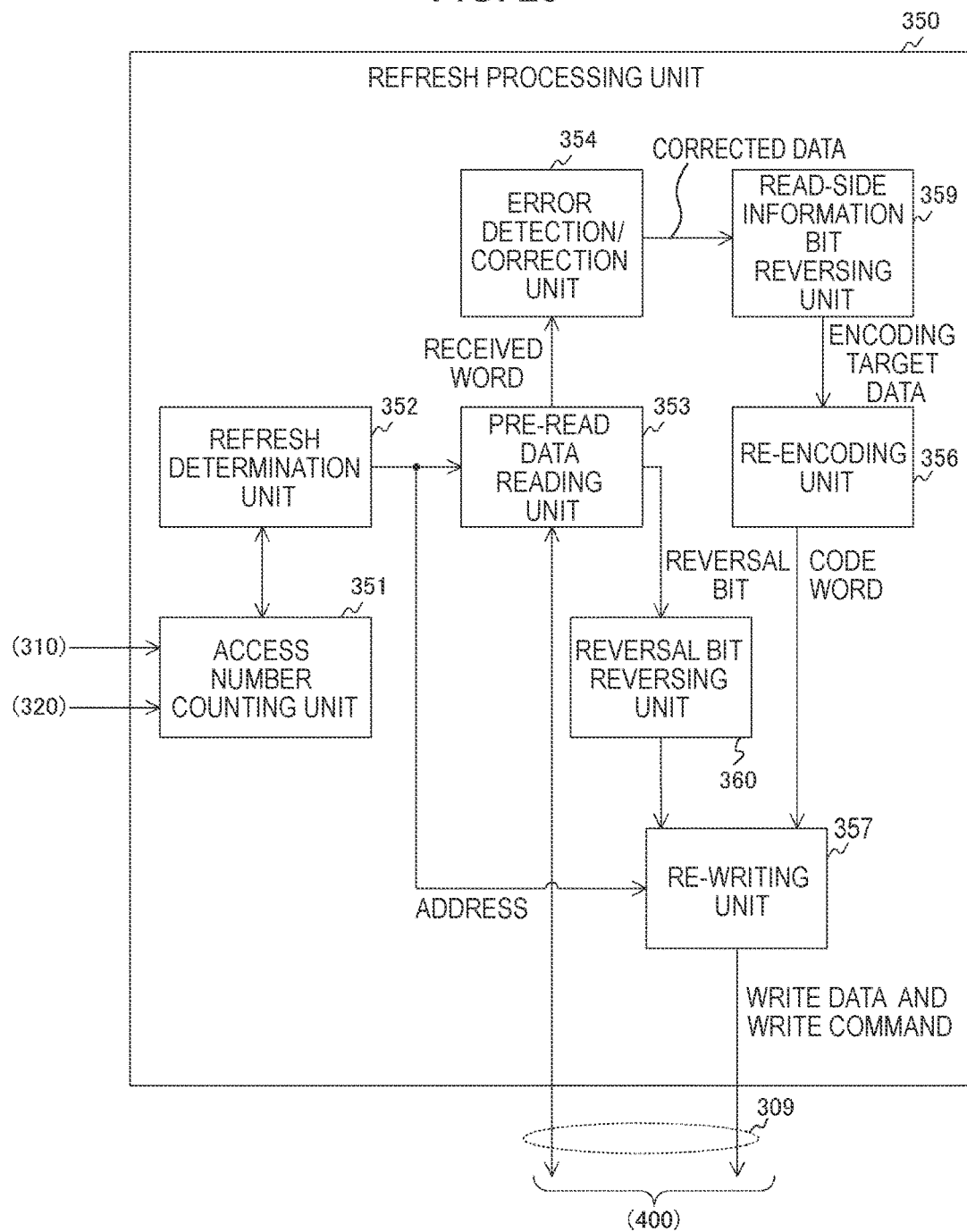
FIG. 23 is a block diagram illustrating an example of a configuration of a refresh processing unit according to the third embodiment.

FIG. 23 is a block diagram illustrating an example of a configuration of a refresh processing unit 350 according to the third embodiment. The refresh processing unit 350 according to the third embodiment is different from that of the first embodiment in that a read-side information bit reversing unit 359 and a reversal bit reversing unit 360 are provided instead of the corrected data reversing unit 355.

The read-side information bit reversing unit 359 receives corrected information bits from an error detection/correction unit 354 and reverses the information bits and then supplies the reversed information bits to a re-encoding unit 356 as encoding target data.

The reversal bit reversing unit 360 receives a reversal bit from a pre-read data reading unit 353, reverses the reversal bit, and supplies the reversed reversal bit to a re-writing unit 357.

In addition, the pre-read data reading unit 353 according to the third embodiment supplies received words included in pre-read data to the error detection/correction unit 354 and supplies a reversal bit included in the pre-read data to the reversal bit reversing unit 360. The re-writing unit 357 according to the third embodiment writes data including the reversed reversal bit and code words in the non-volatile memory 400 as write data.

Figure 24:
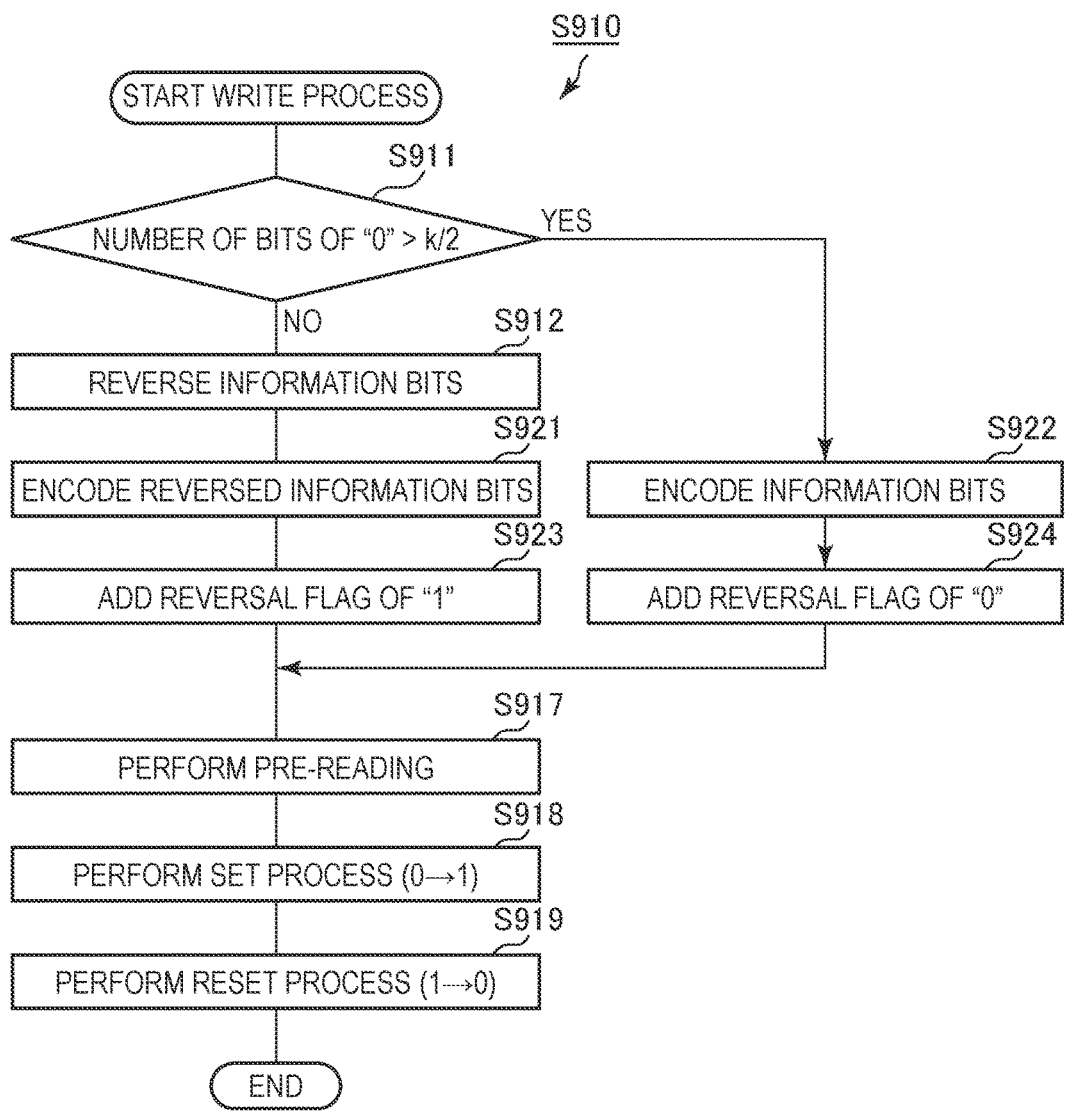
FIG. 24 is a flowchart showing an example of the write process according to the third embodiment.

FIG. 24 is a flowchart showing an example of a write process according to the third embodiment. The write process according to the third embodiment is different from that of the first embodiment in that Steps S921 to S924 are executed instead of Steps S913 to S916.

When the number of bits of "0" is equal to or smaller than k/2 (No in Step S911), the memory controller 300 reverses information bits (Step S912) and encodes the reversed information bits (Step S921). Then, the memory controller 300 adds a reversal flag "1" to codes words and supplies the code words to the non-volatile memory 400 (Step S923).

On the other hand, when the number of bits of "0" is greater than k/2 (Yes in Step S911), the memory controller 300 encodes the information bits (Step S922), adds a reversal flag "0" to the code words, and supplies the code words to the non-volatile memory 400 (Step S924).

Figure 25:
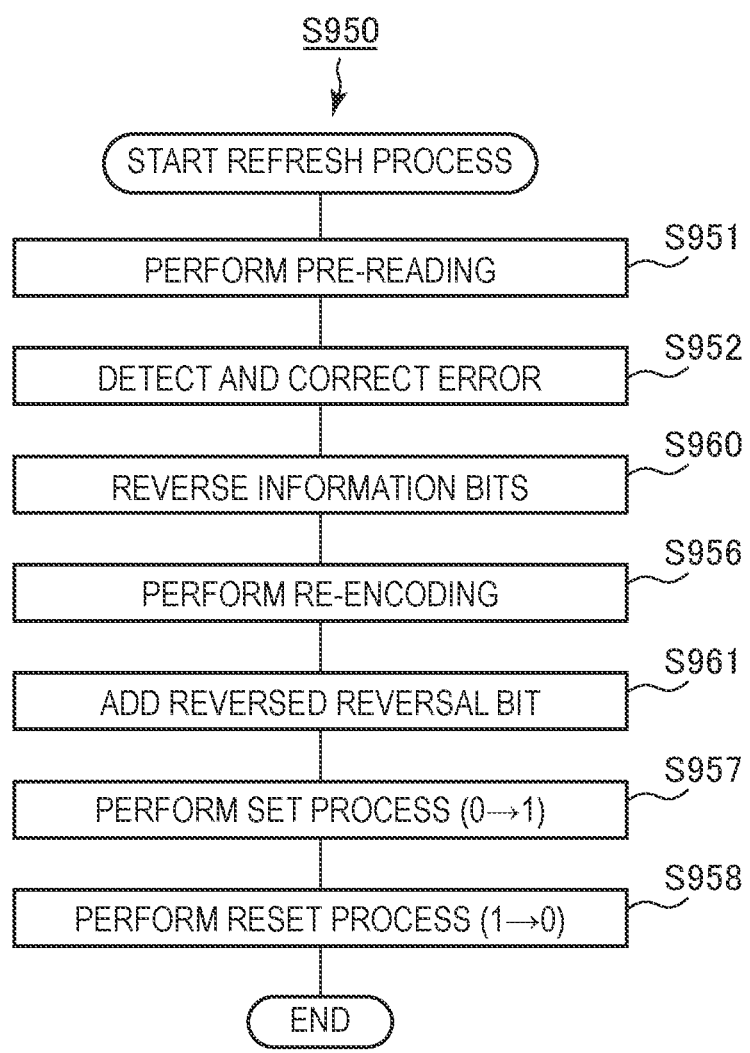
FIG. 25 is a flowchart showing an example of the refresh process according to the third embodiment.

FIG. 25 is a flowchart showing an example of a refresh process according to the third embodiment. The refresh process according to the third embodiment is different from that of the first embodiment in that Steps S960 and S961 are executed instead of Step S955.

The memory controller 300 detects and corrects an error (Step S952), then reverses the information bits (Step S960) and re-encodes the reversed information bits (Step S956). Then, the memory controller 300 adds a reversed reversal bit to the code words and supplies the code words to the non-volatile memory 400 as write data (Step S961).

Figure 26:
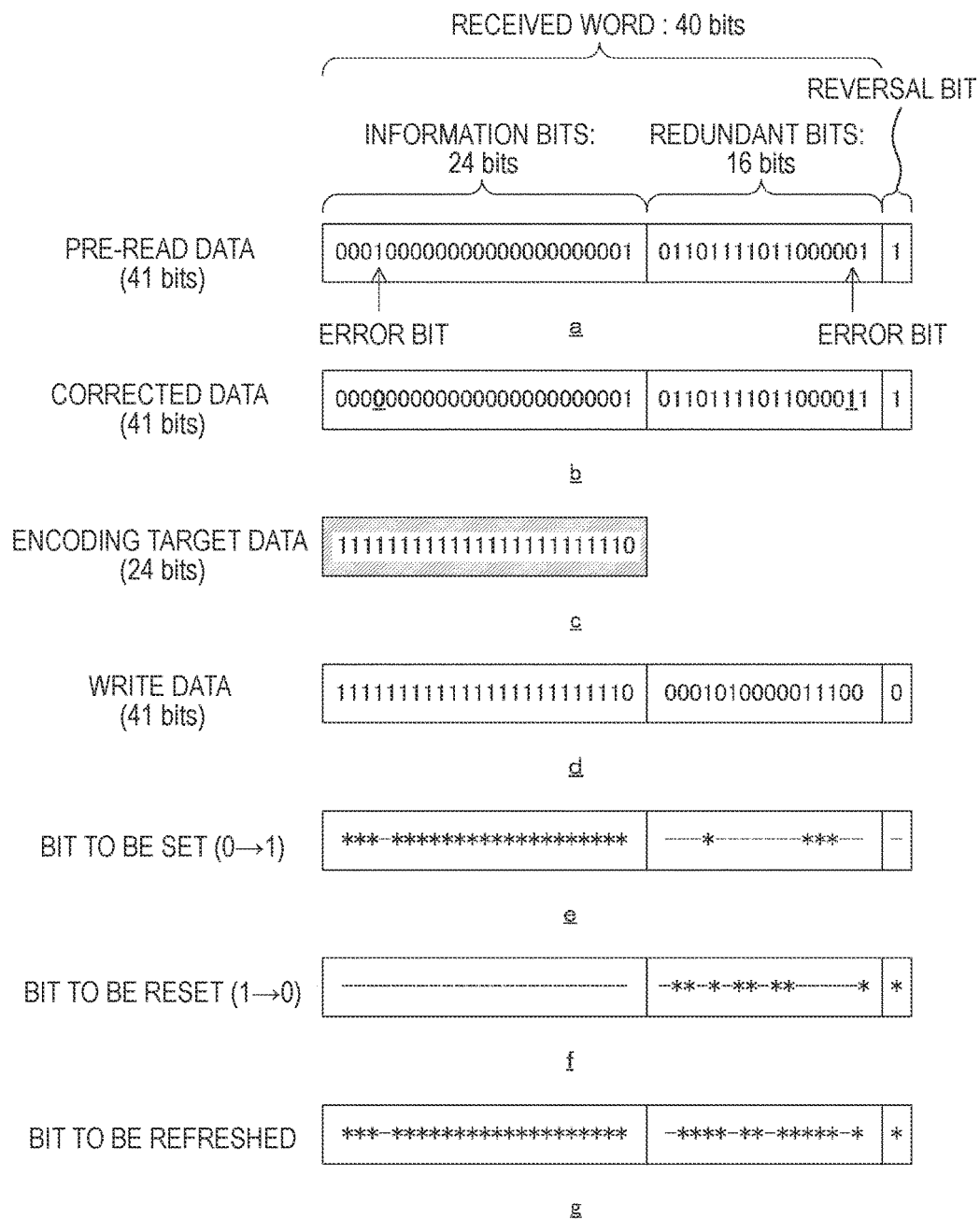
FIG. 26 is a diagram illustrating an example of data generated through a refresh process according to the third embodiment.

FIG. 26 is a diagram illustrating an example of data generated through the refresh process according to the third embodiment. a of the drawing is an example of pre-read data from a physical address to be refreshed. The refresh processing unit 350 reads, for example, 41-bit pre-read data including 40-bit received words and a reversal bit. b of the drawing is a diagram illustrating an example of corrected data that has the error corrected. The refresh processing unit 350 detects, for example, a fourth bit from the head of information bits and a second bit from the tail of redundant bits included in the pre-read data as error bits and corrects values thereof.

In addition, c of FIG. 26 is a diagram illustrating an example of encoding target data. The refresh processing unit 350 reverses corrected 24-bit information bits to generate 24-bit encoding target data. d of the drawing is a diagram illustrating an example of write data. The refresh processing unit 350 generates, for example, 40-bit code words from the 24-bit encoding target data and supplies 41-bit write data including the code words and the reversal bit to the non-volatile memory 400.

e of FIG. 26 is a diagram illustrating positions of bits to be set. In e of the drawing, "*" represents positions of bits on which the set process is performed and "-" represents positions of bits on which the set process is not performed. f of the drawing is a diagram illustrating positions of bits to be reset. In f of the drawing, "*" represents positions of bits on which the reset process is performed, and "-" represents positions of bits on which the reset process is not performed. g of the drawing is a diagram illustrating positions of bits to be refreshed. In g of the drawing, "*" represents positions of bits to be refreshed, and "-" represents positions of bits not to be refreshed.

According to the third embodiment described above, the memory controller 300 encodes only information bits, and thus it is not necessary to insert a reversal bit into a codes word.

4. Fourth Embodiment

The memory controller 300 according to the third embodiment does not refresh memory cells with an error occurred, and refreshes only memory cells that have no errors. However, it is desirable to perform refreshing even on memory cells with an error occurred. A memory controller 300 according to a fourth embodiment is different from that of the third embodiment in that memory cells with an error occurred are also refreshed.

Figure 27:
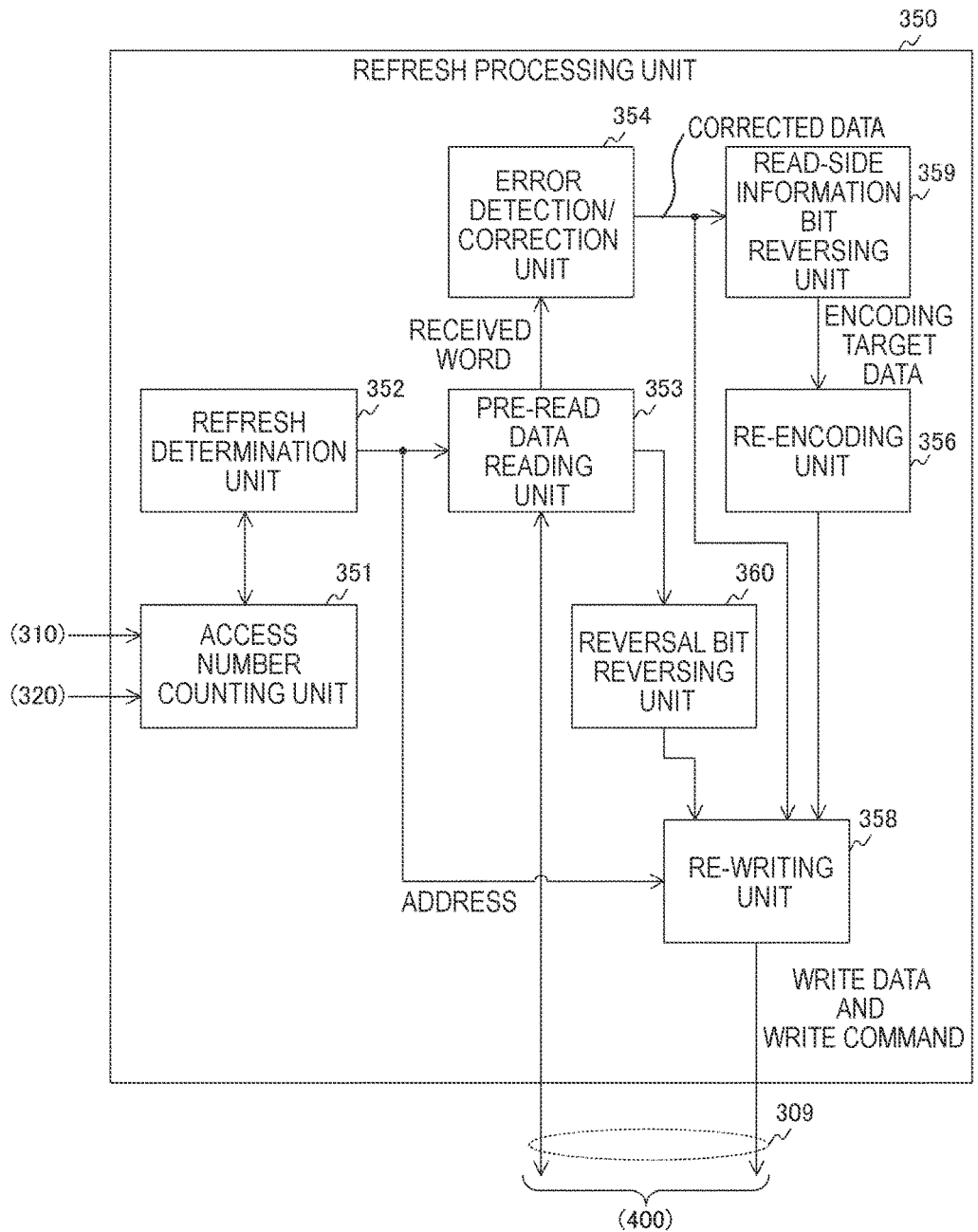
FIG. 27 is a block diagram illustrating an example of a configuration of a refresh processing unit according to the fourth embodiment.

FIG. 27 is a block diagram illustrating an example of a configuration of a refresh processing unit 350 according to the fourth embodiment. The refresh processing unit 350 according to the fourth embodiment is different from that of the third embodiment in that a re-writing unit 358 is provided instead of the re-writing unit 357. In addition, an error detection/correction unit 354 according to the fourth embodiment supplies corrected data to the re-writing unit 358 in addition to a read-side information bit reversing unit 359. A configuration of the re-writing unit 358 is similar to that of the second embodiment.

Figure 28:
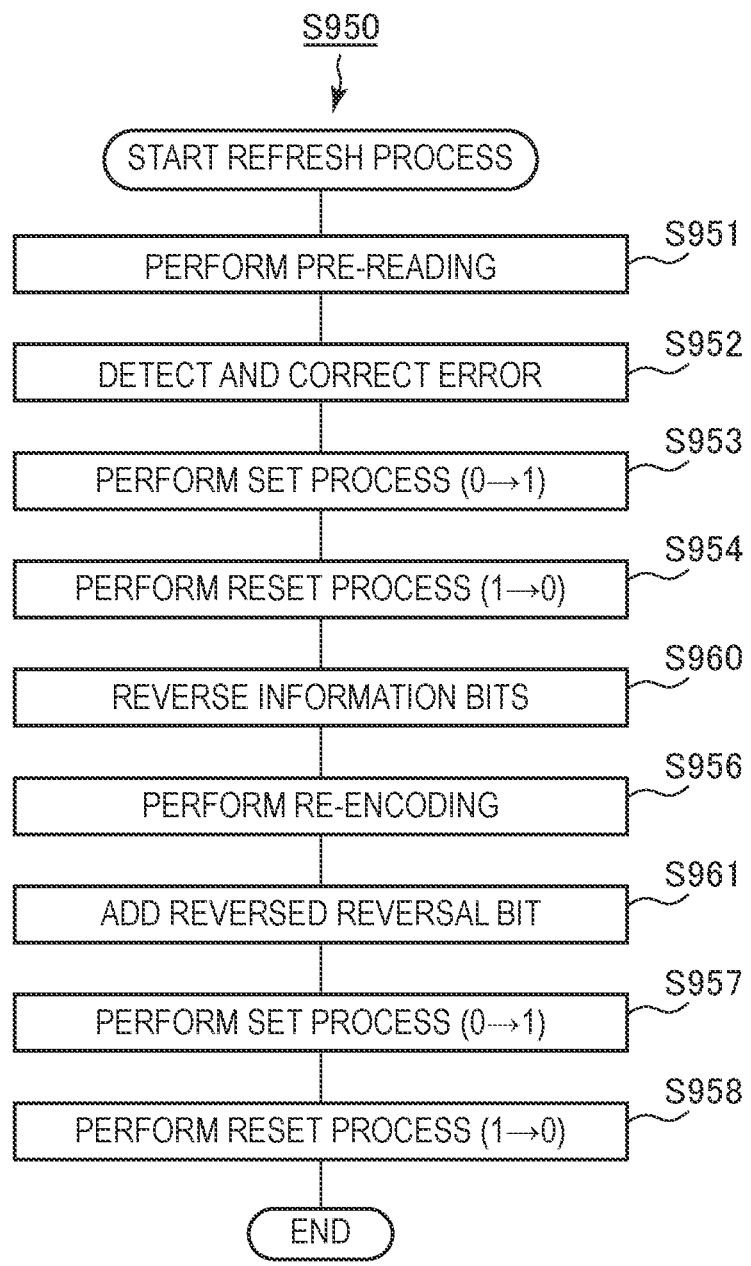
FIG. 28 is a flowchart showing an example of the refresh process according to the fourth embodiment.

FIG. 28 is a flowchart showing an example of a refresh process according to the fourth embodiment. The refresh process according to the fourth embodiment is different from that of the third embodiment in that Steps S953 and S954 are additionally executed.

Figure 29:
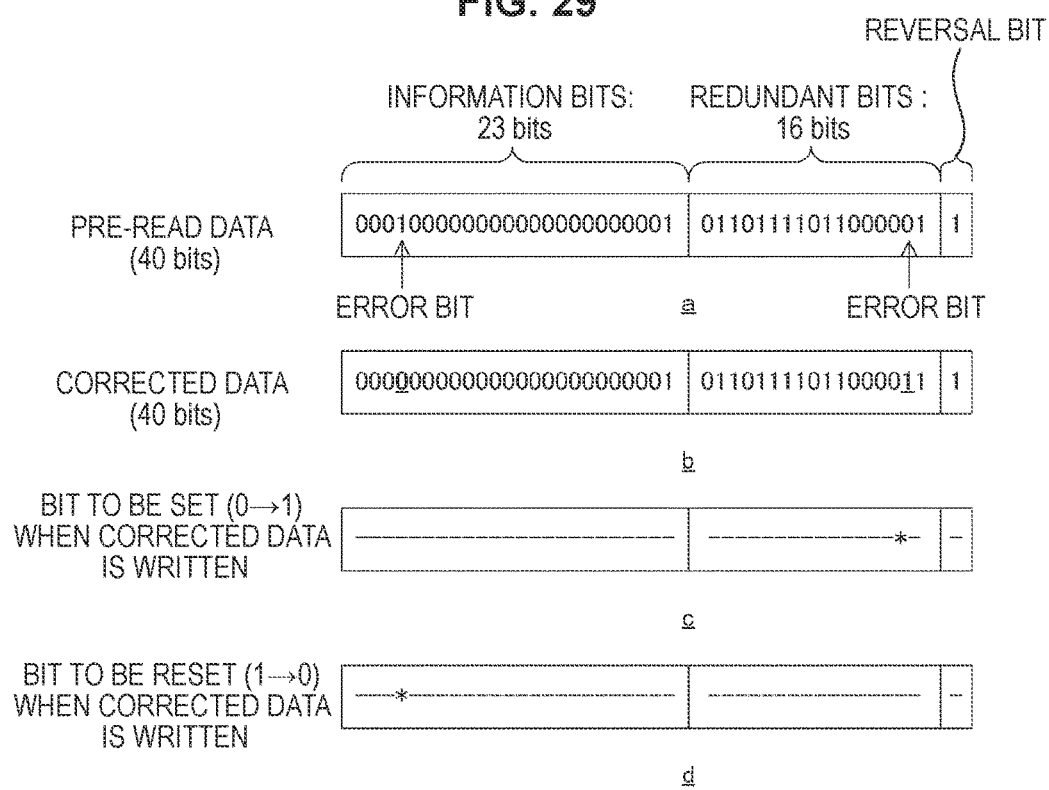
FIG. 29 is a diagram illustrating an example of corrected data generated through a refresh process according to the fourth embodiment.

FIG. 29 is a diagram illustrating an example of corrected data generated through the refresh process according to the fourth embodiment. a of the drawing is an example of pre-read data from a physical address to be refreshed. b of the drawing is a diagram illustrating corrected data that has the errors corrected. For example, a fourth bit from the head of the information bits included in the pre-read data and a second bit from the tail of the redundant bits are detected as error bits and corrected as in the third embodiment.

c of FIG. 29 is a diagram illustrating a position of a bit to be set when the corrected data is written. In c of the drawing, "*" represents the position of a bit on which the set process is performed and "-" represents positions of bits on which the set process is not performed. When a second bit from the tail of redundant bits included in the pre-read data of a of the drawing is "0" and a bit thereof is corrected to "1," the non-volatile memory 400 sets the second bit from the tail of the redundant bit to "1." d of the drawing is a diagram illustrating a position of a bit to be reset when the corrected data is written. In d of the drawing, "*" represents a position of a bit on which the reset process is performed and "-" represents positions of bits on which the reset process is not performed. When a fourth bit from the head of information bits included in the pre-read data of a of the drawing is "1" and a bit thereof is corrected to "0," the non-volatile memory 400 resets the fourth bit from the head of the information bits to "0."

FIG. 30 is a diagram illustrating an example of write data generated through the refresh process according to the fourth embodiment. a of the drawing is a diagram illustrating an example of encoding target data. 24-bit encoding target data is generated as in the third embodiment. b of the drawing is a diagram illustrating an example of write data. 41-bit code words are generated as write data as in the third embodiment.

c of FIG. 30 is a diagram illustrating positions of bits to be set when the write data is written. In c of the drawing, "*" represents positions of bits on which the set process is performed and "-" represents positions of bits on which the set process is not performed. Since the non-volatile memory 400 reset the fourth bit from the head of the information bits to "0" when the corrected data is written, the bit is set to "1" when the write data is written. d of the drawing is a diagram illustrating positions of bits to be reset when the write data is written. In d of the drawing, "*" represents positions of bits on which the reset process is performed and "-" represents positions of bits on which the reset process is not performed. Since the non-volatile memory 400 set the second bit from the tail of the redundant bits to "1" when the corrected data is written, the bit is reset to "0" when the write data is written.

e of FIG. 30 is a diagram illustrating positions of bits to be refreshed. In e of the drawing, "*" represents positions of bits to be refreshed and "-" represents positions of bits not to be refreshed. Since the memory controller 300 refreshes bits that have the error corrected, all of the information bits are refreshed. f of the drawing is a diagram illustrating the number of times bits are re-written. With regard to a memory cell of a second bit from the head of the information bits, a corrected value is written and then a value obtained by further reversing the corrected value is written, and thus re-writing is performed twice. The memory cells corresponding to other information bits undergo re-writing once.

According to the fourth embodiment of the present technology described above, since the memory controller 300 performs writing of corrected data before writing of write data, re-writing can be performed on memory cells that have error detected as well as memory cells with no error. Accordingly, a frequency or error occurrence can be further reduced.

5. Fifth Embodiment

The memory controller 300 according to the first embodiment supplies write data including a reversal bit to the non-volatile memory 400, however, write data including no reversal bit may be supplied. A memory controller 300 according to a fifth embodiment is different from that of the first embodiment in that write data including no reversal bit is supplied to the non-volatile memory 400.

Figure 31:
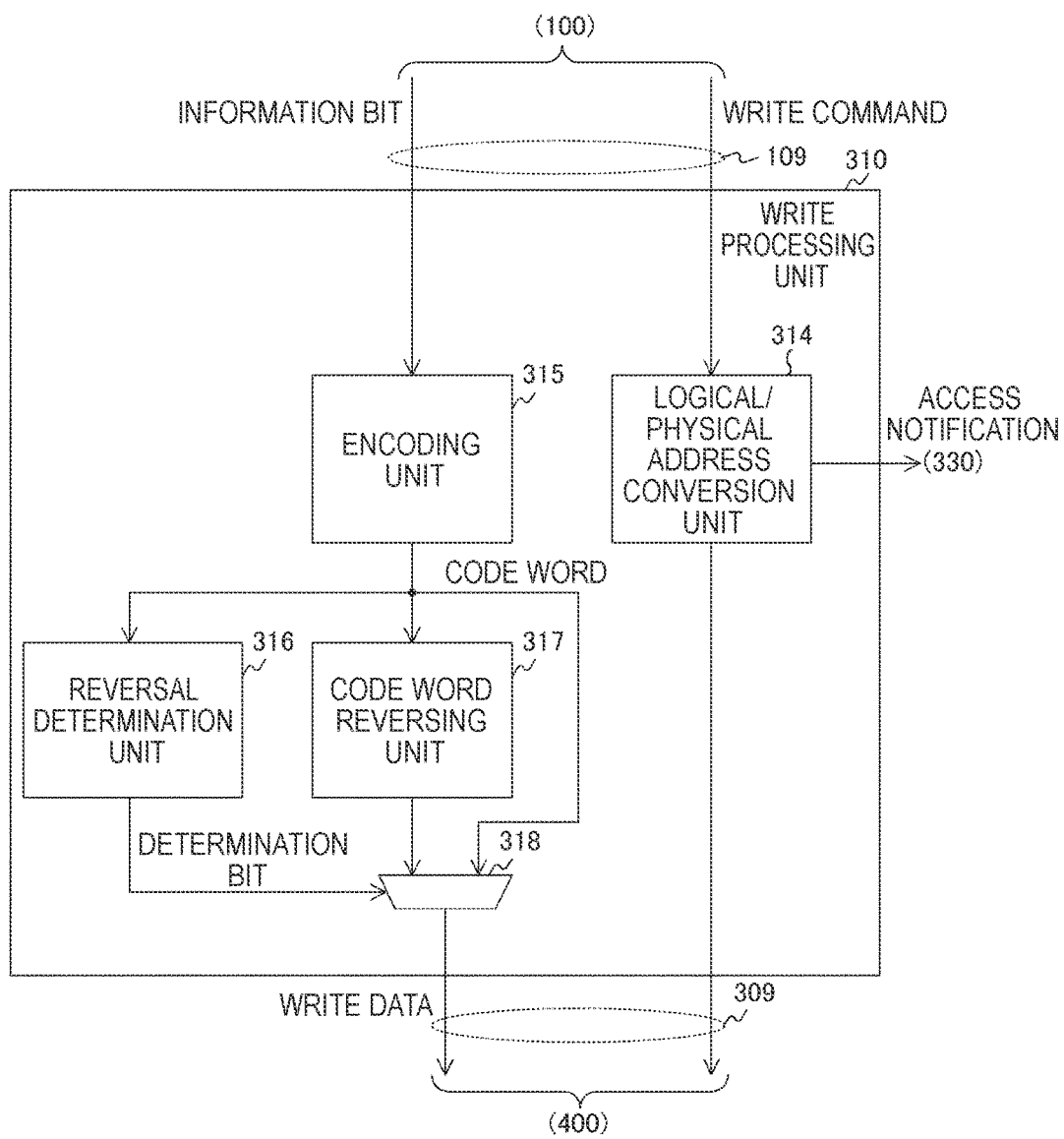
FIG. 31 is a block diagram illustrating an example of a configuration of a write processing unit according to the fifth embodiment.

FIG. 31 is a block diagram illustrating an example of a configuration of a write processing unit 310 according to the fifth embodiment. The write processing unit 310 according to the fifth embodiment is different from that of the first embodiment in that an encoding unit 315, a reversal determination unit 316, a code word reversing unit 317, and a selector 318 are provided instead of the reversal determination unit 311, the write-side information bit reversing unit 312, and the encoding unit 313.

The encoding unit 315 encodes information bits into code words. The encoding unit 315 supplies the code words to the reversal determination unit 316, the code word reversing unit 317, and the selector 318.

The reversal determination unit 316 reverses whether or not the code words is to be reversed. The reversal determination unit 316 determines, for example, whether or not bits of a specific value (for example, "0") of the code words are multiple bits of which the number is greater than half of the total number of bits n of the code words. Then, if the bits of "0" are multiple bits, the reversal determination unit 316 generates a determination bit indicating that no reversal is performed, and otherwise generates a determination bit indicating that reversal is performed.

The code word reversing unit 317 reverses the code words. The code word reversing unit 317 supplies the reversed code words to the selector 318.

The selector 318 selects one of the reversed code words and non-reversed code words according to the determination bit. The selector 318 supplies data of the selected one of the reversed code words and non-reversed code words to the non-volatile memory 400 as write data.

Figure 32:
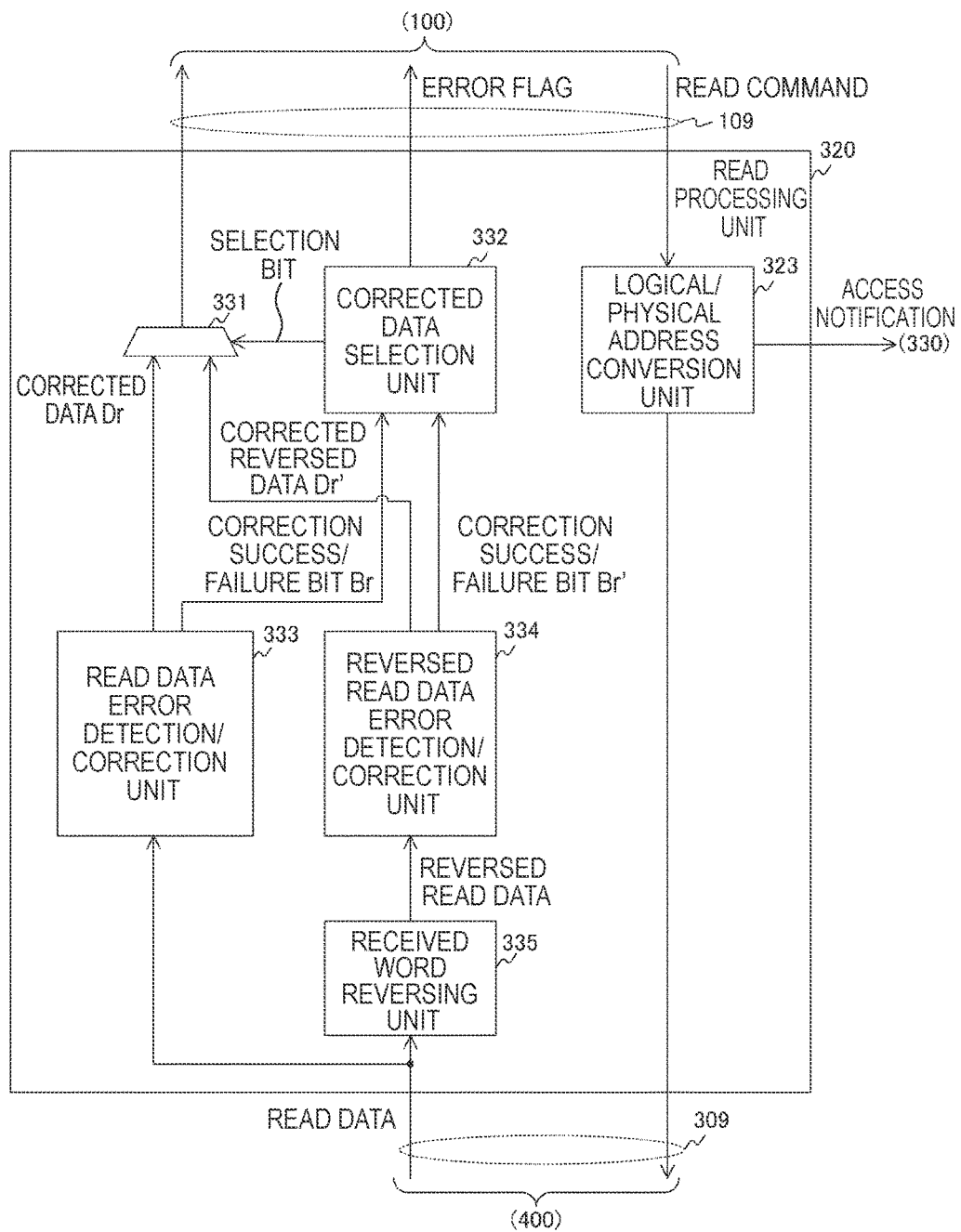
FIG. 32 is a block diagram illustrating an example of a configuration of a read processing unit according to the fifth embodiment.

FIG. 32 is a block diagram illustrating an example of a configuration of a read processing unit 320 according to the fifth embodiment. The read processing unit 320 according to the fifth embodiment is not provided with a corrected data reversing unit 321 and an error detection/correction unit 322. The read processing unit 320 includes a selector 331, a corrected data selection unit 332, a read data error detection/correction unit 333, a reversed read data error detection/correction unit 334, and a received word reversing unit 335 instead of the aforementioned units.

The received word reversing unit 335 reverses received words read from the non-volatile memory 400 as read data. The received word reversing unit 335 supplies the reversed received words to the reversed read data error detection/correction unit 334 as reversed read data.

The read data error detection/correction unit 333 performs error detection and error correction for the read data from the non-volatile memory 400. The read data error detection/correction unit 333 generates a syndrome S by multiplying the received words by a check matrix, obtains a position of an error from the syndrome S, and then corrects the error. The read data error detection/correction unit 333 generates a correction success/failure bit Br indicating whether or not error correction succeeds on the basis of the result of the error detection and error correction. Here, although error correction is not performed when no error is detected, the error correction is assumed to succeed in this case for the sake of convenience in description. For the correction success/failure bit Br, for example, the value "1" is set when the error correction succeeds and the value "0" is set when the error correction fails.

In addition, when the error correction succeeds, the read data error detection/correction unit 333 supplies data obtained by excluding redundant bits from the error-corrected read data to the selector 331 as corrected data Dr. Furthermore, the read data error detection/correction unit 333 generates the correction success/failure bit Br for giving a notification that the error correction succeeds, and supplies the success/failure bit Br to the corrected data selection unit 332.

Here, there is a concern of failure of error correction when the number of errors exceeds a correction capability of an ECC. In this case, the read data error detection/correction unit 333 generates the correction success/failure bit Br for giving a notification that the error correction fails and supplies the correction success/failure bit Br to the corrected data selection unit 332. Note that the read data error detection/correction unit 333 is an example of the error detection/correction unit described in the claims.

The reversed read data error detection/correction unit 334 performs error detection and error correction for the reversed read data. The reversed read data error detection/correction unit 334 generates a syndrome S' by multiplying the reversed read data by a check matrix, obtains a position of an error from the syndrome S', and corrects the error. In addition, the reversed read data error detection/correction unit 334 generates a correction success/failure bit Br' indicating whether or not error correction for the reversed data succeeds.

When the error correction succeeds, the reversed read data error detection/correction unit 334 supplies data obtained by excluding redundant bits from the error-corrected reversed read data to the selector 331 as corrected reversed data Dr'. In addition, the reversed read data error detection/correction unit 334 generates the correction success/failure bit Br' for giving a notification that the error correction succeeds, and supplies the correction success/failure bit Br' to the corrected data selection unit 332.

On the other hand, when the error correction fails, the reversed read data error detection/correction unit 334 generates the correction success/failure bit Br' for giving a notification that the error correction fails and supplies the correction success/failure bit Br' to the corrected data selection unit 332.

When error correction of only one of the read data and the reversed read data succeeds, the corrected data selection unit 332 selects the data whose error correction succeeded. The corrected data selection unit 332 selects the corrected data Dr when the error correction of only the read data succeeds, and selects the corrected reversed data Dr' when the error correction of only the reversed read data succeeds. Then, the corrected data selection unit 332 generates a selection bit indicating the selected data and supplies the selected data to the selector 331, and generates an error flag for giving a notification that no read error has occurred and outputs the error flag to the host computer 100. For the selection bit, for example, the value "0" is set when the corrected data Dr is selected and the value "1" is set when the corrected reversed data Dr' is selected. In addition, for the error flag, the value "0" is set when no read error has occurred and the value "1" is set when a read error has occurred.

In addition, when error correction of both the read data and the revered read data fails, the corrected data selection unit 332 generates an error flag for giving a notification that a read error has occurred and outputs the error flag to the host computer 100.

Furthermore, when error correction of both the read data and the reversed read data succeeds, the corrected data selection unit 332 likewise generates the error flag for giving a notification that a read error has occurred and outputs the error flag to the host computer 100. The reasons for dealing with the read error when error correction of both data succeeds are that there is a concern of at least one of the read data and the reversed read data having a number of errors occurred exceeding the correction capability and that determining which data is correct is difficult.

As described above, in the fifth embodiment, whether information bits have been reversed is determined on the basis of whether or not error correction succeeds and using a redundant bit in cases in which reversal is performed or not performed. Note that the redundant bit is an example of reversal information described in the claims.

The selector 331 outputs one of the corrected data Dr and the corrected reversed data Dr' to the host computer 100 according to the selection bit.

Note that, in a case in which there is a read error, the read processing unit 320 may be configured to output data before correction to the host computer 100. In that case, the read processing unit 320 outputs, for example, at least one of the read data before correction and reversed read data to the host computer 100. Then, the host computer 100, for example, performs error correction on the data using an algorithm having a higher error correction capability than a decoding algorithm used by the memory controller 300. A min-sum algorithm among soft-decision decoding algorithms is used, for example, as a decoding algorithm having a low correction capability. In addition, a brief propagation (BP) algorithm is used, for example, as a decoding algorithm having a high correction capability.

FIG. 33 is a table showing an example of an operation of the corrected data selection unit 332 according to the fifth embodiment. When both of the correction success/failure bits Br and Br' are "0," i.e., correction of both read data and reversed read data fails, the corrected data selection unit 332 generates an error flag "1" indicating that there was a read error. In this case, a selection bit may be any bit of "0" and "1."

In addition, when only the correction success/failure bit Br' is "1," i.e., correction of only the reversed read data succeeds, the corrected data selection unit 332 generates a selection bit of "1" indicting the corrected reversed data Dr'. Further, the corrected data selection unit 332 generates an error flag "0" indicating that there is no read error.

In addition, when only the correction success/failure bit Br is "1," i.e., correction of only the read data succeeds, the corrected data selection unit 332 generates a selection bit of "0" indicating the corrected data Dr. Further, the corrected data selection unit 332 generates an error flag "0" indicating that there is no read error.

In addition, when both of the correction success/failure bits Br and Br' are "1," i.e., correction of both the read data and reversed read data succeeds, the corrected data selection unit 332 generates an error flag "1" indicating that there was a read error. In this case, a selection bit may be any bit of "0" and "1."

Note that, although the memory controller 300 determines a read error when error correction of both the read data and the reversed read data succeeds, the memory controller may output corrected data of one side without determining a read error. For example, when the write processing unit 310 performs writing without reversing and the number of bits of "0" is greater than n/2, data having a greater number of bits of "0" among the corrected data Dr and the corrected reversed data Dr' is highly likely to be correct data. Thus, when error correction of both the corrected data Dr and the corrected reversed data Dr' succeeds, the memory controller 300 may output data having a greater number of bits of a specific value without determining a read error.

In addition, when error correction of both the read data and the reversed read data succeeds, the memory controller 300 may output data having a smaller number of corrected bits between the corrected data Dr and the corrected reversed data Dr'.

Figure 34:
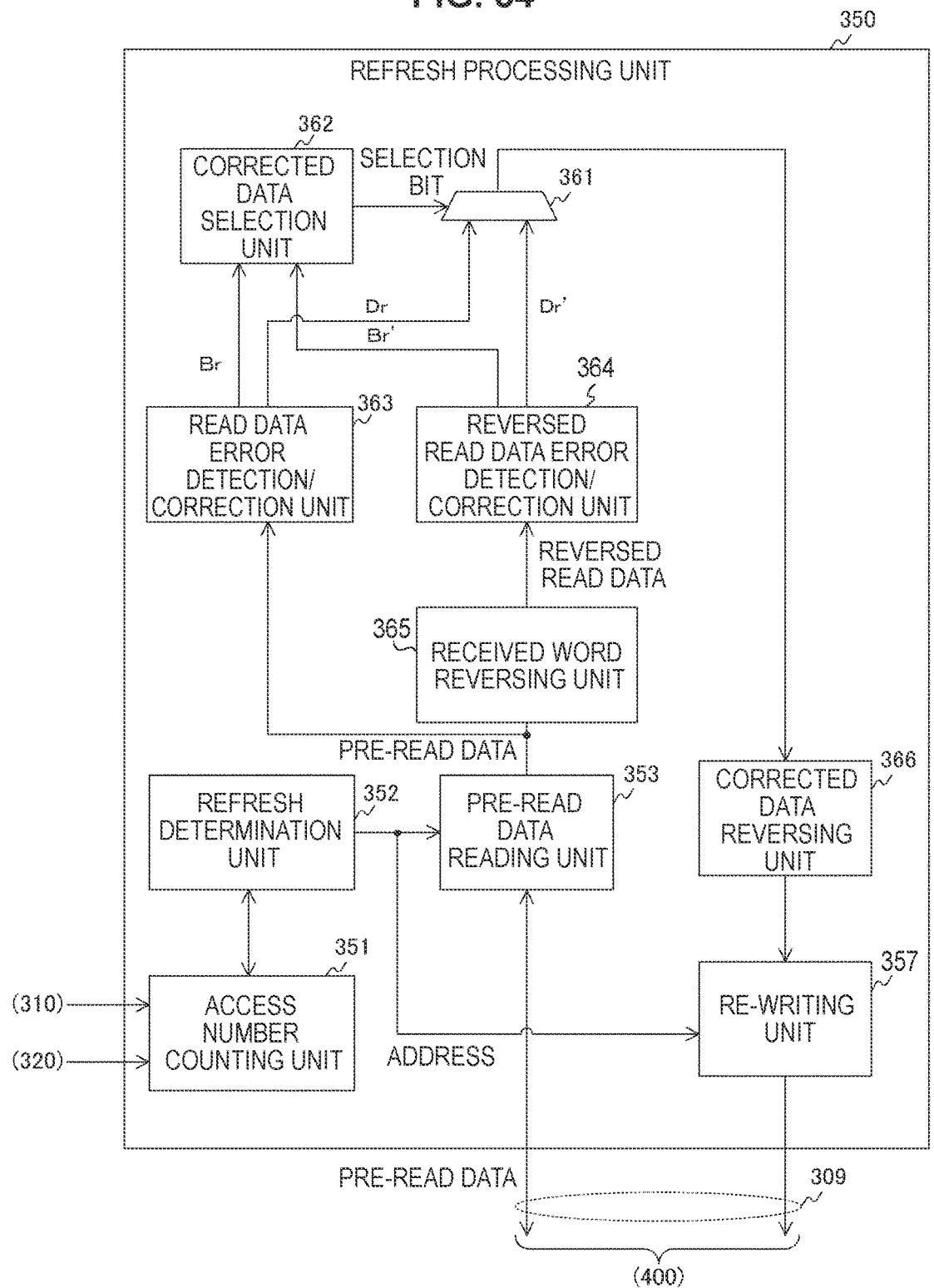
FIG. 34 is a block diagram illustrating an example of a configuration of a refresh processing unit according to the fifth embodiment.

FIG. 34 is a block diagram illustrating an example of a configuration of a refresh processing unit 350 according to the fifth embodiment. The refresh processing unit 350 according to the fifth embodiment includes a selector 361, a corrected data selection unit 362, a read data error detection/correction unit 363, a reversed read data error detection/correction unit 364, and a received word reversing unit 365 instead of the error detection/correction unit 354. In addition, the refresh processing unit 350 according to the fifth embodiment includes a corrected data reversing unit 366 instead of the corrected data reversing unit 355.

Configurations of the selector 361, the corrected data selection unit 362, and the read data error detection/correction unit 363 are similar to the selector 331, the corrected data selection unit 332, and the read data error detection/correction unit 333. In addition, configurations of the reversed read data error detection/correction unit 364 and the received word reversing unit 365 are similar to the reversed read data error detection/correction unit 334 and the received word reversing unit 335.

The corrected data reversing unit 366 reverses data selected by the selector 361 and then supplies the reversed data to the re-writing unit 357.

Figure 35:
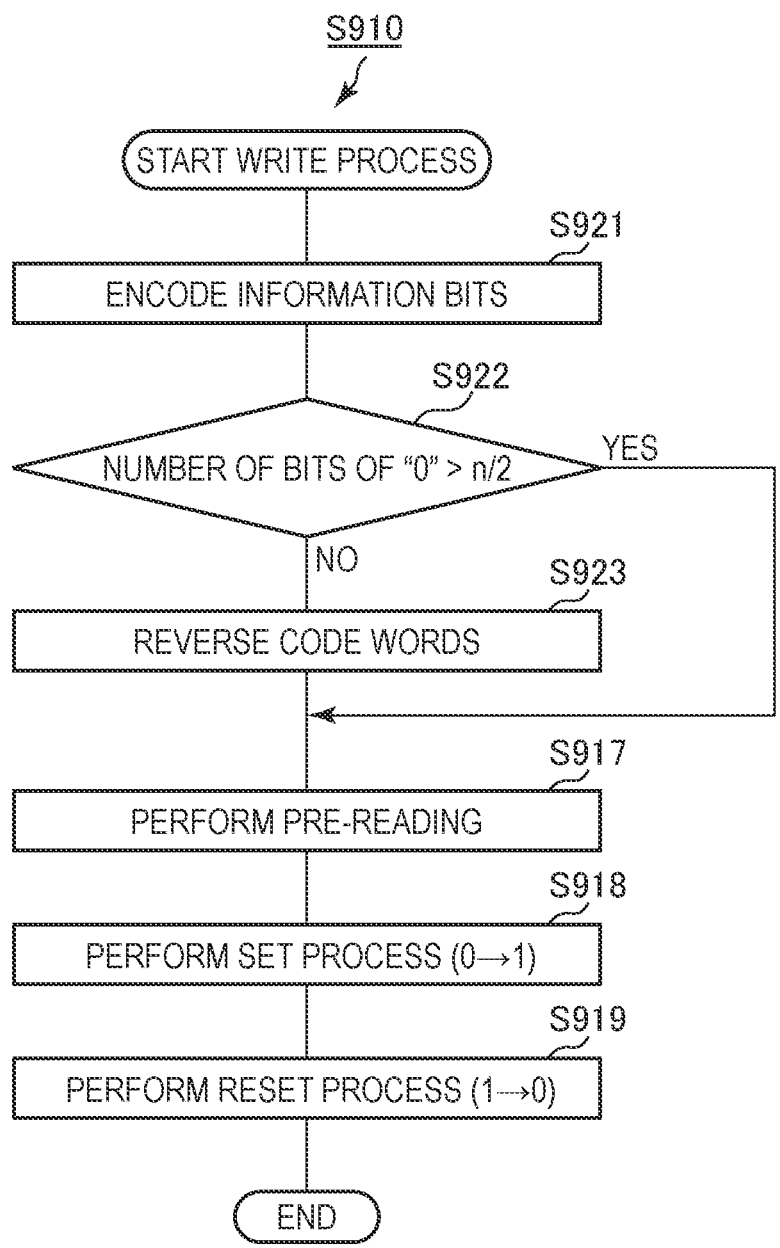
FIG. 35 is a flowchart showing an example of the write process according to the fifth embodiment.

FIG. 35 is a flowchart showing an example of a write process according to the fifth embodiment. The write process according to the fifth embodiment is different from that of the first embodiment in that Steps S921 to S923 are executed instead of Steps S911 to S916.

The memory controller 300 encodes information bits (Step S921) and determines whether or not the number of bits of "0" in code words is greater than n/2 (Step S922). When the number of bits of "0" is equal to or smaller than n/2 (No in Step S922), the memory controller 300 reverses the code words (Step S923). When the number of bits of "0" is greater than n/2 (Yes in Step S922) or after Step S923, the non-volatile memory 400 executes Steps S917 to S919.

Figure 36:
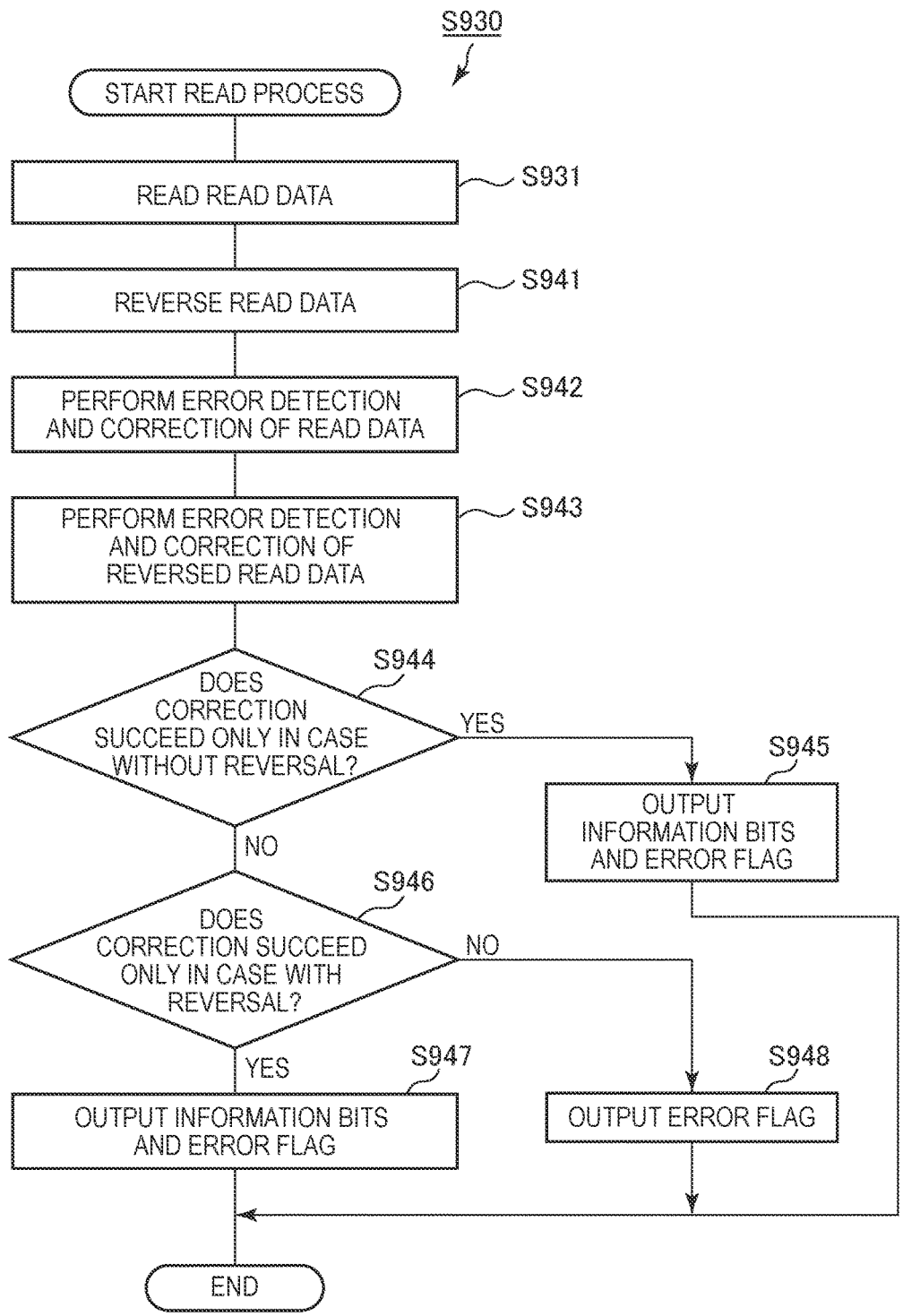
FIG. 36 is a flowchart showing an example of a read process according to the fifth embodiment.

FIG. 36 is a flowchart showing an example of a read process according to the fifth embodiment. The read process according to the fifth embodiment is different from that of the first embodiment in that Steps S941 to S948 are executed instead of the process of Step S932 and the following steps. The memory controller 300 reverses read data after Step S931 (Step S941) and then performs error detection and correction of the read data (Step S942). In addition, the memory controller 300 performs error detection and correction of the reversed read data (Step S943) and then determines whether or not correction succeeds only in a case without reversal (Step S944).

When correction succeeds only in the case without reversal (Yes in Step S944), the memory controller 300 outputs information bits included in the corrected read data and an error flag "0" to the host computer 100 (Step S945).

On the other hand, when it is not true that correction succeeds only in the case without reversal (No in Step S944), the memory controller 300 determines whether or not correction succeeds only in a case with reversal (Step S946). When correction succeeds only in the case with reversal (Yes in Step S946), the memory controller 300 outputs information bits included in the corrected reversed read data and the error flag "0" to the host computer 100 (Step S947).

On the other hand, when it is not true that correction succeeds only in the case with reversal (No in Step S946), the memory controller 300 generates an error flag "1" and outputs it to the host computer 100 (Step S948). After Step S945, S947, or S948, the memory controller 300 ends the read process.

Figure 37:
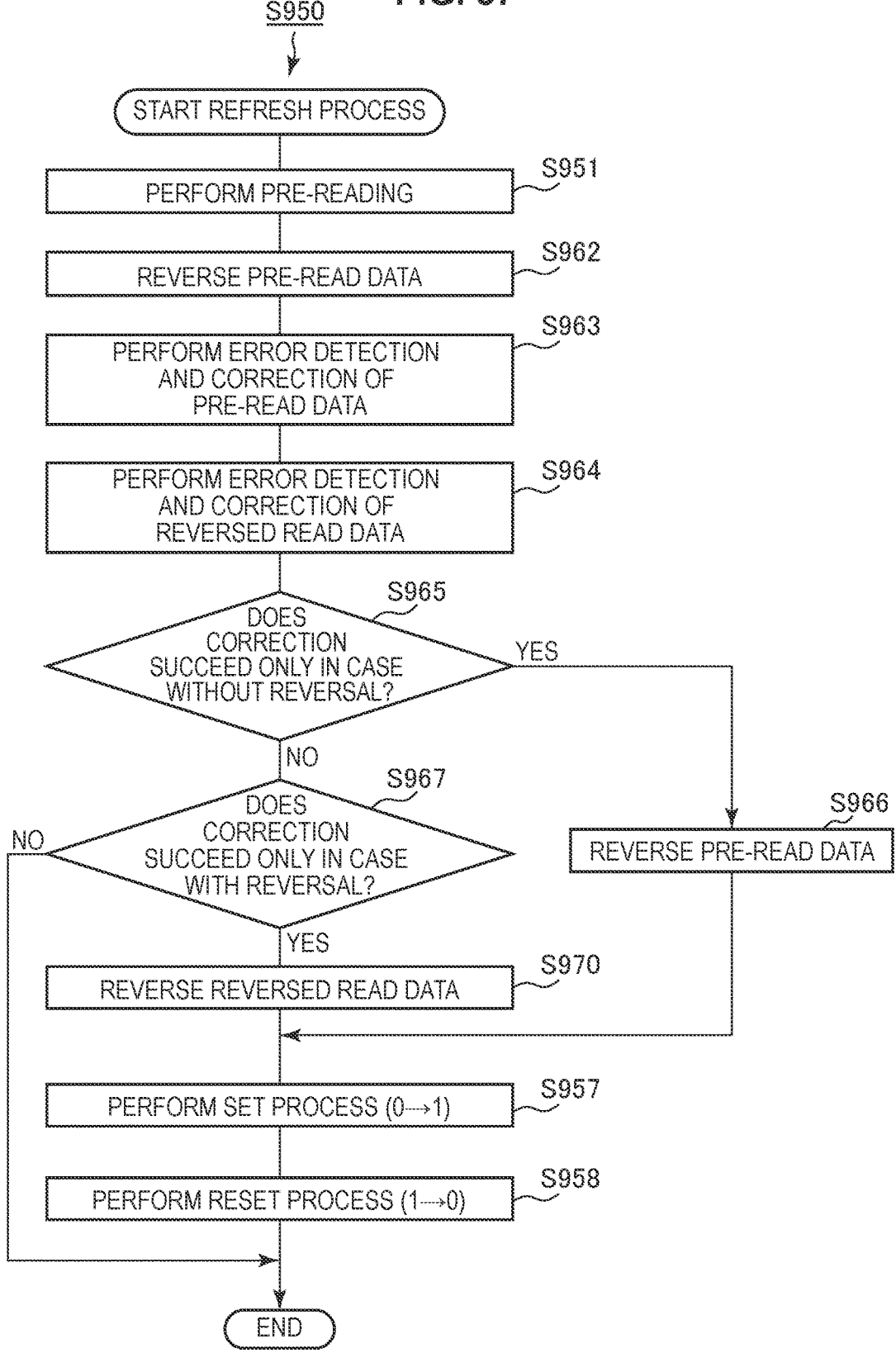
FIG. 37 is a flowchart showing an example of the refresh process according to the fifth embodiment.

FIG. 37 is a flowchart showing an example of a refresh process according to the fifth embodiment. The refresh process according to the fifth embodiment is different from that of the first embodiment in that Steps S962 to S967 and S970 are executed instead of Steps S952, S955, and S956.

After pre-reading (Step S951), the memory controller 300 reverses pre-read data (Step S962) and performs error detection and correction of the pre-read data (Step S963). Then, the memory controller 300 performs error detection and correction of reversed read data (Step S964) and determines whether or not correction succeeds only in a case without reversal (Step S965).

When correction succeeds only in the case without reversal (Yes in Step S965), the memory controller 300 reverses the corrected pre-read data and supplies the reversed corrected pre-read data to the non-volatile memory 400 as write data (Step S966). On the other hand, when it is not true that correction succeeds only in the case without reversal (No in Step S965), the memory controller 300 determines whether or not correction succeeds only in a case with reversal (Step S967). When correction succeeds only in the case with reversal (Yes in Step S967), the memory controller 300 reverses the corrected reversed read data and supplies the data to the non-volatile memory 400 as write data (Step S970).

After Step S966 or S970, the non-volatile memory performs a set process (Step S957) and a reset process (Step S958). When it is not true that correction succeeds only in the case with reversal (No in Step S967) or after Step S958, the memory controller 300 and the non-volatile memory 400 end the refresh process.

Figure 38:
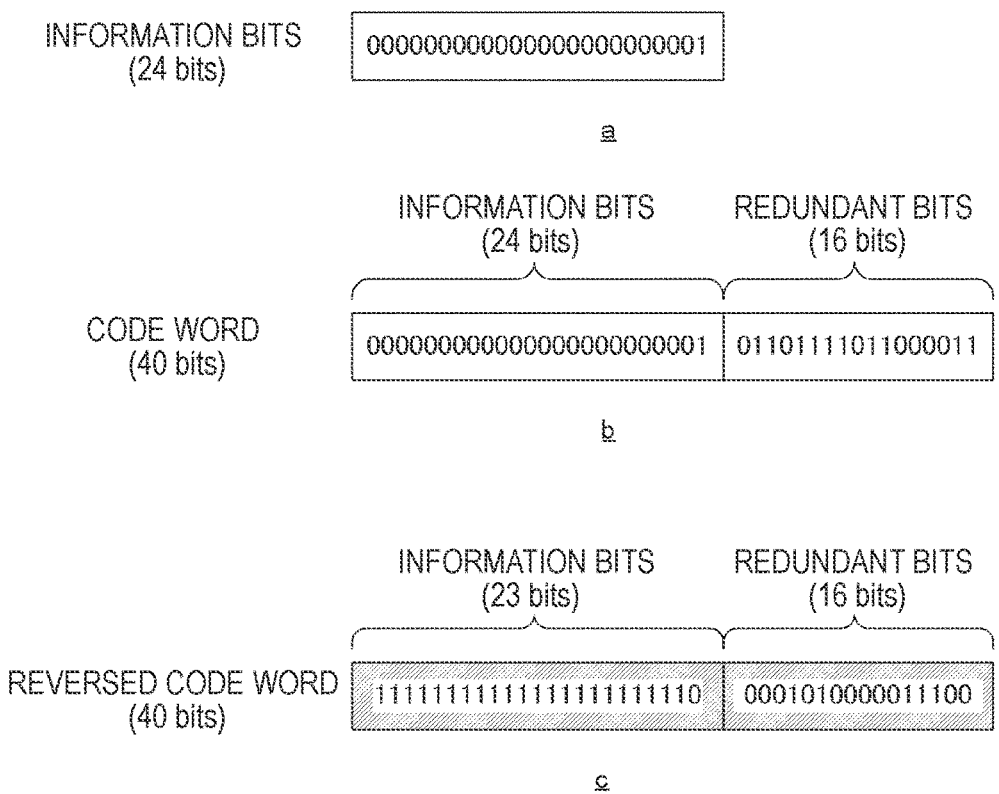
FIG. 38 is a diagram illustrating an example of corrected data generated through a refresh process according to the fifth embodiment.

FIG. 38 is a diagram illustrating an example of data generated through the write process according to the fifth embodiment. a of the drawing is an example of information bits to be encoded. The write processing unit 310 encodes information bits in units of, for example, 24 bits. b of the drawing is an example of code words. The write processing unit 310 generates, for example, 16-bit redundant bits from the 24-bit information bits and then generates 40-bit code words including the bits. c of the drawing is an example of reversed code words. Code words having a greater number of bits of "0" between the codes words of b of the drawing and the reversed code words of c of the drawing are written in the non-volatile memory 400 as write data.

Figure 39:
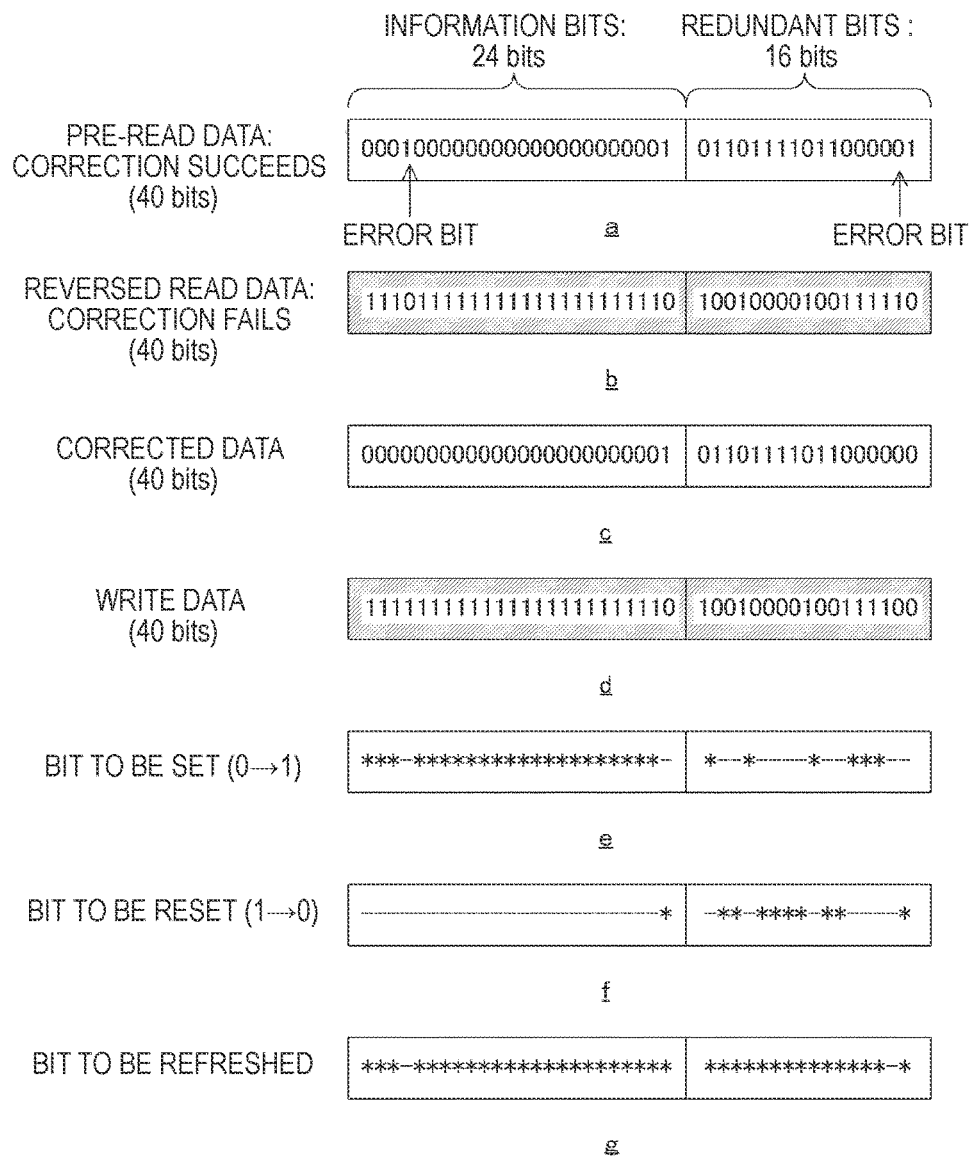
FIG. 39 is a diagram illustrating an example of write data generated through the refresh process according to the fifth embodiment.

FIG. 39 is a diagram illustrating an example of data generated through the refresh process according to the fifth embodiment. a of the drawing is an example of the pre-read data read from a physical address to be refreshed. For example, the refresh processing unit 350 reads 40-bit received words including 24-bit information bits and 16-bit redundant bits as pre-read data. b of the drawing is an example of reversed read data generated by reversing the pre-read data. c of the drawing is a diagram illustrating an example of corrected pre-read data. d of the drawing is a diagram illustrating an example of write data. For example, when correction of the pre-read data succeeds but correction of the reversed read data fails, the memory controller 300 reverses the corrected pre-read data and supplies the data to the non-volatile memory as write data.

e of FIG. 39 is a diagram illustrating positions of bits to be set. In e of the drawing, "*" represents positions of bits on which the set process is performed and "-" represents positions of bits on which the set process is not performed. f of the drawing is a diagram illustrating positions of bits to be reset. In f of the drawing, "*" represents positions of bits on which the reset process is performed and "-" represents positions of bits on which the reset process is not performed. g of the drawing is a diagram illustrating positions of bits to be refreshed. In g of the drawing, "*" represents positions of bits to be refreshed and "-" represents positions of bits not to be refreshed. Since the information bits and the redundant bits have been reversed and written, all information bits and redundant bits that have no errors are refreshed.

According to the fifth embodiment of the present technology described above, since the memory controller 300 reverses one of read data and reversed read data on which correction succeeds and then causes the result to be written in the non-volatile memory 400, it is not necessary to write a reversal bit. Accordingly, use efficiency of the non-volatile memory 400 can be improved.

6. Sixth Embodiment

The memory controller 300 according to the fifth embodiment refreshes only memory cells having no error, rather than refreshing memory cells with an error occurred. However, it is desirable to further refresh the memory cells with an error occurred. A memory controller 300 according to a sixth embodiment is different from that of the fifth embodiment in that memory cells with an error occurred are also refreshed.

Figure 40:
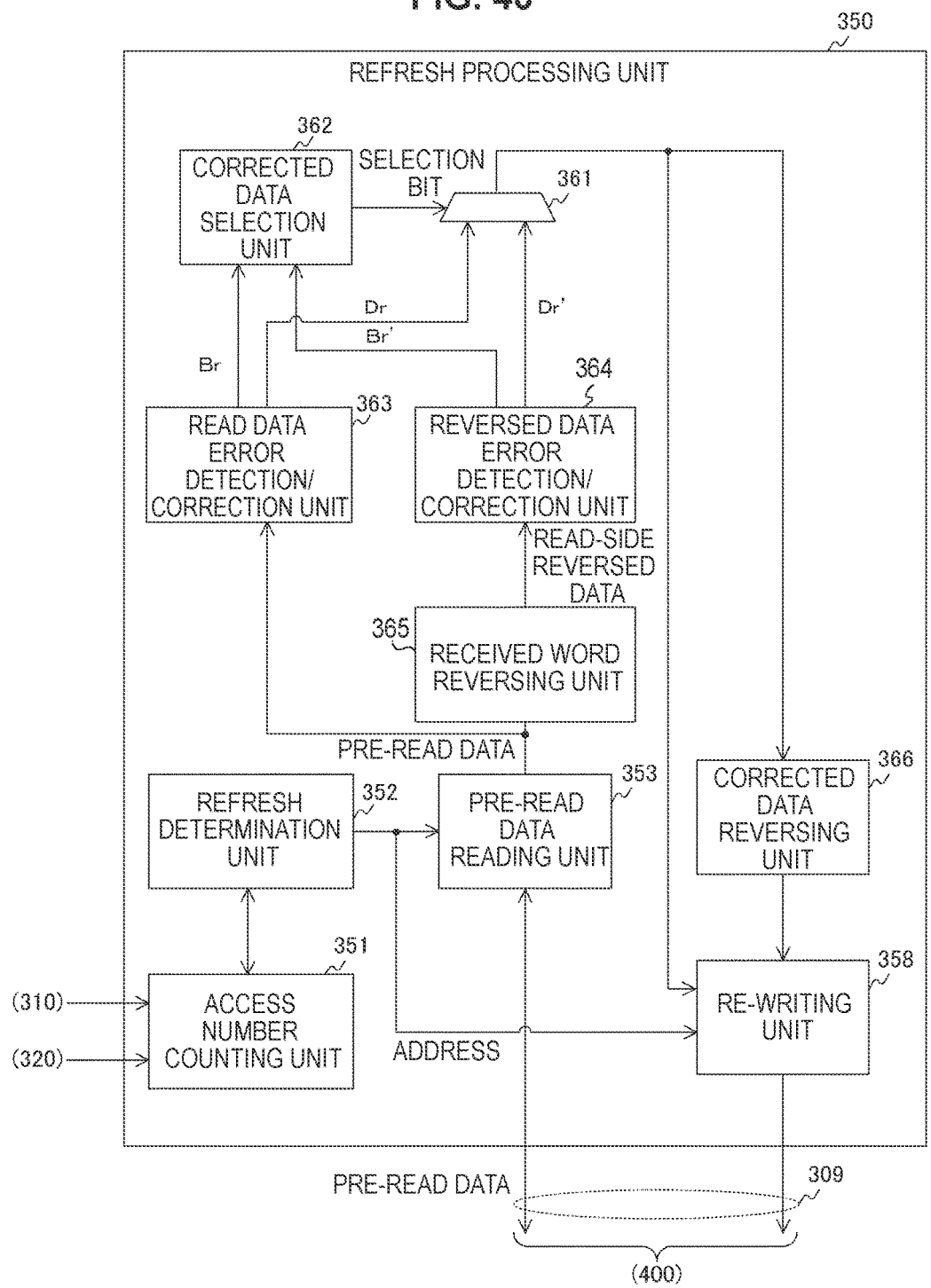
FIG. 40 is a block diagram illustrating an example of a configuration of a refresh processing unit according to the sixth embodiment.

FIG. 40 is a block diagram illustrating an example of a configuration of a refresh processing unit 350 according to the sixth embodiment. The refresh processing unit 350 according to the sixth embodiment is different from that of the fifth embodiment in that a re-writing unit 358 is provided instead of the re-writing unit 357. In addition, a selector 361 according to the sixth embodiment supplies selected data to the re-writing unit 358 in addition to a corrected data reversing unit 366. A configuration of the re-writing unit 358 is similar to that of the second embodiment.

Figure 41:
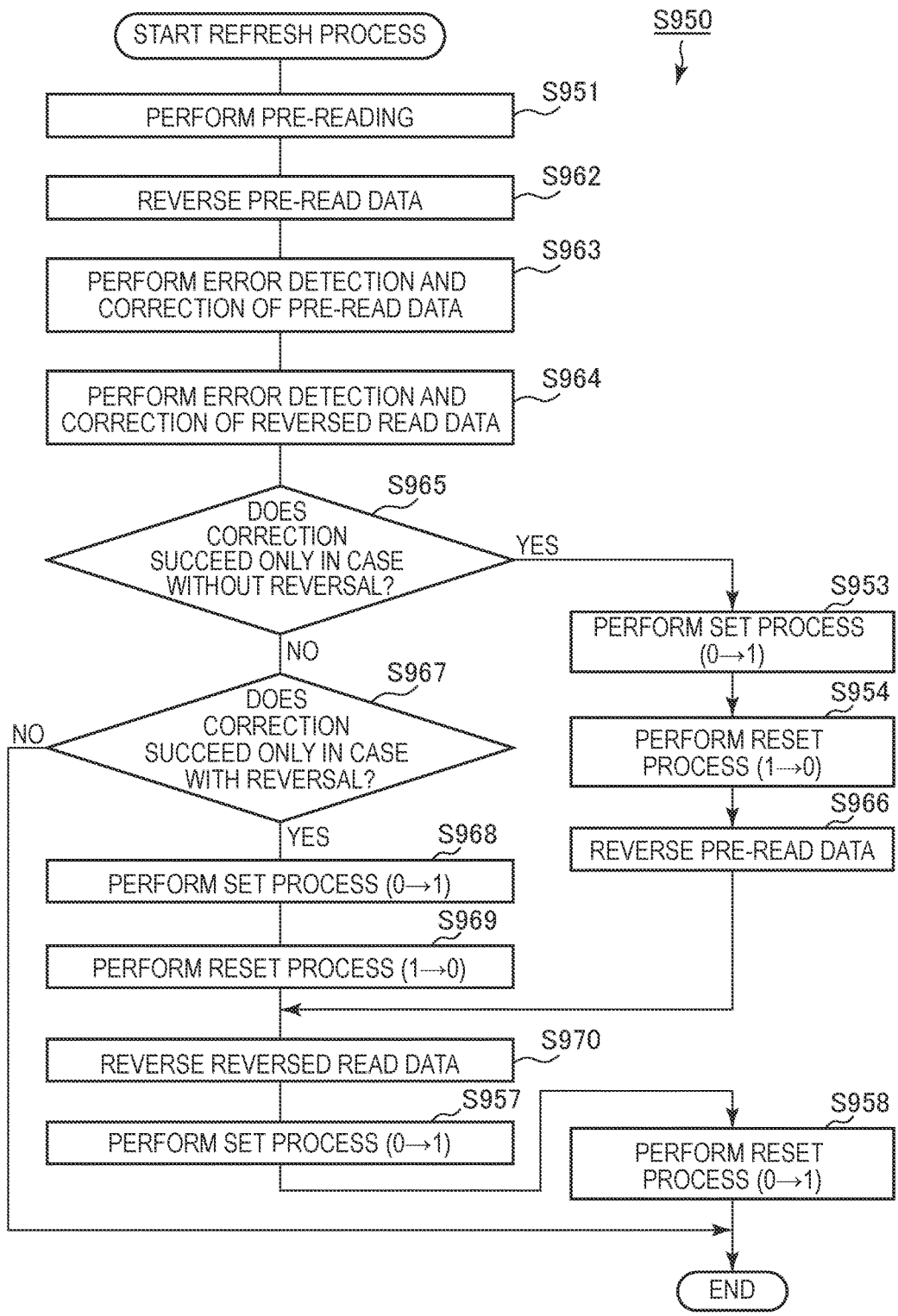
FIG. 41 is a flowchart showing an example of the refresh process according to the first embodiment.

FIG. 41 is a flowchart showing an example of a refresh process according to the sixth embodiment. The refresh process according to the fourth embodiment is different from that of the third embodiment in that Steps S968, S969, Step S953, and S954 are additionally executed.

When correction succeeds only in a case without reversal (Yes in Step S965), the memory controller 300 supplies corrected pre-read data to the non-volatile memory 400. Then, the non-volatile memory 400 executes a set process (Step S953) and a reset process (Step S954).

On the other hand, when correction succeeds only in a case with reversal (Yes in Step S967), the memory controller 300 supplies corrected reversed read data to the non-volatile memory 400. Then, the non-volatile memory 400 execute a set process (Step S968) and a reset process (Step S969).

Figure 42:
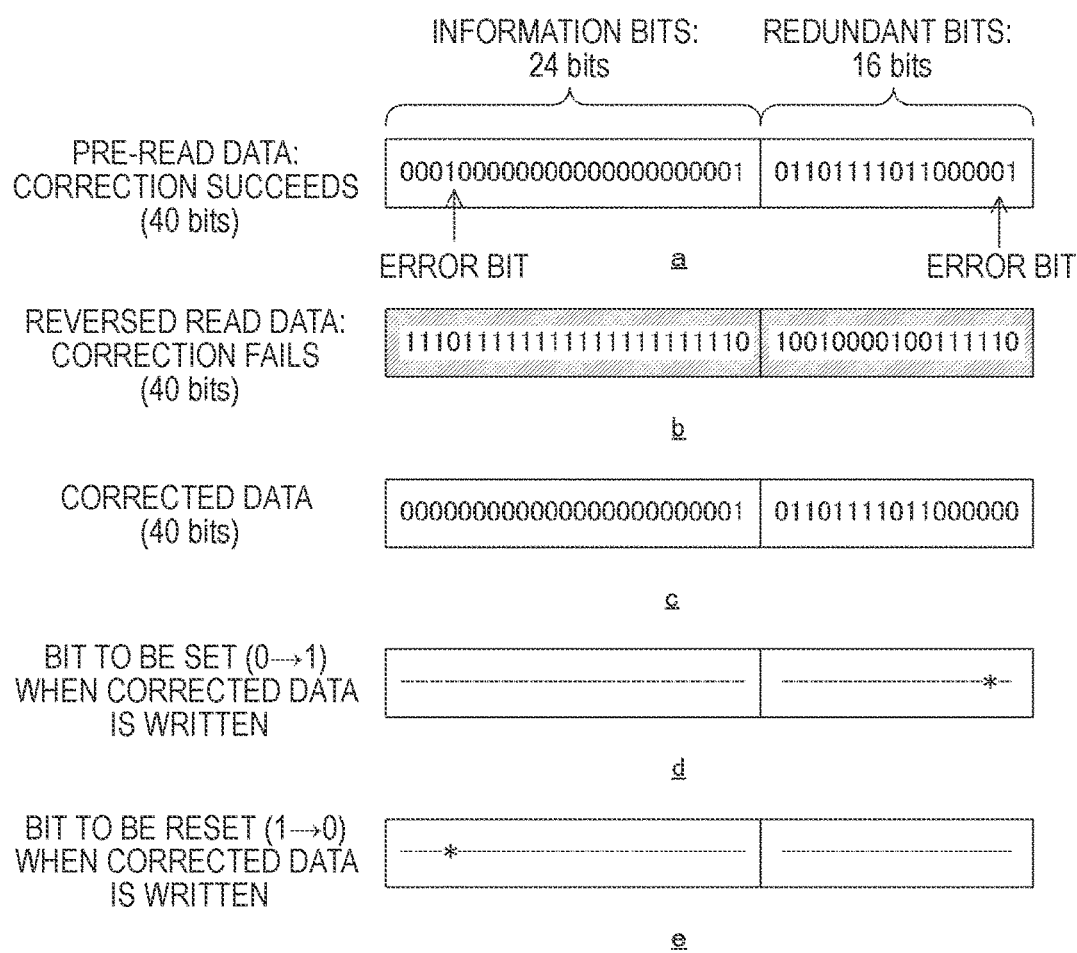
FIG. 42 is a diagram illustrating an example of corrected data generated through a refresh process according to the sixth embodiment.

FIG. 42 is a diagram illustrating an example of corrected data generated through the refresh process according to the sixth embodiment. a of the drawing is an example of pre-read data read from a physical address to be refreshed. For example, the refresh processing unit 350 reads 40-bit received words the pre-read data as in the fifth embodiment. b of the drawing is an example of reversed read data generated by reversing the pre-read data. c of the drawing is a diagram illustrating an example of corrected pre-read data. For example, when correction of the pre-read data succeeds but correction of the reversed read data fails, the memory controller 300 supplies the corrected pre-read data to the non-volatile memory 400 as write data.

c of FIG. 42 is a diagram illustrating positions of bits set when the corrected data is written. In c of the drawing, "*" represents the position of a bit on which the set process is performed and "-" represents positions of bits on which the set process is not performed. d of the drawing is a diagram illustrating positions of bits to be reset when the corrected data is written. In d of the drawing, "*" represents the position of a bit on which the reset process is performed and "-" represents positions of bits on which the reset process is not performed.

FIG. 43 is a diagram illustrating an example of write data generated through the refresh process according to the sixth embodiment. a of the drawing is a diagram illustrating the example of the write data. As in the fifth embodiment, 40-bit code words are generated as the write data by reversing pre-read data whose correction succeeds.

b of FIG. 43 is a diagram illustrating positions of bits to be set when the write data is written. In b of the drawing, "*" represents positions of bits on which the set process is performed and "-" represents positions of bits on which the set process is not performed. c of the drawing is a diagram illustrating positions of bits to be reset when the write data is written. In c of the drawing, "*" represents positions of bits on which the reset process is performed and "-" represents positions of bits on which the reset process is not performed. d of the drawing is a diagram illustrating positions of bits to be refreshed. In d of the drawing, "*" represents positions of bits to be refreshed and "-" represents positions of bits not to be refreshed.

e of FIG. 43 is a diagram illustrating the number of times each bit is re-written. In memory cells of a fourth bit from a head of bits and a second bit from a tail of the bits that have errors detected, corrected values are written and then values obtained by additionally reversing the corrected values are written, and therefore re-writing is performed two times. Re-writing is performed one time on the other memory cells.

According to the sixth embodiment of the present technology described above, the memory controller 300 performs writing of corrected data before writing of write data, and thus re-writing can be performed on memory cells that have errors detected as well as memory cells that have no errors. Accordingly, a frequency of error occurrence can be further reduced.

Modified Example

Although syndromes S and S' are calculated respectively from read data and reversed read data in the sixth embodiment, the syndrome S' can be calculated by performing a simple arithmetic operation on the syndrome S. Accordingly, a calculation amount can be reduced. A memory controller 300 according to a modified example is different from that of the sixth embodiment in that a syndrome S' can be obtained through a simple arithmetic operation.

Figure 44:
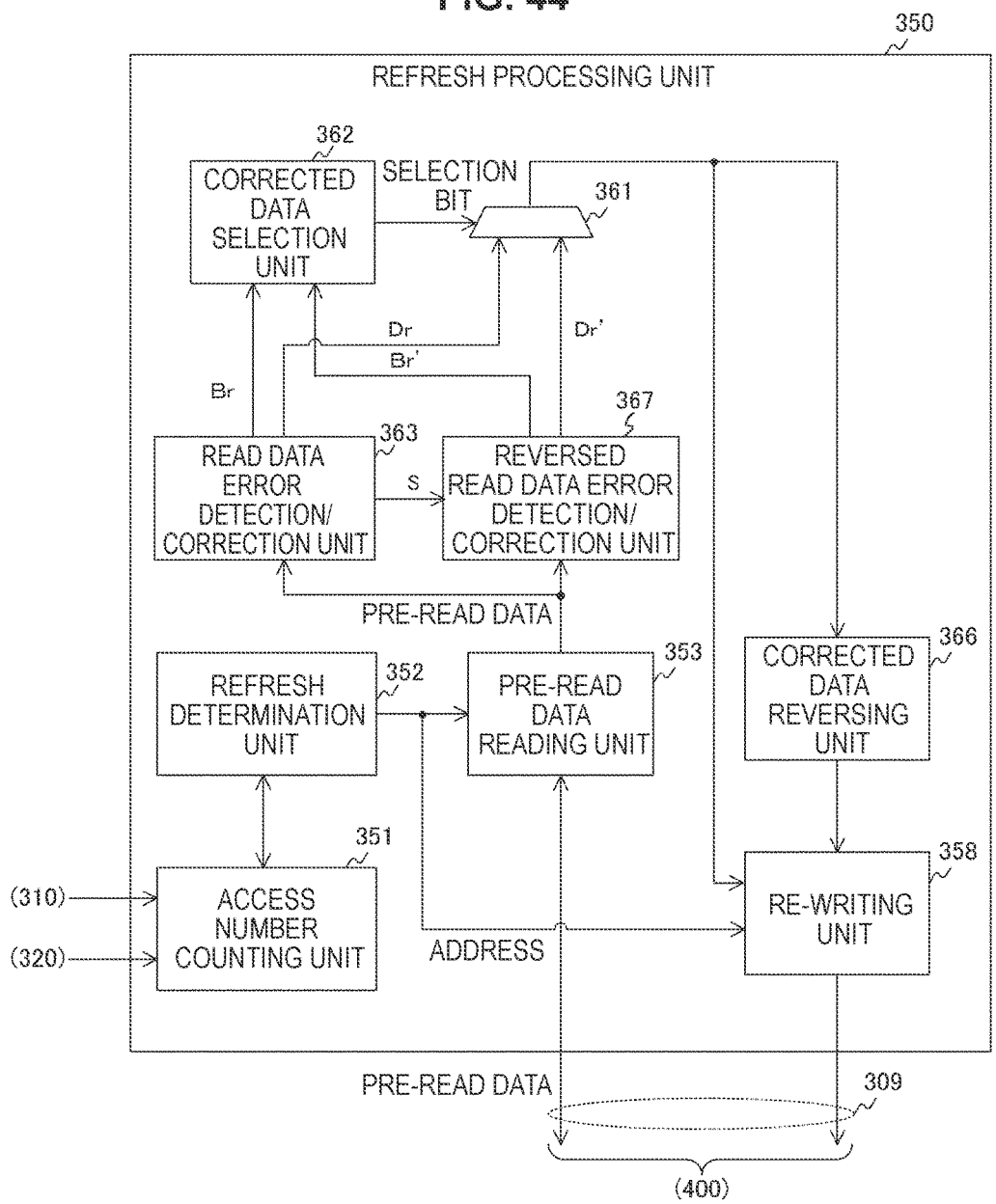
FIG. 44 is a block diagram illustrating an example of a configuration of a refresh processing unit according to a modified example of the sixth embodiment.

FIG. 44 is a block diagram illustrating an example of a configuration of a refresh processing unit 350 according to a modified example. The refresh processing unit 350 according to the modified example is different from that of the sixth embodiment in that a reversed read data error detection/correction unit 367 is provided instead of the reversed read data error detection/correction unit 364 and the received word reversing unit 365. In addition, a read data error detection/correction unit 363 according to the modified example supplies a syndrome S to the reversed read data error detection/correction unit 367.

The reversed read data error detection/correction unit calculates the syndrome S' from the syndrome S. First, in order to describe a method of calculating the syndrome S' from the syndrome S, a case in which a full-length BCH code is used will be considered. In this case, a code word c*, an error pattern e*, and a received word r* are expressed with the following formulas.

$$c^*(c_{N-1}, c_{N-2}, \ldots, c_1, c_0) \quad \text{[Math. 2]}$$

$$e^* = (e_{N-1}, e_{N-2}, \ldots, e_1, e_0) \quad \text{[Math. 3]}$$

$$r^* = c^* + e^* = (r_{N-1}, r_{N-2}, \ldots, r_1, r_0) \quad \text{[Math. 4]}$$

A syndrome S* with respect to the received word r* of the above formula is expressed with the following formula.

$$S^* = H^* \cdot r^* \rightarrow \begin{pmatrix} S_1 \\ S_3 \\ \vdots \\ S_{2t-1} \end{pmatrix} = \begin{pmatrix} \alpha^{(N-1) \cdot 1} & \cdots & \alpha^1 & 1 \\ \alpha^{(N-1) \cdot 3} & \cdots & \alpha^3 & 1 \\ & \cdots & & \\ \alpha^{(N-1)(2t-1)} & \cdots & \alpha^{2t-1} & 1 \end{pmatrix} \begin{pmatrix} r_{N-1} \\ \vdots \\ r_1 \\ r_0 \end{pmatrix} \quad \text{[Math. 5]}$$

Here, the following relational expression is elicited from the fact that a reduced code is a part of the full-length code and a bit reversal of a code word turns into a code word in the full-length code.

[Math. 6]

$$c^* = \begin{pmatrix} 0 \\ \vdots \\ 0 \\ c \end{pmatrix} \rightarrow \overline{c^*} = \begin{pmatrix} 1 \\ \vdots \\ 1 \\ \overline{c} \end{pmatrix} = c^* + \begin{pmatrix} 1 \\ \vdots \\ 1 \\ 1 \end{pmatrix} \quad \text{Formula 1}$$

[Math. 7]

$$r^* = \begin{pmatrix} 0 \\ \vdots \\ 0 \\ r \end{pmatrix} \rightarrow \overline{r^*} = \begin{pmatrix} 1 \\ \vdots \\ 1 \\ \overline{r} \end{pmatrix} = r^* + \begin{pmatrix} 1 \\ \vdots \\ 1 \\ 1 \end{pmatrix} \quad \text{Formula 2}$$

In the above formulas, the over-lined c* and r* indicate vectors obtained by reversing c* and r*. In addition, the over-lined c and r indicate vectors obtained by reversing the code word and the received word of the reduced code.

The following formula is elicited from Formulas 1 and 2.

$$H^* \cdot \overline{r^*} = H \cdot \overline{r} + H \cdot \begin{pmatrix} 1 \\ \vdots \\ 1 \\ 0 \end{pmatrix} = H^* \cdot \overline{c^*} + H^* \cdot e^* = 0 + S \quad \text{[Math. 8]}$$

In the above formula, the product of H and r with an over-bar is equal to the syndrome S' corresponding to the reversed read data. Thus, the fact that the syndrome S' is equivalent to a vector obtained by adding a correction factor expressed by the following formula to the syndrome S is elicited from the above formula.

$$U = \begin{pmatrix} u_1 \\ u_3 \\ \vdots \\ u_{2t-1} \end{pmatrix} = H^* \cdot \begin{pmatrix} 1 \\ \vdots \\ 1 \\ 0 \end{pmatrix} \quad \text{[Math. 9]}$$

In the above formulas, portions of "0" from $0^{th}$ to $n-1^{st}$ indicate code word coordinators, and portions of "1" from $n^{th}$ to $N-1^{st}$ indicate reduced coordinators.

The reversed read data error detection/correction unit 367 calculates the syndrome S' by adding the correction factor of Formula 9 to the syndrome S. Then, the reversed read data error detection/correction unit 367 obtains a position of an error in the read data from the syndrome S' and corrects the error. The reversed read data error detection/correction unit 367 reverses the read data that has the error corrected and outputs the data as corrected reversed data Dr'.

According to the modified example described above, the memory controller 300 computes the syndrome S' from the syndrome S through a simple arithmetic operation of addition of a correction factor, and therefore a calculation amount can be reduced.

The above-described embodiments are examples for embodying the present technology, and matters in the embodiments each have a corresponding relationship with disclosure-specific matters in the claims. Likewise, the matters in the embodiments and the disclosure-specific matters in the claims denoted by the same names have a corresponding relationship with each other. However, the present technology is not limited to the embodiments, and various modifications of the embodiments may be embodied in the scope of the present technology without departing from the spirit of the present technology.

The processing sequences that are described in the embodiments described above may be handled as a method having a series of sequences or may be handled as a program for causing a computer to execute the series of sequences and recording medium storing the program. As the recording medium, a CD (Compact Disc), an MD (MiniDisc), and a DVD (Digital Versatile Disc), a memory card, and a Blu-ray disc (registered trademark) can be used.

Note that the effects described here are not necessarily limited, and any effect that is desired to be described in the present disclosure may be exhibited.

Additionally, the present technology may also be configured as below.

(1)

A memory controller including:

a reading unit configured to read read data from a memory cell, the read data including an information bit and reversal information for determining whether or not the information bit has been reversed;

an error detection/correction unit configured to detect presence or absence of an error in the information bit and correct the error;

a data reversing unit configured to reverse the information bit that has the error corrected and the reversal information; and a writing unit configured to write the reversed information bit and the reversed reversal information in the memory cell.

(2)

The memory controller according to (1), further including: a reversed read data error detection/correction unit configured to detect presence or absence of an error in reversed read data obtained by reversing the read data and correct the error, wherein the reversal information is a redundant bit for detecting the presence or absence of the error and correcting the error, when only correction of an error in the read data succeeds, the data reversing unit reverses the read data that has the error corrected and supplies the read data as write data, and when only correction of the error in the reversed read data succeeds, the data reversing unit reverses the reversed read data that has the error corrected and supplies the reversed read data as the write data, and the writing unit writes the write data in the memory cell.

(3)

The memory controller according to (2), wherein the writing unit writes, in the memory cell, the read data that has the error corrected before the write data is written when only the correction of the error in the read data succeeds, and additionally writes the reversed read data that has the error corrected before the write data is written when only the correction of the error in the reversed read data succeeds.

(4)

The memory controller according to (1), wherein the reversal information is a reversal bit indicating whether or not the information bit has been reversed, the read data further includes a redundant bit for detecting and correcting the error, and the error detection/correction unit detects the presence or absence of the error and corrects the error using the redundant bit.

(5)

The memory controller according to (4), further including:

a re-encoding unit configured to generating a new redundant bit for detecting and correcting an error in the reversed information bit and the reversed reversal bit, wherein the error detection/correction unit detects presence or absence of an error in the information bit and the reversal information and corrects the error, the information bit that has the error corrected and the reversal information that has the error corrected are reversed, and the writing unit writes a code word including the reversed information bit, the reversed reversal information, and the new redundant bit in the memory cell as write data.

(6)

The memory controller according to (5), wherein the writing unit writes, in the memory cell, the read data that has the error corrected before the write data is written.

(7)

The memory controller according to (4), further including:

a re-encoding unit configured to generate a new redundant bit for detecting and correcting an error in the reversed information bit, wherein the writing unit writes data including a code word including the reversed information bit and the new redundant bit and the reversed reversal information in the memory cell as write data.

(8)

The memory controller according to (7), wherein the writing unit writes, in the memory cell, the read data that has the error corrected before the write data is written.

(9)

A memory system including:

a memory cell;

a reading unit configured to read, from the memory cell, read data including an information bit and reversal information for determining whether or not the information bit has been reversed;

an error detection/correction unit configured to detect presence or absence of an error in the information bit and correct the error;

a data reversing unit configured to reverse the information bit that has the error corrected and the reversal information; and a writing unit configured to write the reversed information bit and the reversed reversal information in the memory cell.

(10)

A memory controller control method including:

a reading procedure of reading, by a reading unit, read data from a memory cell, the read data including an information bit and reversal information for determining whether or not the information bit has been reversed;

an error detection/correction procedure of detecting, by an error detection/correction unit, presence or absence of an error in the information bit and correcting the error;

a data reversing procedure of reversing, by a data reversing unit, the information bit that has the error corrected and the reversal information; and a writing procedure of writing, by a writing unit, the reversed information bit and the reversed reversal information in the memory cell.

REFERENCE SIGNS LIST 100 host computer
200 storage
300 memory controller
301 host interface
302 RAM
303 CPU
304 ECC processing unit
305 ROM
306, 450 bus
307 memory interface
310 write processing unit
311, 316 reversal determination unit
312 write-side information bit reversing unit
313, 315 encoding unit
314, 323 logical/physical address conversion unit
317 code word reversing unit
318, 331, 361 selector
320 read processing unit
321, 366 corrected data reversing unit
322, 354 error detection/correction unit
332, 362 corrected data selection unit
333, 363 read data error detection/correction unit
334, 364, 367 reversed read data error detection/correction unit
335, 365 received word reversing unit
350 refresh processing unit
351 access number counting unit
352 refresh determination unit
353 pre-read data reading unit
355 corrected data reversing unit
356 re-encoding unit
357, 358 re-writing unit
359 read-side information bit reversing unit
360 reversal bit reversing unit
400 non-volatile memory
410 data buffer
420 memory cell array
430 driver
440 address decoder
460 control interface
470 memory control unit

The invention claimed is:

1. A memory controller comprising:
   a memory including a reading program, an error detection/correction program, a data reversing program, and a writing program, and
   an electronic processor communicatively connected to the memory,
   wherein the electronic processor is configured to execute the reading program to extract read data from a memory cell, the read data including an information bit and reversal information for determining whether the information bit has been reversed,
   wherein the electronic processor is configured to execute the error detection/correction program to
      detect a presence or an absence of a first error in the information bit, and
      correct the first error in the information bit,
   wherein the electronic processor is configured to execute the data reversing program to
      reverse the information bit that has the first error corrected to generate a reversed information bit that has the first error corrected, and
      reverse the reversal information to generate reversed reversal information, and
   wherein the electronic processor is configured to execute the writing program to write the reversed information bit that has the first error corrected and the reversed reversal information in the memory cell.

2. The memory controller according to claim 1, wherein the memory further includes a reversed read data error detection/correction program,
   wherein the electronic processor is further configured to execute the reversed read data error detection/correction program to
      receive reversed read data,
      detect a presence or an absence of a second error in the reversed read data, and
      correct the second error in the reversed read data,
   wherein the reversal information is a redundant bit for detecting the presence or the absence of the second error in the reversed read data and correcting the second error in the reversed read data,
   wherein the electronic processor is further configured to execute the data reversing program to
      determine whether a correction of the first error in the read data succeeds,
      responsive to determining that the correction of the first error in the read data succeeds, reverse the read data that has the first error corrected to generate a second reversed read data,
      supply the second reversed read data as write data,
      determine whether a correction of the second error in the reversed read data succeeds,
      responsive to determining that the correction of the second error in the reversed read data succeeds, reverse the reversed read data that has the second error corrected to generate a second read data, and
      supply the second read data as the write data, and
   wherein the electronic processor is further configured to execute the writing program to write the write data in the memory cell.

3. The memory controller according to claim 2,
   wherein the electronic processor is further configured to execute the writing program to
      write the read data that has the first error corrected in the memory cell before the write data is written in the memory cell when only the correction of the first error in the read data succeeds, and
      write the reversed read data that has the second error corrected in the memory cell before the write data is written in the memory cell when only the correction of the second error in the reversed read data succeeds.

4. The memory controller according to claim 1,
   wherein the reversal information is a reversal bit,
   wherein the read data further includes a redundant bit for detecting and correcting the first error, and
   wherein the electronic processor is further configured to execute the error detection/correction program to
      detect the presence or the absence of the first error, and
      correct the first error based on the redundant bit.

5. The memory controller according to claim 4,
   wherein the memory further includes a re-encoding program,
   wherein the electronic processor is further configured to execute the error detection/correction program to
      detect a presence or an absence of a second error in the information bit and the reversal bit, and
      correct the second error,
   wherein the electronic processor is further configured to execute the data reversing program to
      reverse the information bit that has the second error corrected to generate a second reversed information bit, and
      reverse the reversal bit that has the second error corrected to generate a reversed reversal bit,
   wherein the electronic processor is further configured to execute the re-encoding program to generate a new redundant bit for detecting and correcting a third error in the second reversed information bit and the reversed reversal bit, and
   wherein the electronic processor is further configured to execute the writing program to write a code word including the second reversed information bit, the reversed reversal bit, and the new redundant bit in the memory cell as write data.

6. The memory controller according to claim 5,
   wherein the electronic processor is further configured to execute the writing program to write the read data that has the second error corrected in the memory cell before the write data is written in the memory cell.

7. The memory controller according to claim 4,
   wherein the memory further includes a re-encoding program,
   wherein the electronic processor is further configured to execute the re-encoding program to generate a new redundant bit for detecting and correcting a second error in the reversed information bit, and
   wherein the electronic processor is further configured to execute the writing program to write data including a code word and the reversed reversal information in the memory cell as write data, the code word including the reversed information bit and the new redundant bit.

8. The memory controller according to claim 7,
   wherein the electronic processor is further configured to execute the writing program to write the read data that has the first error corrected in the memory cell before the write data is written in the memory cell.

9. A memory system comprising:
a memory cell; and
a memory controller including
a memory including a reading program, an error detection/correction program, a data reversing program, and a writing program, and
an electronic processor communicatively connected to the memory,
wherein the electronic processor is configured to execute the reading program to extract read data from the memory cell, the read data including an information bit and reversal information for determining whether the information bit has been reversed,
wherein the electronic processor is configured to execute the error detection/correction program to
detect a presence or an absence of a first error in the information bit, and
correct the first error,
wherein the electronic processor is configured to execute the data reversing program to
reverse the information bit that has the first error corrected to generate a reversed information bit that has the first error corrected, and
reverse the reversal information to generate reversed reversal information, and
wherein the electronic processor is configured to execute the writing program to write the reversed information bit that has the first error corrected and the reversed reversal information in the memory cell.

10. A memory controller control method comprising:
extracting, by an electronic processor of a memory controller, read data from a memory cell, the read data including an information bit and reversal information for determining whether the information bit has been reversed;
detecting, by the electronic processor, a presence or an absence of a first error in the information bit;
correcting, by the electronic processor, the first error;
reversing, by the electronic processor, the information bit that has the first error corrected to generate a reversed information bit that has the first error corrected;
reversing, by the electronic processor, the reversal information to generate a reversed reversal information; and
writing, by the electronic processor, the reversed information bit that has the first error corrected and the reversed reversal information in the memory cell.

11. The memory system according to claim 9,
wherein the memory further includes a reversed read data error detection/correction program,
wherein the electronic processor is configured to execute the reversed read data error detection/correction program to
receive reversed read data,
detect a presence or an absence of a second error in the reversed read data, and
correct the second error in the reversed read data,
wherein the reversal information is a redundant bit for detecting the presence or the absence of the second error in the reversed read data and correcting the second error in the reversed read data,
wherein the electronic processor is further configured to execute the data reversing program to
determine whether a correction of the first error in the read data succeeds,
responsive to determining that the correction of the first error in the read data succeeds, reverse the read data that has the first error corrected to generate a second reversed read data,
supply the second reversed read data as write data,
determine whether a correction of the second error in the reversed read data succeeds,
responsive to determining that the correction of the second error in the reversed read data succeeds, reverse the reversed read data that has the second error corrected to generate a second read data, and
supply the second read data as the write data, and
wherein the electronic processor is further configured to execute the writing program to write the write data in the memory cell.

12. The memory system according to claim 11,
wherein the electronic processor is further configured to execute the writing program to
write the read data that has the first error corrected in the memory cell before the write data is written in the memory cell when only the correction of the first error in the read data succeeds, and
write the reversed read data that has the second error corrected in the memory cell before the write data is written in the memory cell when only the correction of the second error in the reversed read data succeeds.

13. The memory system according to claim 9,
wherein the reversal information is a reversal bit,
wherein the read data further includes a redundant bit for detecting and correcting the first error, and
wherein the electronic processor is further configured to execute the error detection/correction program to
detect the presence or the absence of the first error, and
correct the first error based on the redundant bit.

14. The memory system according to claim 13,
wherein the memory further includes a re-encoding program,
wherein the electronic processor is further configured to execute the error detection/correction program to
detect a presence or an absence of a second error in the information bit and the reversal bit, and
correct the second error,
wherein the electronic processor is further configured to execute the data reversing program to
reverse the information bit that has the second error corrected to generate a second reversed information bit, and
reverse the reversal bit that has the second error corrected to generate a reversed reversal bit,
wherein the electronic processor is further configured to execute the re-encoding program to generate a new redundant bit for detecting and correcting a third error in the second reversed information bit and the reversed reversal bit, and
wherein the electronic processor is further configured to execute the writing program to write a code word including the second reversed information bit, the reversed reversal bit, and the new redundant bit in the memory cell as write data.

15. The memory system according to claim 14, wherein the electronic processor is further configured to execute the writing program to write the read data that has the second error corrected in the memory cell before the write data is written in the memory cell.

16. The memory system according to claim 13,
wherein the memory further includes a re-encoding program,
wherein the electronic processor is further configured to execute the re-encoding program to generate a new redundant bit for detecting and correcting a second error in the reversed information bit, and
wherein the electronic processor is further configured to execute the writing program to write data including a code word and the reversed reversal information in the memory cell as write data, the code word including the reversed information bit and the new redundant bit.

17. The memory system according to claim 16, wherein the electronic processor is further configured to execute the writing program to write the read data that has the first error corrected in the memory cell before the write data is written in the memory cell.

18. The memory controller control method according to claim 10, further comprising:
receiving, by the electronic processor, reversed read data;
detecting, by the electronic processor, a presence or an absence of a second error in the reversed read data;
correcting, by the electronic processor, the second error in the reversed read data;
determining, by the electronic processor, whether one of a correction of the first error in the read data succeeds or a correction of the second error in the reversed read data succeeds;
reversing, by the electronic processor, the read data that has the first error corrected to generate a second reversed read data in response to determining that the correction of the first error in the read data succeeds;
reversing, by the electronic processor, the reversed read data that has the second error corrected to generate a second read data in response to determining that the correction of the second error in the read data succeeds;
supplying, by the electronic processor, the second reversed read data as write data in response to generating the second reversed read data;
supplying, by the electronic processor, the second read data as the write data in response to generating the second read data; and
writing, by the electronic processor, the write data in the memory cell,
wherein the reversal information is a redundant bit for detecting the presence or the absence of the second error in the reversed read data and correcting the second error in the reversed read data.

19. The memory controller control method according to claim 18, further comprising:
when only the correction of the first error in the read data succeeds, writing, by the electronic processor, the read data that has the first error corrected in the memory cell before the write data is written in the memory cell; and
when only the correction of the second error in the reversed read data succeeds, writing, by the electronic processor, the reversed read data that has the second error corrected in the memory cell before the write data is written in the memory cell.

20. The memory controller control method according to claim 10,
wherein the reversal information is a reversal bit,
wherein the read data further includes a redundant bit for detecting and correcting the first error, and the method further comprising:
detecting, by the electronic processor, the presence or the absence of the first error; and
correcting, by the electronic processor, the first error based on the redundant bit.

* * * * *